(12) United States Patent
Nakajima et al.

(10) Patent No.: US 6,664,943 B1
(45) Date of Patent: Dec. 16, 2003

(54) DIGITAL/ANALOG CONVERTER CIRCUIT, LEVEL SHIFT CIRCUIT, SHIFT REGISTER UTILIZING LEVEL SHIFT CIRCUIT, SAMPLING LATCH CIRCUIT, LATCH CIRCUIT AND LIQUID CRYSTAL DISPLAY DEVICE INCORPORATING THE SAME

(75) Inventors: Yoshiharu Nakajima, Kanagawa (JP); Toshikazu Maekawa, Kanagawa (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/466,969

(22) Filed: Dec. 20, 1999

(30) Foreign Application Priority Data

| Dec. 21, 1998 | (JP) | P10-362283 |
| Feb. 1, 1999 | (JP) | P11-023382 |
| Feb. 1, 1999 | (JP) | P11-023383 |
| Feb. 1, 1999 | (JP) | P11-023384 |
| Oct. 21, 1999 | (JP) | P11-299188 |

(51) Int. Cl.[7] .................................. G09G 3/36
(52) U.S. Cl. ........................... 345/98; 345/100
(58) Field of Search .................... 345/98, 99, 100, 345/83, 88, 89; 326/80; 327/333, 57; 377/64

(56) References Cited

U.S. PATENT DOCUMENTS

| 4,733,105 | A | * | 3/1988 | Shin et al. | 327/333 |
| 5,047,669 | A | * | 9/1991 | Iwamura et al. | 326/58 |
| 5,457,420 | A | | 10/1995 | Asada | 327/437 |
| 5,559,526 | A | * | 9/1996 | Izawa | 345/96 |
| 5,680,064 | A | | 10/1997 | Masaki et al. | 326/81 |
| 5,798,746 | A | * | 8/1998 | Koyama | 345/98 |
| 5,818,406 | A | | 10/1998 | Tsuchi | |
| 5,828,357 | A | | 10/1998 | Tamai | |
| 5,850,204 | A | * | 12/1998 | Maekawa | 345/98 |
| 6,275,210 | B1 | * | 8/2001 | Maekawa | 345/98 |
| 6,448,953 | B1 | * | 9/2002 | Murade | 345/98 |

FOREIGN PATENT DOCUMENTS

| DE | 43 31 542 A1 | 3/1994 |
| EP | 63093219 | 4/1988 |
| EP | 0 438 927 A2 | 7/1991 |
| EP | 515 191 | 11/1992 |
| EP | 06090161 | 3/1994 |
| WO | WO 98/28731 | 7/1998 |

* cited by examiner

*Primary Examiner*—Xiao Wu
(74) *Attorney, Agent, or Firm*—Rader, Fishman & Grauer PLLC; Ronald P. Kananen

(57) ABSTRACT

This invention relates to a digital/analog converter circuit, a level shift circuit, a shift register containing this level shift circuit, a sampling latch circuit and a latch circuit as well as a liquid crystal display device mounted with these respective circuits, wherein a drive circuit integrated with the LCD device containing the digital/analog converter circuit has polysilicon thin film transistors arrayed in a matrix on the substrate as switching devices for the pixels, a level shift circuit in the shift register has a basic structure of CMOS latch cells and is utilized in each level shift of the clock signal at each transfer stage, a sampling latch circuit with a basic structure of CMOS latch cells has a level shift function, and these respective circuits may be incorporated into a single scanning type structural circuit with the drive circuit-integrated liquid crystal display device to provide an LCD panel with an extremely narrow picture frame, stable level shift operation, stable sampling & latch operation in a circuit structure having an extremely small number of components, low power consumption and a small surface area.

50 Claims, 31 Drawing Sheets

TO COLUMN 25n

F I G. 18
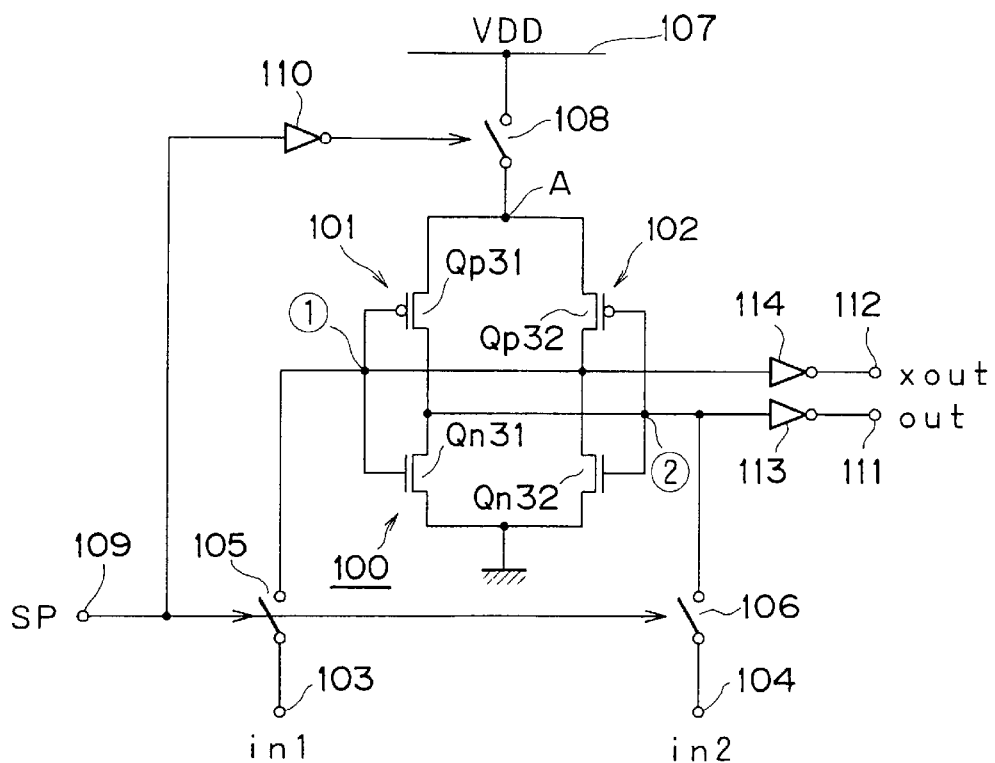
F I G. 19
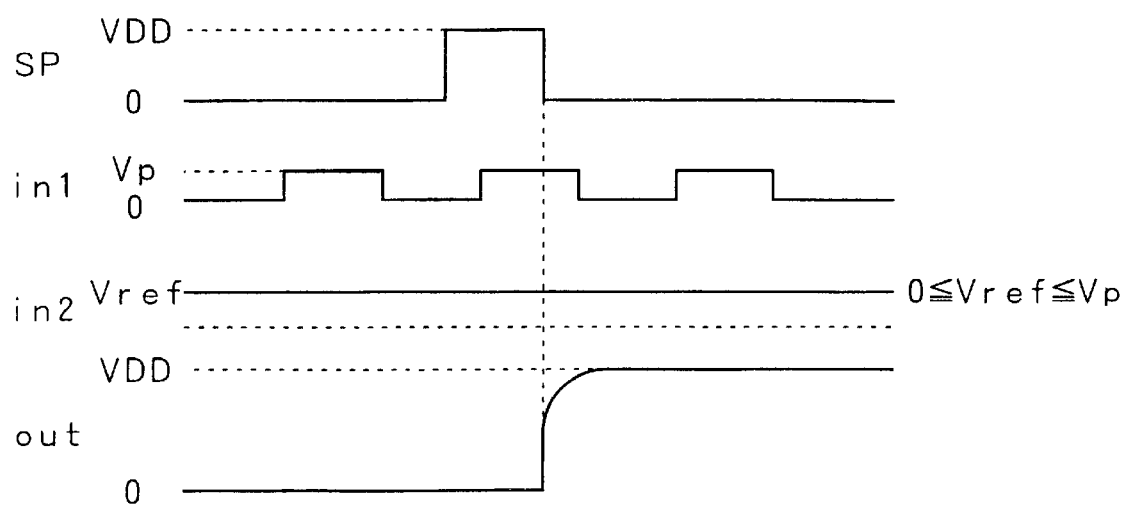

F I G. 22
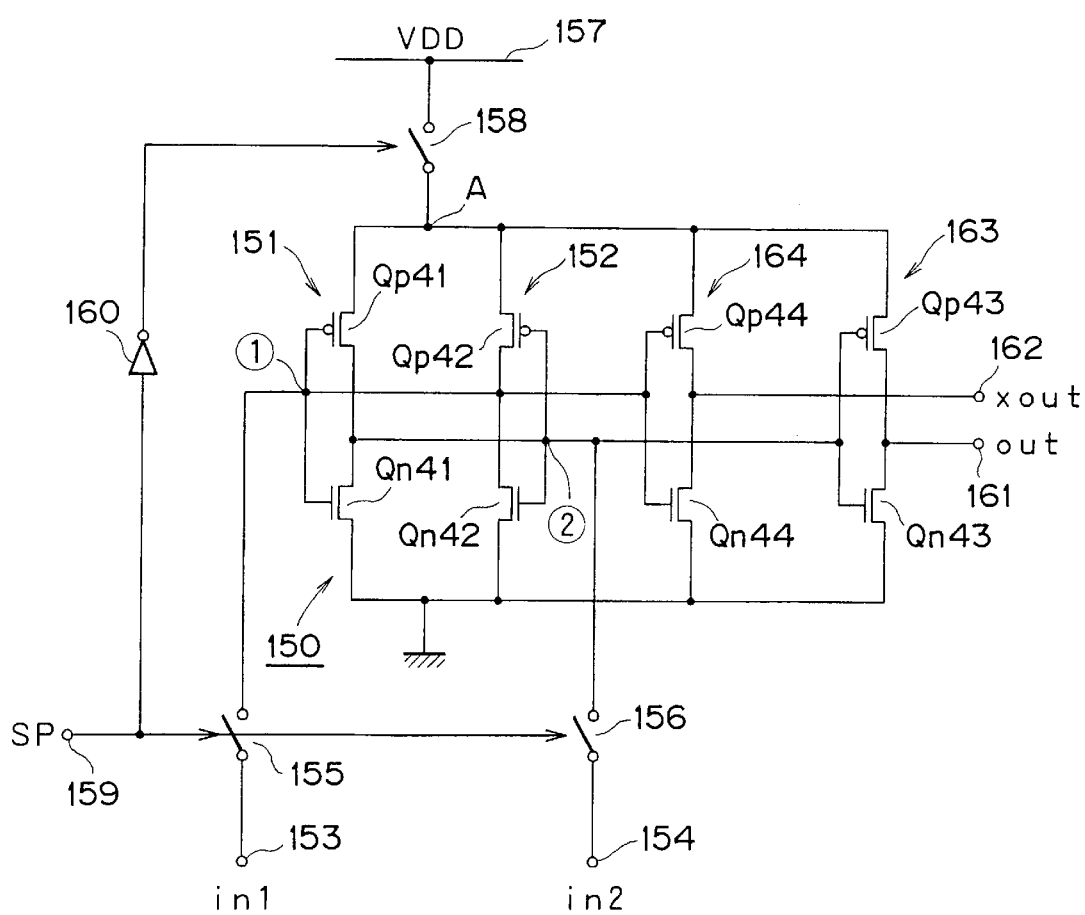

F I G. 24
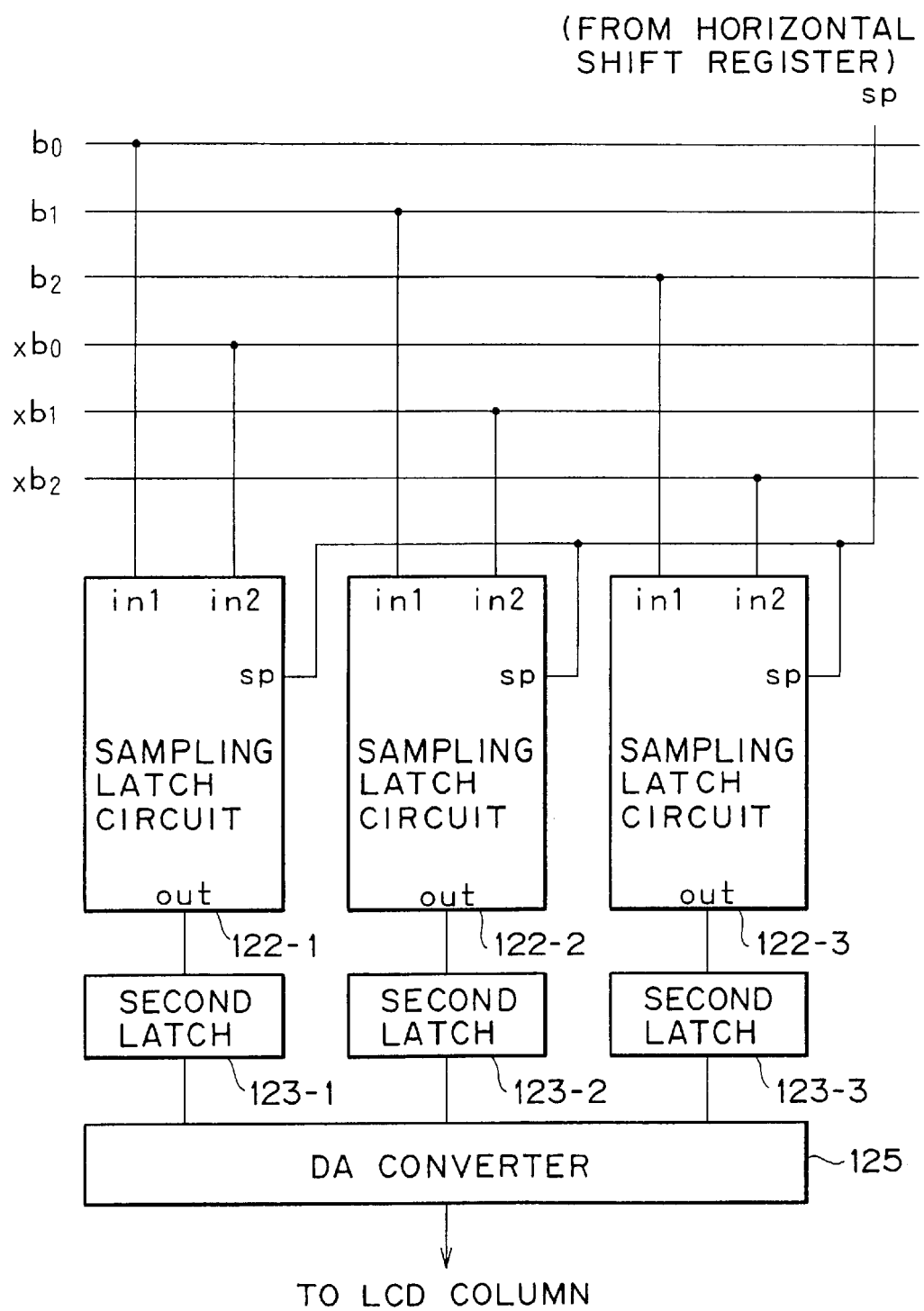

F I G. 28
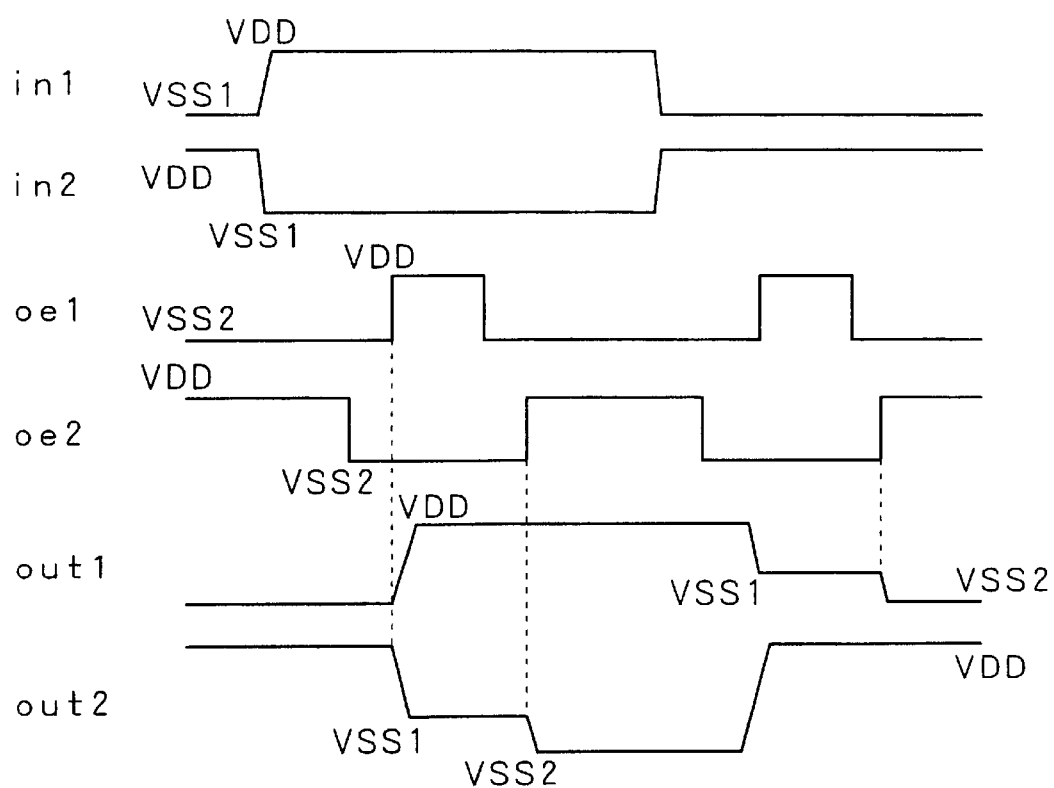

US 6,664,943 B1

DIGITAL/ANALOG CONVERTER CIRCUIT, LEVEL SHIFT CIRCUIT, SHIFT REGISTER UTILIZING LEVEL SHIFT CIRCUIT, SAMPLING LATCH CIRCUIT, LATCH CIRCUIT AND LIQUID CRYSTAL DISPLAY DEVICE INCORPORATING THE SAME

BACKGROUND OF THE INVENTION

1. Field of the Invention

This invention relates to a digital/analog converter circuit and a liquid crystal display (LCD) incorporating the digital/analog converter circuit and relates in particular to a so-called drive-circuit-integrated liquid crystal display in which a reference voltage selector type digital/analog converter circuit and a drive circuit containing this digital/analog converter circuit are integrally formed on a substrate on which polysilicon thin film transistors are arrayed in a matrix as switching devices for the pixels.

This invention also relates to a level shift circuit, a shift register using this level shift circuit and a liquid crystal display device incorporating this level shift circuit and shift register, and relates in particular to a level shift circuit having a basic structure comprised of CMOS latch cells, a shift register utilizing this level shift circuit in each level shift of the clock signal at each transfer stage, and a so-called drive-circuit-integrated liquid crystal display incorporating this level shift circuit or shift register as a circuit to configure the scanning circuit.

This invention also relates to a sampling latch circuit, a latch circuit and a liquid crystal display (LCD) incorporating the latch circuit and relates in particular to a sampling latch circuit having a level shift function and a basic structure comprised of CMOS latch cells, a latch circuit and a so-called drive circuit-integrated liquid crystal display device incorporating the sampling circuit and the latch circuit as circuits to configure the scanning circuit.

2. Description of the Related Art

A digital interface drive circuit integrated onto the same substrate as the pixel section by thin film transistors (TFT) and comprising a drive-circuit-integrated liquid crystal display of the related art is shown in FIG. 34. First and a second horizontal drives 702, 703 are mounted above and below an effective pixel region 701 arrayed with pixels in a matrix, and for instance, a vertical drive system 704 is installed on the left side in FIG. 34 and integrated onto the same substrate (hereafter called LCD panel) along with the effective pixel region 701 of thin film transistors.

The first horizontal drive 702 is comprised of a horizontal shift register 721, a sampling & first latch circuit 722, a second latch circuit 723 and a DA (digital/analog) converter circuit 724. The second horizontal drive 703 is comprised, the same as the first horizontal drive 702 of a horizontal shift register 731, sampling & first latch circuit 732, a second latch circuit 733 and a DA (digital/analog) converter circuit 734. The vertical drive system 704 is comprised of a vertical shift register 741.

A significant problem that occurs when the above described drive circuit/liquid crystal display device of the related art is fabricated is the size of the surface area forming the drive circuit on the LCD panel or in other words, the peripheral area (hereafter called the picture frame) of the effective pixel region 701. The circuit surface area of the DA converter circuits 724, 734 is particularly important because the size of the LCD panel picture frame is determined by these DA converter circuits 724, 734 area. A reference voltage selector type is widely utilized as the DA converter circuit for the drive-circuit-integrated liquid crystal display. The reason being that the reference voltage selector type has less variation in terms of output voltage potential.

The circuit structure of a reference voltage selector type DA converter circuit is shown in FIG. 35. This circuit shows a 3-bit 8-step DA converter structure. In this DA converter-circuit as clearly shown in FIG. 35, step selector units 708-0 through 708-7 comprising a selector circuit 705, latch circuit 706 and decode circuit 707 are formed for each step (reference voltages Vref F0 through Vref7).

However, in the structure shown for the DA converter structure, since a latch circuit 706 and decoder circuit 707 are formed for each step, as clearly shown in the circuit structure of FIG. 35, an extremely large number of elements comprises the circuit so that when attempting to form a multi-step DA converter circuit of TFT components, the surface area of the circuit becomes extremely large. Consequently, when mounting the converter circuit on the liquid crystal display device, the LCD panel picture frame size is large, creating the problem that the overall device cannot be made compact.

A method was proposed for a circuit structure combining the reference voltage selector type DA converter circuit with a switching capacitor in order to reduce the size of the circuit surface area. However, this circuit structure required a buffer circuit so that the current consumption required just by the buffer circuit created the problem of a large increase in overall circuit power consumption.

An example of a level shift circuit comprised of CMOS devices is shown in the related art 1 in FIG. 13A. In the level shift circuit of this related art 1, a CMOS latch cell 101A has a basic structure comprised of an N channel MOS (hereafter simply NMOS) transistor Qn101A with a source connected to ground and a gate supplied by an input signal in1, an NMOS transistor Qn102A with a source connected to ground and a gate supplied with an input signal in2, a P channel MOS (hereafter simply PMOS) transistor Qp101A connected between power supply VDD and drain of NMOS transistor Qn101A with a gate connected to the drain of NMOS transistor Qn102A, a PMOS transistor Qp101A connected between the drain of NMOS transistor Qn102A and power supply VDD with a gate connected to the drain of the NMOS transistor Qn101A.

In the level shift circuit of the related art 1 for instance, a low voltage amplitude signal of 3 volts is input as signal in1, and a signal in2 is input as an inverted signal of in1. These low voltage amplitude three volt input signals in1 and in2 appear in the drains of the NMOS transistors Qn101A, Qn102A as the amplitude of the power supply VDD circuit. The respective drain outputs of the NMOS transistors Qn101A, Qn102A are output as an inverted output signal xout by way of the inverter 103A and an output signal out by way of the inverter 102A. In this way, the low voltage amplitude signals in1, in2 are level-shifted to a high voltage amplitude signal out and xout of the power supply VDD.

A level shift circuit of the related art 2 is shown in FIG. 14A. In the level shift circuit of this related art 2, a CMOS latch cell 201A has a differential amplifier structure comprised of a an N channel MOS (hereafter simply NMOS) transistor Qn201A with a source connected to ground and a gate supplied by an input signal in1, an NMOS transistor Qn202A with a source connected to ground and a gate supplied with an input signal in2, a diode-connected P channel MOS transistor Qp201A connected between power supply VDD and drain of NMOS transistor Qn201A, and a PMOS transistor Qp202A connected between the drain of NMOS transistor Qn202A and power supply VDD and sharing a common gate with the NMOS transistor Qp201A.

In the level shift circuit of the related art 2 for instance, a low voltage amplitude signal of 3 volts is input as signal in1, and a signal in2 is input as an inverted signal of in1. This low voltage amplitude three volt input signal in1 appears in the drains of the NMOS transistors Qn202A as the amplitude of the power supply VDD circuit. The drain output of the NMOS transistor Qn202A is output as an output signal out by way of the inverter 202A. In this way, the low voltage amplitude signal in1 is level-shifted to a high voltage amplitude signal out of the power supply VDD.

However, in the above level shift circuits of the related art 1 and 2, a voltage sufficient to turn on the NMOS transistors Qn101A, Qn201A or the NMOS transistors Qn102A, Qp202A is required as the amplitude of the input signals in1, in2. In other words, a transistor threshold voltage of Vth or higher is required and when this condition cannot be satisfied, the level circuit will not operate. Accordingly, when attempting to shift the level of the applicable circuit to the required high voltage by using a level shift circuit input comprised of an output signal for example of a CMOS-LSI device of approximately three volts utilizing a TFT (thin film transistor) with a large threshold voltage Vth, the problem occurs that a stable level shift sometimes cannot be obtained.

Also, though the level shift circuit of the related art 2 has a small area and high speed operation compared to the level shift circuit of the related art 1, since the PMOS transistors Qp201A, Qp202A comprise the current mirror circuit, when the NMOS transistor Qn202A is on, current is flowing in the PMOS transistors Qp201A, Qp202A so that the related art 2 has the problem of large current consumption.

The circuit structure shown in FIG. 15A was proposed to resolve the above problems with the level shift circuits with TFT (thin film transistors). This level shift circuit of the related art 3 was basically comprised of a CMOS latch cell 30 having a differential amplifier structure comprising NMOS transistors Qn301A, Qn302A, and PMOS transistors Qp301A, Qp302A. In this circuit, the input signals in1, in2 were not input as is, into the gates of the NMOS transistors Qn301A, Qn302A of the CMOS latch cell (differential amplifier) 301A, instead, an input was made to these gates after performing a DC shift to a level higher than the threshold voltage of these transistors. In other words, the input signals in1, in2 were input to the NMOS transistors Qn301A, Qn302A byway of the NMOS transistors Qn303A, Qn304A. At the same time, signals with a polarity opposite the gate input of the NMOS transistors Qn301A, Qn302A, or in other words the input signals in2, in1 were input to the sources of the NMOS transistors Qn301A, Qn302A in order to reliably compare the input signals in1, in2. A current mirror was therefore comprised of the NMOS transistors Qn303A, Qn304A connected to a diode-connected NMOS transistor Qn305A through a common gate.

Also in the circuit of the related art 3, the PMOS transistors QP303A, Qp304A, Qp305A were connected between the power supply VDD and the drains of the NMOS transistors Qn303A, Qn304A, Qn305A. These PMOS transistors QP303A, Qp304A, Qp305A comprise a current mirror circuit by means of a common gate connection with the diode-connected PMOS transistor Qp306A. The source of the NMOS transistor Qn305A was directly connected to ground and the PMOS transistor Qp306A was connected to ground by way of the power supply I.

Therefore, the level shift circuit of the related art 3 satisfied the conditions necessary to permit achieving a stable level shift operation, by supplying the input signals in1, in2 to the gates of the NMOS transistors Qn301A, Qn302A after applying a DC shift, so that the amplitude of the input signals in1, in2 was a voltage sufficient to turn on the NMOS transistors Qn301A, Qn302A, even in a level shift circuit of TFT (thin film transistors) with a large threshold voltage Vt. However, lowering the supply voltage VDD to maintain a dynamic range for the circuit was difficult, and consequently the problem occurred that a TFT circuit system with low power consumption could not be achieved.

A sampling latch cell circuit of the related art having a level shift function comprised of CMOS devices is shown in FIG. 10B. This latch cell circuit of the related art is comprised basically of a comparator structure CMOS latch cell 101 having an N channel (hereafter simply NMOS) MOS transistor Qn101B with the input signal in1 as the gate input and a source connected to ground, an NMOS transistor Qn102B with the input signal in2 as the gate input and a source connected to ground, a P channel MOS transistor (hereafter simply PMOS) Qp101B connected between the power supply VDD and the drain of NMOS transistor Qn101B and having a gate connected to the drain of the NMOS transistor Qn102B, and having a PMOS transistor Qp102B connected between the power supply VDD and the drain of NMOS transistor Qn102B and having a gate connected to the drain of the NMOS transistor Qn101B.

The drain outputs from the NMOS transistor Qn102B and Qn101B in this CMOS latch cell 101B are latched in a latch circuit 106B by way of the inverters 102B, 103B and sampling switches 104B, 105B. The other latch output of the latch circuit 106B is inverted by the inverter 107B and supplied as an output signal out, and the other latch output is inverted by the inverter 108B and supplied as xout, which is a signal inversion of the output signal out.

In the structure of the above described sampling latch circuit of the related art, a 3 volt low voltage amplitude signal is for instance input as in1, and an inverted in1 signal input as in2. These 3 volt low voltage amplitude signals in1 and in2, are temporarily boosted up to the power supply voltage VDD in the CMOS latch cell 101B, and then, after passing via the inverters 102B and 103B are sampled by the sampling pulse SP in the sampling switches 104B, 105B and stored in the latch circuit 106B. After inversion by the inverters 107B and 108B, these signals sent as the output signals out, xout.

However, the above described sampling latch circuit of the related art, the circuit is comprised of many circuit devices (or elements) so that a small surface area is cannot be achieved. Further, when comprised of circuits utilizing devices having a large threshold voltage Vth such at TFT (thin film transistors), then the voltage amplitude of the input signals in1 and in2 is too small versus the threshold voltage Vth and consequently the transistors cannot be turned on reliably, rendering the problem that the sampling operation will not function.

In contrast, the related art shown in FIG. 1B operates easily, even if the device has a high threshold voltage Vth. The sampling latch circuits of the other related art have a structure that shifts the DC level of the signal by means of a capacitor. In other words, the outputs of the switch 201B that inputs the signal in1, and the switch 202B to input the signal in2 are connected in common, and one end of the switch capacitor 203B is connected to that common point.

The other end of this capacitor 203B is connected to one end respectively of the switches 204B and 205B as well as the input of the inverter 205B.

The output end of the inverter 207B is connected to the other end of the switch 205B. The other end of the switch 204B, the output of the inverter 206B and the input of the inverter 207B are connected in common, and the input of the inverter 208B is connected to that common point, and an output signal out is sent from the output of the inverter 208B.

In the structure of the above described sampling latch circuit of the related art, a switch-capacitor 203B is utilized as the comparator and the circuit operation is as follows. First of all, circuit reset is performed by setting the switches 202B, 204B on in response to an equalizing pulse Eq. Afterwards however, a low voltage amplitude input signal in1 is sampled by turning on a switch 201B in response to an equalizing pulse SP. Next, this sampled signal in1 is level shifted while being compared with the input signal in2 in the capacitor 203B, and finally latched in latch circuits 206B, 207B by a switch 205B turning on in response to a latch pulse LT.

In this way, the above sampling circuit of the related art, even with a circuit comprised of TFTs having a high threshold voltage can be easily operated by shifting the DC level of the input signal in1 by means of a capacitor 203B, and stable sampling and latch operation can be achieved. However this circuit has the problem that low current consumption is difficult to achieve since direct current must flow in the circuit during reset. Further, many types of pulses are required for circuit operation and a complex control circuit is also needed because of difficult timing control and therefore a small circuit surface area cannot be achieved.

A latch circuit of the related art 1, having a CMOS structure with a level shift function is shown in FIG. 10C. This latch circuit of the related art 1 has a structure comprised of a first and second switch 101C, 102C for inputting the first and second input signals in1, in2 in response to the latch pulse, a CMOS latch cell 103C for latching each of the signals input by means of these switches 101C, 102C, and a level shift circuit 104C to shift the level of the latch data of the CMOS latch cells 103C.

Here, the CMOS latch cell 103C is comprised of two CMOS inverters 107C and 108C connected in parallel between the power line 105C of the positive power supply VDD and the power supply line 106C of the negative power supply voltage (for instance, ground level) VSS1. The input terminal of the CMOS inverter 107C is connected to the output terminal of the other CMOS inverter 108C, and the input terminal of the CMOS inverter 108C is connected to the output terminal of the other CMOS inverter 107C.

The level shift circuit 104C is connected between the power line 105C and the power line 109C (negative power supply voltage) for voltage VSS2 having a lower voltage than the negative power supply voltage VSS1. The data latched at a low level in the CMOS latch cell 103C is level shifted from power supply voltage VSS1 to power supply voltage VSS2.

In this latch circuit of the related art 1, a low voltage amplitude signal between VDD and VSS was input as in1, and an inversion of the in1 signal was input as in2. These low voltage amplitude signals in1 and in2 are latched in the CMOS cell circuit 103C by the switches 101C and 102C turning on in response to a latch pulse, and then level shifted to a signal with an amplitude between VDD and VSS (VSS<VSS1) by means of the level shift circuit 104, and finally output as the output signals out1 and out2.

The latch circuit of the related art 2 having a level shift function is shown in FIG. 11C. This latch circuit of the related art 2 is comprised of a first and a second switch 201C and 202C to input the first and second input signals in1, in2 in response to a latch pulse, and a CMOS latch cell 203C to latch each of the signals input by way of the switches 201C and 202C.

Here, the CMOS latch cell 203C is comprised of two CMOS inverters 206C and 207C connected in parallel with a power supply line 204C and a power supply line 205C for a power supply voltage VSS2 lower than a power supply voltage VSS1. The input terminal of the CMOS inverter 206C is connected to the output terminal of the other CMOS inverter 207C, and the input terminal of the other CMOS inverter 207C is connected to the output terminal of the other CMOS inverter 206C.

In this latch circuit of the related art 2, a low voltage amplitude signal between VDD and VSS is input as in1, and an inversion of the signal in1 is input as in2. These low voltage amplitude signals in1 and in2 are latched as an amplitude signal between VDD and VSS2 in the CMOS cell circuit 203C by the switches 101C and 102C turning on in response to a latch pulse, and these amplitude signals are then output unchanged, as the output signals out1 and out2.

However, in the latch circuit of the related art 1, the installation of a level shift circuit 104C in the latter stage of the CMOS latch cell 103C was necessary so the number of devices (elements) comprising this latch circuit became large creating the problem that a circuit with a compact size (small area) could not be achieved. In the latch circuit of the related art 2 however, though installation of a level shift circuit was not necessary and the number of devices in the circuit was small compared to the latch circuit of the related art 1, the low voltage amplitude signal had to be rewritten in order to latch as a high voltage amplitude signal so that the size of the signal buffer of the previous stage was too large, also creating the problem that a circuit with a compact size (small area) could not be achieved.

However, when fabricating a drive-circuit-integrated liquid crystal display comprising a digital interface drive circuit integrated with a pixel section of polysilicon TFT on a glass substrate (liquid crystal panel) with silicon TFT (thin film transistors) arrayed in two-dimensional matrix as the pixel switching devices, a latch circuit with a small surface area is an essential factor in narrowing the width of the peripheral area (picture frame) of the pixel forming the drive circuit.

In other words, in an drive-circuit-integrated liquid crystal display, the latch circuit must be provided for each column line/each bit. Since this latch circuit is required in quantities equivalent to the number of horizontal dots times the number of bits, the inability to make the latch circuit smaller consequently leads to the problem that the width of the picture frame of the liquid crystal panel has to be made larger.

Further, in the drive-circuit-integrated liquid crystal display, mounted with a latch circuit having the above described level shift function, the current flow in the second power supply (for example the VSS2 power supply) may sometimes have to be reduced to an extremely small amount. In the drive-circuit-integrated liquid crystal display made with TFT (thin film transistors) for example, a latch circuit with a circuit configuration for horizontal drive system may be installed, while at the same time attempting to fabricate a second power supply generator circuit with TFT (thin film transistors).

In such cases, the total current flow to the second power supply generator circuit will become large on account of the large number of latch circuits with level shift function that are required. However, fabricating a power supply generator circuit with TFT (thin film transistors) that can maintain a sufficient current capacity is extremely difficult. Consequently, integrating a second power supply generator circuit onto a glass substrate with thin film transistors is difficult to achieve and leads to the problem of an increased size (surface area) of the peripheral circuit.

The latch circuit of the related art 1 and 2 is configured to perform a level shift of low voltage amplitude signals in1 and in2 between VDD to VSS1, to a signal amplitude between VDD and VSS2 however, a level shift to a third power supply voltage VDD2 (VDD2>VDD) may also be performed.

The related art is shown in FIG. 12C and FIG. 13C. FIG. 12C is an example of the related art 3 corresponding to FIG. 10C. FIG. 13C is an example of the related art 4 corresponding to FIG. 13C. The latch circuit of the related art 3 is comprised in the latter stage of a level shift circuit 104C, of a second level shift circuit 111C connected between the power supply line 109C of the power supply voltage VSS2 and the power supply line 110 of the power supply voltage VDD2 higher than the power supply voltage VDD. The latch circuit of the related art 4 on the other hand, is a CMOS latch cell 203C and connected between the power supply line 205C of the power supply voltage VSS2 and the power supply line 208C of the power supply voltage VDD2 with a voltage higher than the power supply voltage VDD.

The latch circuit of the related art 3 and the latch circuit of the related art 4 also have problems identical to the previously described latch circuit of the related art 1 and the latch circuit of the related art 2.

SUMMARY OF THE INVENTION

In view of the above problems with the related art, this invention has the object of providing a liquid crystal display device and a DA (digital/analog) converter circuit mounted in the liquid crystal display device having a circuit comprised of only a small number of elements, and without increased power consumption and also helping ensure a LCD panel picture frame with a narrow width.

The DA (digital/analog) converter circuit of this invention comprised of 2n step select units with n number of serially connected analog switches with a polarity matching the logic of each data signal n bit (n is an integer of 2 or more), and respectively connected across the outputs of each of the 2n reference voltage lines. The reference voltage select DA converter circuit is mounted in the drive circuit-integrated liquid crystal display device, as a portion of the that drive circuit.

In this DA (digital/analog) converter circuit and the liquid crystal display device mounted with this DA converter circuit, the step select units configured with n analog switches mutually connected in serial and having a polarity corresponding to the data signal bit logic are connected between the column lines of the pixels and the reference voltage lines, and can be configured with the same transistors, of a decode circuit to decode the data signals and, a select switch to select a reference voltage corresponding to the decoded output from the decode circuit, and thus reduce the number circuit elements required in the circuit.

Also in view of the above problems with the related art, this invention has the further object of providing a level shift circuit, and a liquid crystal display device mounted with this level shift circuit, capable of stable, high speed level shift operation with a small surface area and low power consumption, even when the circuit utilizes devices having a large threshold voltage Vth.

The level shift circuit of this invention has a CMOS latch cell as the basic structure for a level shift circuit for converting a low voltage amplitude signal to a high voltage amplitude signal in a structure with resistor elements inserted respectively between two input signal sources and two input sections of the CMOS latch cell.

The shift register of this invention is comprised of a first level shift circuit comprising a plurality of transfer stages to supply a start signal to the initial stage of the transfer stages as a level shift, and a second level shift circuit to supply a clock signal to each transfer stage as a level shift, wherein the level shift circuit of this invention is comprised of the first and the second level shift circuits.

In the drive circuit-integrated liquid crystal display device of this invention comprising a drive circuit with scanning system integrated onto the same substrate as the pixel section, one of the circuits comprising the scanning system utilizes the above described level shift circuit or shift register.

In the level shift circuit, the shift register utilizing this level shift circuit as well as the liquid crystal display device mounted with this shift register, the resistor elements inserted respectively between the two input signal sources and the two input sections of the CMOS latch cell, apply the two input signals to the two input sections of the CMOS latch cell as respective DC shifts. This DC shift allows obtaining a voltage sufficient to turn on each of the transistors comprising the CMOS latch cell. Therefore, the level shift circuit and the shift register of this invention are compatible with devices having a large threshold voltage Vth.

It is an object of the present invention to provide the sampling circuit having a small surface area and with low power consumption and the sampling circuit-integrated LCD which can be compatible with devices having a large threshold voltage Vth like TFT devices.

Also in view of the above problems with the related art, this invention has the further object of providing a sampling latch circuit with low power consumption and small surface area and a liquid crystal device mounted with this sampling latch circuit, applicable even to devices having a large threshold voltage Vth.

The sampling latch circuit of this invention comprises a comparator type CMOS latch cell as the basic structure, and this CMOS latch cell has a first switch connected between the two input signal sources and the two input sections of the CMOS latch cell, and a second switch connected between the power supply line and the power supply side of the CMOS latch cell, and a control means to control the complementary switching of the first and the second switches.

In the drive circuit-integrated liquid crystal display device of this invention comprising a drive circuit with scanning system integrated onto the same substrate as the pixel section, one of the circuits comprising the scanning system utilizes the above described sampling latch circuit.

In the above described sampling circuit and the liquid crystal display device of this invention mounted with the sampling circuit, the sampling of the two input signals is performed by turning on (closed) the first switch. The second switch is off (open) during this sampling period. The CMOS latch cell is therefore cut off from the power supply. The sampling period ends and the second switch then turns on, and in the instant in which the CMOS latch cell is supplied with power, a small voltage amplitude input signal is latched at the power supply voltage amplitude signal.

Also in view of the above problems with the related art, this invention has the further object of providing a latch circuit and a liquid crystal display device mounted with the latch circuit, capable of limiting the current flow to the power supply and also having a small surface area.

The latch circuit of this invention has a basic structure comprised of a CMOS latch cell, a first switch and a second switch installed on at least one of the positive power supply or negative power supply side of the CMOS latch to respectively select a first and a second power supply having different power supply voltages and, a control means to control the switching of a first switch and a second switch according to each period of the latch operation and output operation of the CMOS latch cell.

In the drive circuit-integrated liquid crystal display device of this invention comprising a drive circuit with scanning system integrated onto the same substrate as the pixel section, one of the circuits comprising the scanning system utilizes the above described latch circuit.

In the above described latch circuit and the liquid crystal display device of this invention mounted with the latch circuit, the latching of the two input signals is performed based on the first power supply, in the latch operation period by turning on (closing) the first switch and sampling latching the input signal in the CMOS latch cell. Next, in the output operation period, the second switch it turned on to convert (level shift) to a level of the second power supply different from the first power supply level, and output operation add is performed. As a result, the signal amplitude determined by the first power supply voltage is output as a signal amplitude determined by the second power supply voltage.

Of course, this invention is also applicable to all combinations of circuits having the above functions or liquid crystal displays mounted with all or a portion of the combinations and adaptations of the circuits. Further, the combinations and adaptations of the circuits are also applicable to this invention when mounted in devices such as CMOS devices other than liquid crystal display devices.

BRIEF DESCRIPTION OF THE DRAWINGS

FIG. 18 is a circuit diagram showing the sampling hold circuit of the first embodiment of this invention.

FIG. 19 is a timing chart for illustrating the circuit operation of the sampling hold circuit of the first embodiment of this invention.

FIG. 22 is a circuit diagram showing the sampling hold circuit of the second embodiment of this invention.

FIG. 24 is a block diagram showing the structure when inverted digital data is utilized as the input signal in2.

FIG. 28 is a timing chart illustrating the timing for another circuit operation of the latch circuit of the first embodiment of this invention.

DESCRIPTION OF THE PREFERRED EMBODIMENTS

Figure 1:
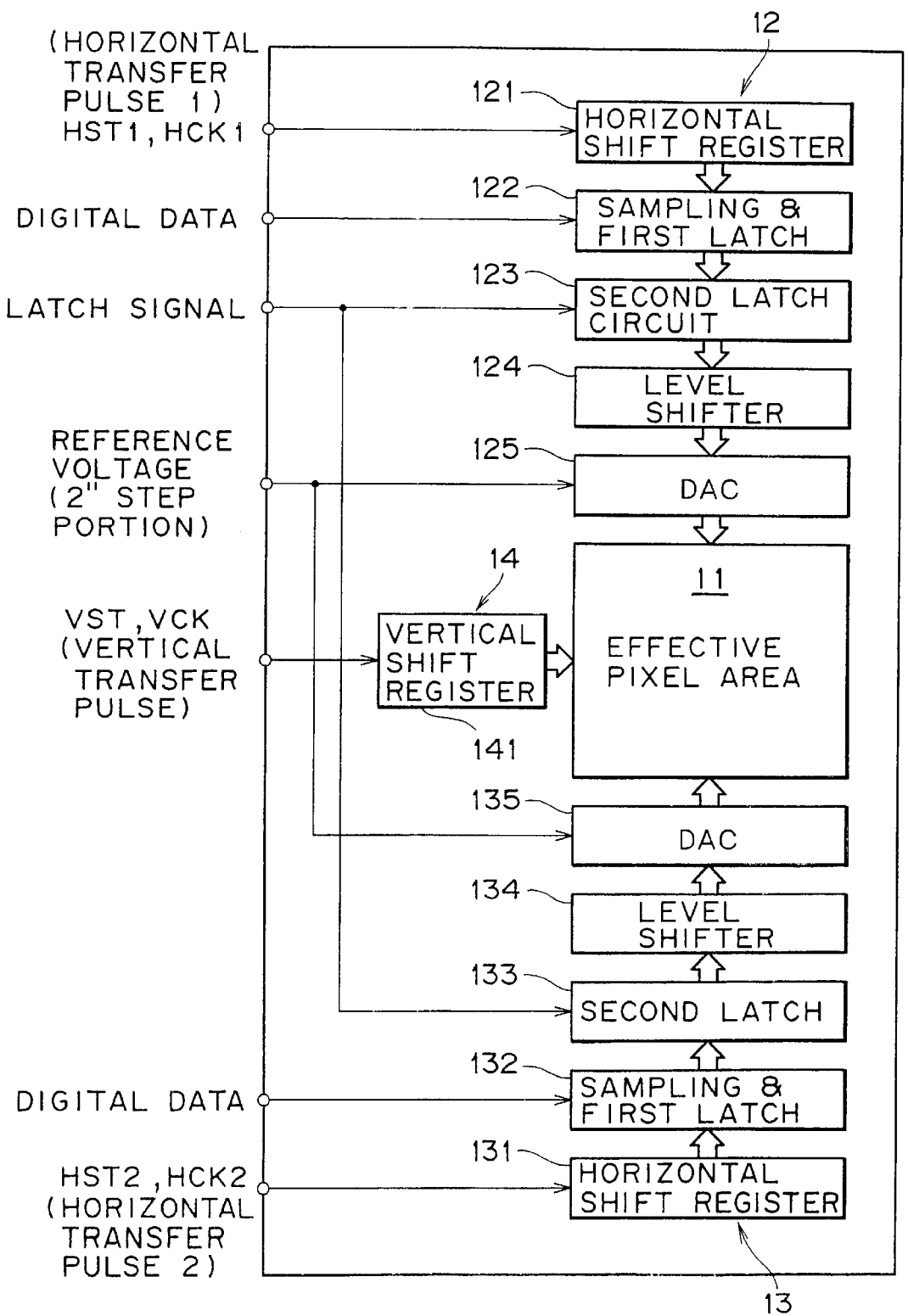
FIG. 1 is a block diagram showing the system configuration of the drive circuit-integrated liquid crystal display device of the first embodiment of this invention.

The embodiments of this invention are next described in detail while referring to the accompanying drawings. FIG. 1 is a block diagram showing the system configuration of the drive circuit-integrated liquid crystal display device of the first embodiment of this invention. In FIG. 1, an effective pixel area 11 comprising pixels arrayed in a matrix, first and a second horizontal drive systems 12, 13 are arrayed above and below the pixel area 11 and a vertical drive system 14 is for instance arranged at the left side of the drawing.

The horizontal drive system need not always be placed above or below the effective pixel area 11 and can be placed just on one side either above or below the effective pixel area 11. The vertical drive system also may be placed on the right side as shown in the drawing or may be placed on the left side. The first and a second horizontal drive systems 12, 13 and the vertical drive system 14 are integrated onto the same substrate (a first board made for instance of glass) with the effective pixel area 11 of TFT (thin film transistors). A second board for instance made of glass (not shown in drawing) may be placed at a specified distance facing the first board. A liquid crystal layer for instance comprising liquid crystal TN is held between these two boards.

The first horizontal drive circuit 12 is comprised of a horizontal shift register 121, a sampling & latch circuit 122, a second latch circuit 123, a level shifter 124 and a DA converter circuit (DAC) 125. The second horizontal drive circuit 13, in the same way as the first horizontal drive circuit 12 is comprised of a horizontal shift register 131, a sampling & latch circuit 132, a second latch circuit 133, a level shifter 134 and a DA converter circuit (DAC) 135. The vertical drive circuit 14 is comprised of a vertical shift register 141.

Figure 2:
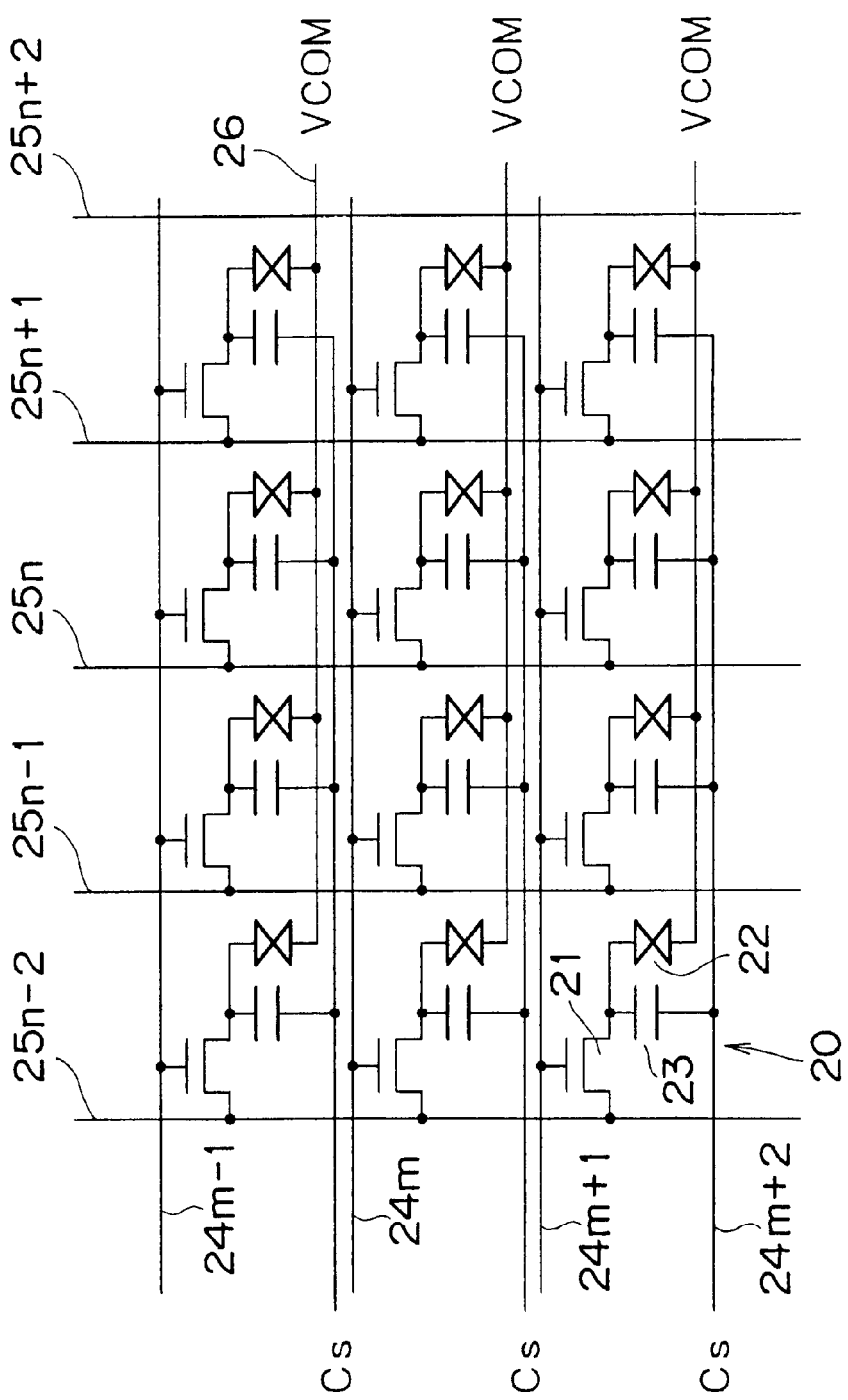
FIG. 2 is a circuit diagram showing the structure of the effective pixel area.

A typical structure of a pixel 20 for the effective pixel area 11 is shown in FIG. 2. The pixel 20 is comprised of a TFT 21 as the switching element, a liquid crystal cell 22 with a pixel electrode connected to the drain electrode of the TFT 21, and an auxiliary capacitor 23 with an electrode connected to one electrode of the drain electrode TFT 21. In this pixel structure, the gate electrode of the TFT 21 of each pixel 20 is connected to the vertical select lines which are the row (lines) 24m−1, 24m, 24m+1, . . . . The source electrode of the TFT 21 of each pixel is connected to the signal lines which are the column (lines) 25n−1, 25-n, 25n+1, . . .

The electrodes of the liquid crystal cell 22 are connected to a common line 26 applying a common voltage VCOM. Here for example, a common inversion drive method is employed to invert the common voltage VCOM every 1H (1 horizontal period) as a method to drive the liquid crystal cell 22. Since the polarity of the common voltage VCOM can be inverted every 1H by utilizing this common inversion drive method, a low voltage can be used for the first and second horizontal drive systems 12 and 13 and the power consumption of the overall device can be reduced.

The operation of each section of the first and second horizontal drive systems 12 and 13 is described next. The following description utilizes the first horizontal drive system 12 as an example however this description may also apply to the second horizontal drive system 13 operation.

In the first horizontal drive system 12, a horizontal transfer pulse 1 or in other words a horizontal start pulse HST1 and a horizontal clock pulse HCK1 are supplied to the horizontal shift register 121. The horizontal shift register 121 then performs horizontal scanning using the period of the horizontal clock pulse HCK1 in response to the horizontal start pulse HST1. The sampling & first latch circuit 122 synchronizes with the horizontal scanning of the horizontal shift register 121 and sequentially samples the digital data and then latches the sampled data to each of the column lines, 25n−1, 25n, 25n+1 . . . .

The second latch circuit 123 once again latches (or relatches) the latch data corresponding to the column lines latched by the sampling & first latch circuit 122 at each 1H period in response to the latch signals supplied at 1H periods. The level shifter 124 shifts the signal level (amplitude) for the latch data relatched by the second latch circuit 123, to a specified level and supplies it to the DA converter circuit 125. The level shifted to by the level shifter 124 is related later.

In the vertical drive system 14 on the other hand, a vertical transfer pulse or in other words a vertical start pulse VST and a vertical clock pulse VCK are supplied to the vertical shift register 14. The vertical shift register 141 then performs vertical scanning at the period of the vertical clock pulse VC in response to the vertical start pulse VST and supplies a sequential row select signal in row units for the effective pixel area 11.

A reference voltage select DA converter circuit to select a target reference voltage from the reference voltages in stepped figures received from the level shifted data in the level shifters 124, 134 is utilized as the DA converter circuits 125, 135 of the first and second horizontal drive system 12, 13. The detailed circuit structure of these reference voltage select DA converter circuits 125, 135 is related in the section listing the characteristics of the invention.

Figure 3:
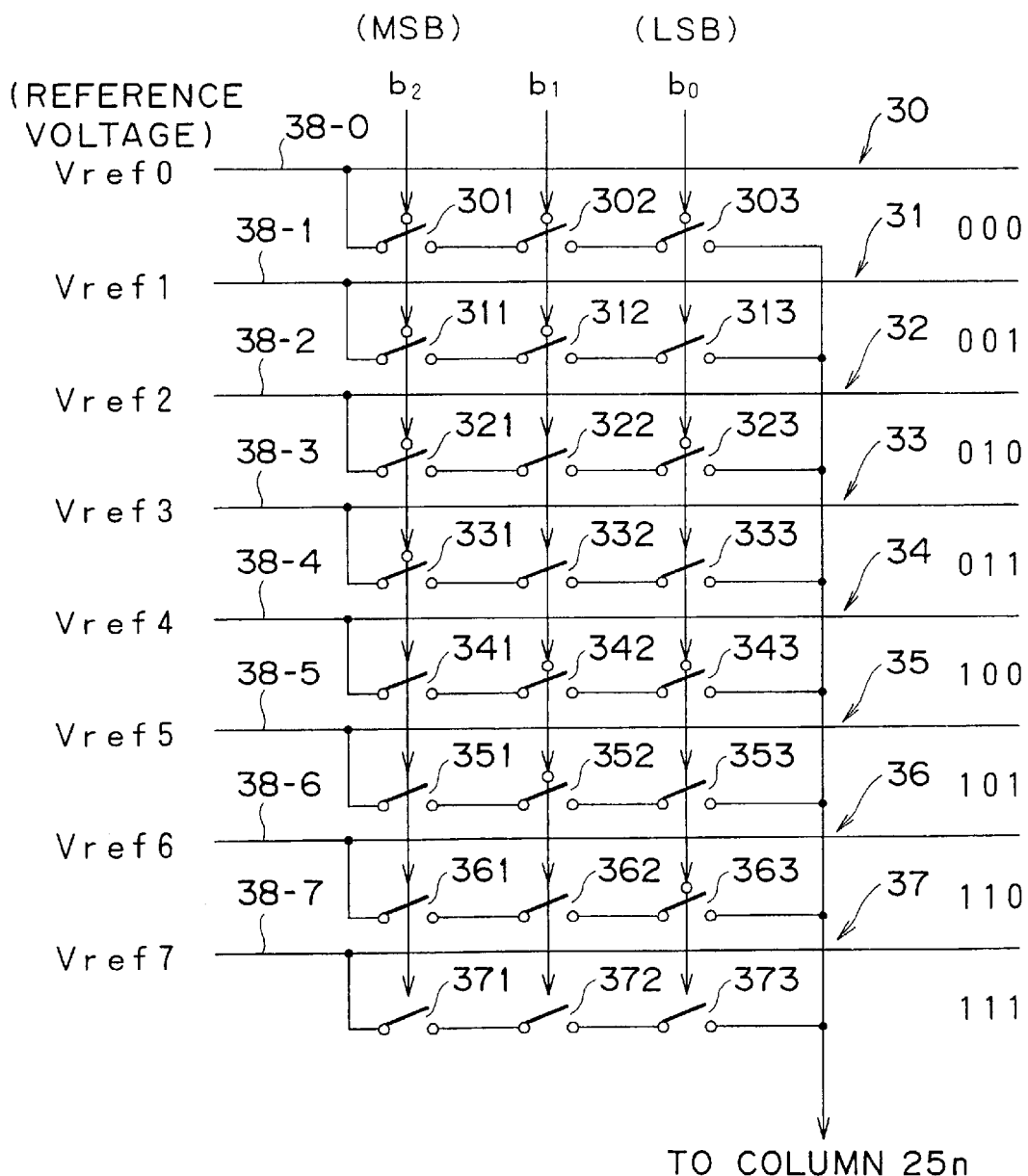
FIG. 3 is a basic layout drawing of the reference voltage select DA converter circuit.

The basic structure of the reference voltage select DA converter circuit is shown in FIG. 3. The description given here utilizes an example with a circuit structure having an 8 (=$2^3$) step reference voltage Vref0 through Vref7 for 3 bit digital data (b2, b1, b0). Also in FIG. 3, a circuit configuration for a DA converter circuit corresponding to a column line 25n is shown however the DA converter circuit applicable to this invention is provided for each column line.

In FIG. 3, eight step select units 30 through 37 are provided for the eight step reference voltages Vref0 through Vref7. These step select units 30 through 37 have a structure comprising three mutually serially connected analog switches polarized (positive/negative) according to the logic of each digital data bit (b2, b1, b0). In other words, the step select unit 30 is comprised of three negative polarity analog switches 301, 302, 303 corresponding to the data "000" and connected to the reference voltage line 38-0 of the Vref0 and the column line 25n. The step select unit 31 is comprised of two negative polarity analog switches 311, 312 and one positive polarity analog switch 313 mutually connected in serial, corresponding to the data "001" and connected between the reference voltage line 38-1 of Vref1 and the column line 25*n*.

The step select unit 32 is comprised of a negative polarity analog switch 321, 312 and a positive polarity analog switch 322, and a negative polarity analog switch 322 mutually connected in serial, corresponding to the data "010" and connected between the reference voltage line 38-2 of Vref2 and the column line 25n. The step select unit 33 is comprised of a negative polarity analog switch 331, 331 and two positive polarity analog switches 332, and 333 mutually connected in serial, corresponding to the data "011" and connected between the reference voltage line 38-3 of Vref3 and the column line 25n.

The step select unit 34 is comprised of two negative polarity analog switches 342, 343 and a positive polarity analog switch 341, mutually connected in serial, corresponding to the data "100" and connected between the reference voltage line 38-4 of Vref4 and the column line 25n. The step select unit 35 is comprised of a positive polarity analog switch 351, a negative polarity analog switch 352 and a positive polarity analog switches 353 mutually connected in serial, corresponding to the data "101" and connected between the reference voltage line 38-5 of Vref5 and the column line 25n.

The step select unit 36 is comprised of one negative polarity analog switch 363 and two positive polarity analog switches 361, and 362 mutually connected in serial, corresponding to the data "110" and connected between the reference voltage line 38-6 of Vref6 and the column line 25n. The step select unit 37 is comprised of three positive polarity analog switches 371, 372, 373 mutually connected in serial, corresponding to the data "111" and connected between the reference voltage line 38-7 of Vref3 and the column line 25n.

Figure 4:
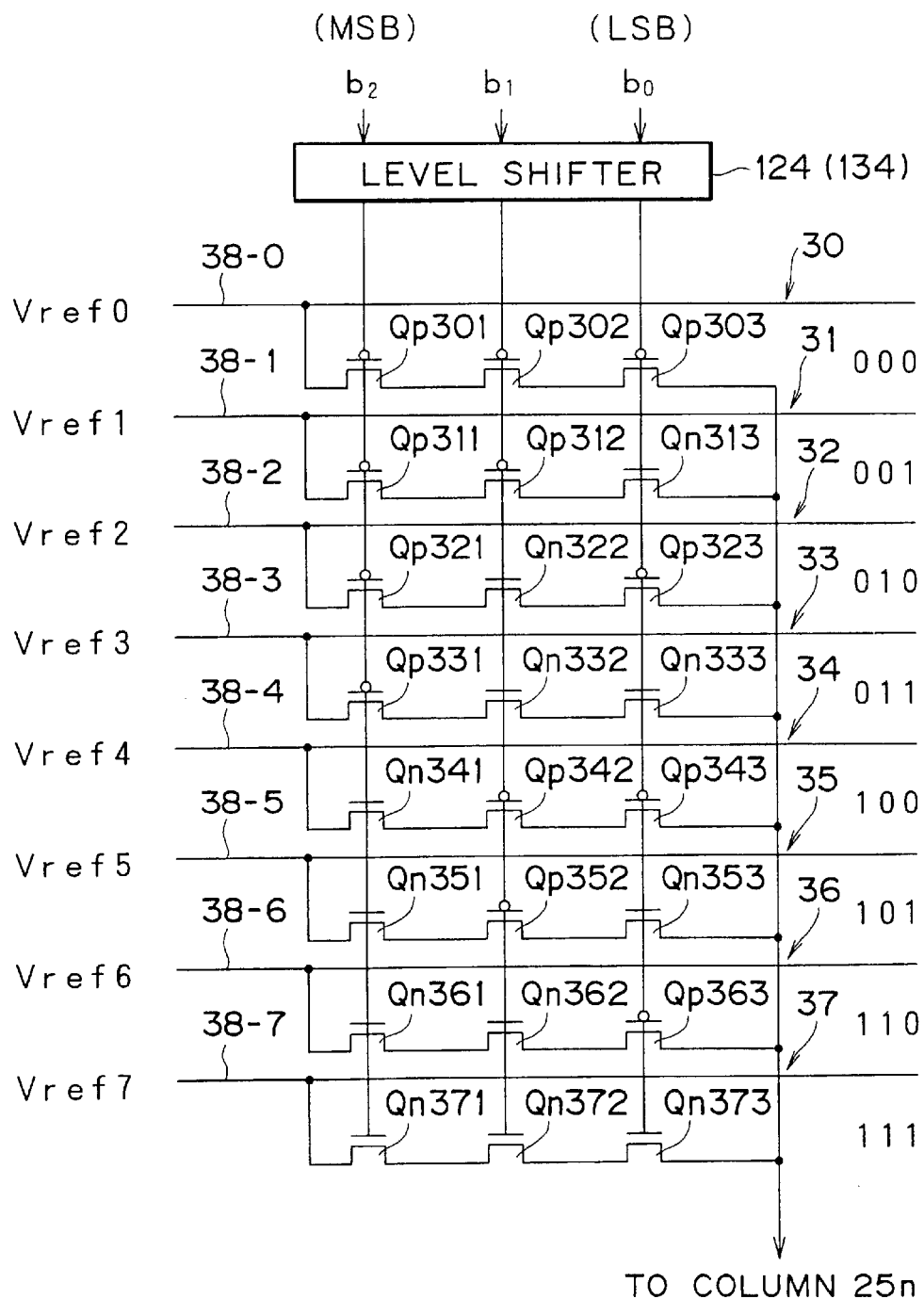
FIG. 4 is a circuit diagram showing the basic circuit structure of the reference voltage select DA converter circuit.

FIG. 4 is a circuit diagram showing the basic circuit structure of the reference voltage select DA converter circuit 125. The same reference numbers are assigned to sections identical to FIG. 3. The structure utilizes conductive (N-channel, P-channel) MOS transistors corresponding to the logic of each digital data bit (b2, b1, b0) as the three analog switches for the eight stages of the step select units 30 through 37.

In FIG. 4, the step select unit 30 utilizes the P channel MOS transistors (hereafter referred to as PMOS) Qp301, Qp302 and Qp303 respectively as the analog switches 301, 302, 303 corresponding to the data "000" and these switches are fabricated to be arranged in series. The step select unit 31 utilizes the PMOS transistors Qp311, Qp312 and the N channel MOS transistor (hereafter referred to as NMOS) Qn313 respectively as the analog switches 311, 312, 313 corresponding to the data "001" and these switches are fabricated to be arranged in series.

The step select unit 32 utilizes the PMOS transistor Qp321 and the NMOS transistor Qn322 and the PMOS transistor Qp323 respectively as the analog switches 321, 322, 323 corresponding to the data "010" and these switches are fabricated to be arranged in series. The step select unit 33 utilizes the PMOS transistor Qp331 and the NMOS transistor Qn332, Qn333 as the analog switches 321, 322, 323 corresponding to the data "011" and these switches are fabricated to be arranged in series.

The step select unit 34 utilizes the NMOS transistor Qn341, and the PMOS transistor Qp342, Qp343 as the analog switches 341, 342, 343 corresponding to the data "100" and these switches are fabricated to be arranged in series. The step select unit 35 utilizes the NMOS transistor Qn351, and the PMOS transistor Qp352, and the NMOS transistor Qn353 as the analog switches 351, 352, 353 corresponding to the data "101" and these switches are fabricated to be arranged in series.

The step select unit 36 utilizes the NMOS transistors Qn361, Qn362 and the PMOS transistor Qp363 as the analog switches 361, 362, 363 corresponding to the data "110" and these switches are fabricated to be arranged in series. The step select unit 37 utilizes the NMOS transistors Qn371, Qn372, Qn373 as the analog switches 371, 372, 373 corresponding to the data "111" and these switches are fabricated so as to be arranged in series.

The above structure of the reference voltage select DA converter circuit 125 utilizes one PMOS transistor or one NMOS transistor for each of the n analog switches with a polarity corresponding to the logic of each of the n (n is greater than or equal to 2) digital data bits by fabricating combinations of the PMOS transistors and NMOS transistors to comprise 2n step select units for the target step, so that a multi-step DA converter with a small surface area can be achieved and consequently, an LCD panel with an extremely narrow width picture frame can be obtained. The reasons are explained as follows.

Figure 35:
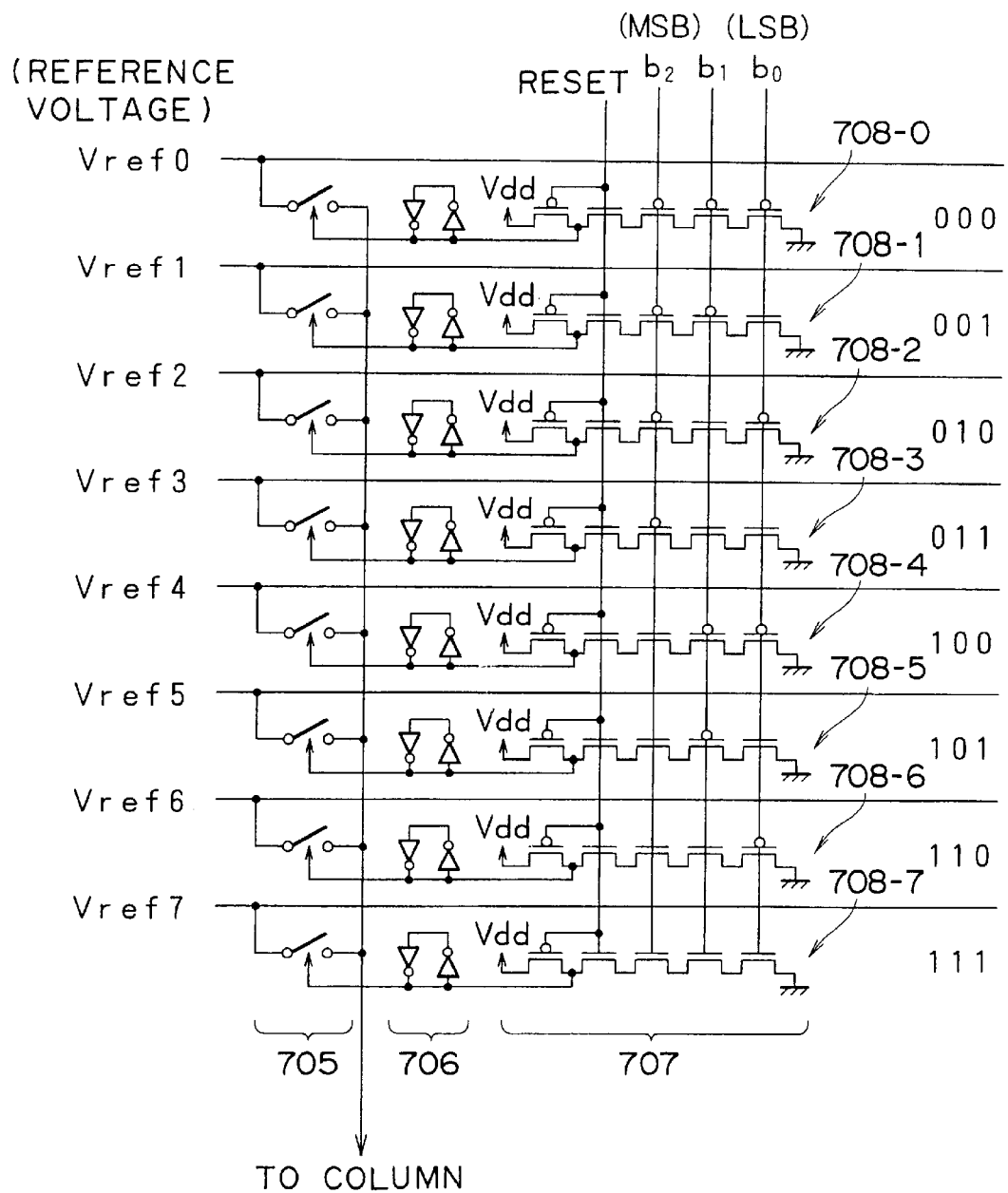
FIG. 35 is a circuit diagram showing a typical reference voltage select DA converter circuit.

(1) The decode circuit 707 and the selector switch 705 in the circuit of the conventional art shown in FIG. 35 are configured from the same transistor so that the number of elements comprising the circuit can be kept extremely small.

(2) The TFT circuit has no well to separate the elements and since the PMOS and NMOS transistors forming the switch can be formed in continuous close proximity, the space occupied by the circuit can be kept extremely small.

Figure 5:
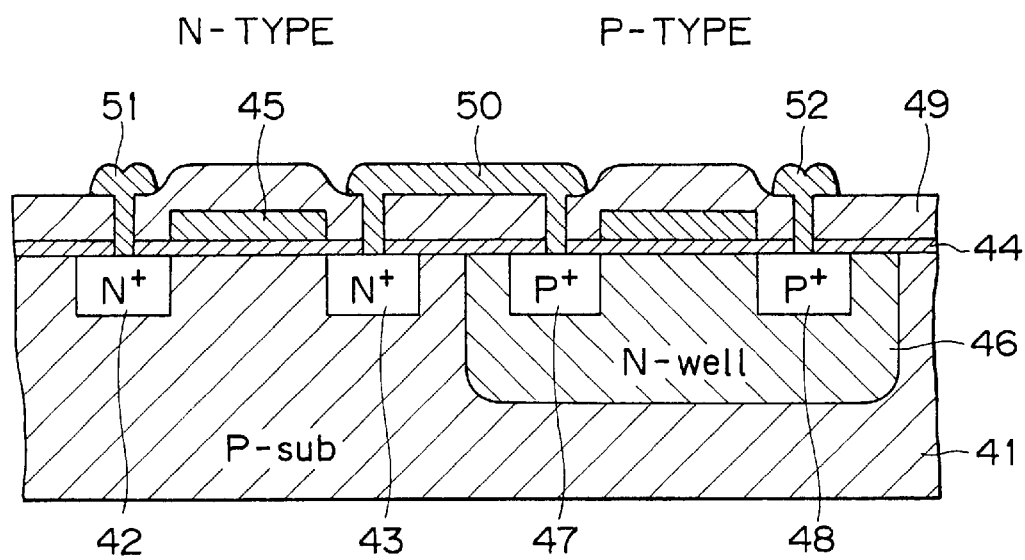
FIG. 5 is a cross sectional view showing a typical structure of a single crystalline silicon transistor.

The reason for (2) is further explained by comparing with the structure of a single crystalline silicon transistor. This comparison is made utilizing the case in which one NMOS transistor and one PMOS transistor are formed in series. First, when considering the structure of a single crystalline silicon transistor as shown in FIG. 5, N+ diffusion regions 43, 42 are formed at fixed intervals on the substrate surface of the P type silicon substrate 41. A gate electrode 45 is positioned above the channel between these N+ diffusion regions 43, 42 via a gate insulator film 44, and the NMOS transistor thus formed. Here, the N+ diffusion region 42 forms a drain/source region, and the N+ diffusion region 43 forms a drain/source region.

In order to form a PMOS transistor adjacent to an NMOS transistor, an N well 46 for element separation is formed by doping with N type impurities. Then P+ diffusion regions 47, 48 are formed at fixed intervals on the substrate surface side within this N well 46. A gate electrode 49 is positioned above the channel between these P+ diffusion regions 47, 48 via a gate insulator film 44, and the PMOS transistor thus formed. Here, the P+ diffusion region 47 forms a drain/source region, and the P+ diffusion region 48 forms a drain/source region.

In order to form both transistors in series, the N+ diffusion region 43 forming a drain/source region and the P+ diffusion region 47 forming a drain/source region are connected by way of an interlayer insulator film 49 to an aluminum wiring 50. Also, the N+ diffusion region 44 forming the drain/source region of the NMOS transistor is connected to the aluminum electrode 51, and the P+ diffusion region 48 forming the drain/source region of the PMOS transistor is connected to the aluminum electrode 52.

Figure 6:
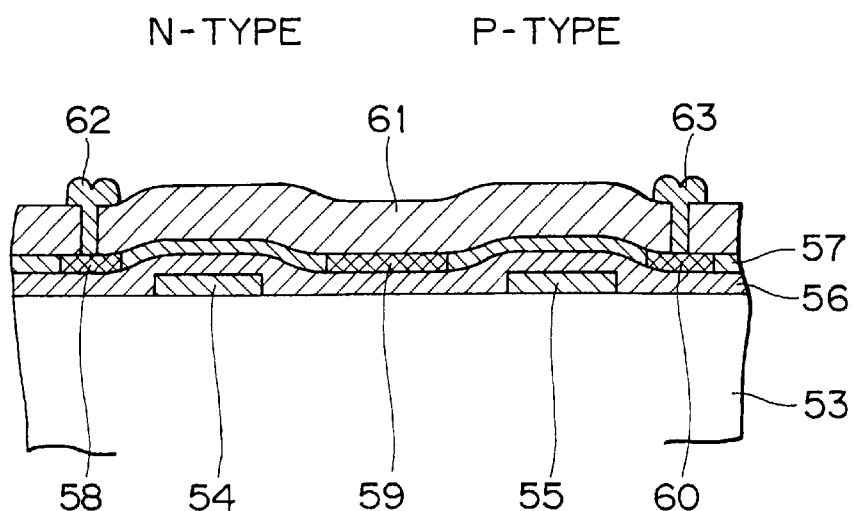
FIG. 6 is a cross sectional view showing a typical structure of a polysilicon thin film transistor.

Next, in the case, for instance, of the bottom gate of the polysilicon TFT structure, the gate electrodes 54, 55 are formed at fixed intervals on the glass substrate 53 as shown in FIG. 6, and a polysilicon layer 57 formed above the gate electrodes 54, 55 by way of the gate insulator film 44.

Then, a diffusion layer 58 forming the drain/source region of an NMOS transistor, a diffusion layer 59 forming the drain/source region for both NMOS, PMOS transistors, and a diffusion layer 60 forming the drain/source region for a PMOS transistor are formed on the silicon oxide layer 56 on the sides of the gate electrodes 54 and 55. The aluminum electrodes 62 and 63 are respectively connected to the diffusion layers 58, 60 by way of an interlayer insulator film 61.

As clearly shown by comparing the transistor structure of FIG. 6 and the transistor structure of FIG. 5, in the case of a polysilicon TFT structure, there are no wells (46) for separating the elements such as are present in single crystalline silicon transistors, so that the NMOS transistors and PMOS transistors can be consecutively formed in close proximity and consequently, the surface area occupied by the circuit can be kept extremely small.

However, in a liquid crystal display device utilizing the common (VCOM) inversion drive method, having a DA converter circuit to select a reference voltage within a range of 0 to 5 volt level, when a MOS transistor is utilized as the analog switch as shown above, when the threshold value of the PMOS transistor is set to Vthp, and the NMOS transistor is set to a threshold value of Vthn in order to maintain the dynamic range of the selected reference voltage, then the low level of the selected data signal must be within 0–Vtp volts, and the high level must be a 5 volts+Vthn or more.

Therefore, since setting the amplitude of the selected data signal as low as the threshold Vthp of the PMOS transistor versus the reference voltage range, and also as high as the Vthn threshold value of the NMOS transistor (for instance, 0 volts–Vthp to 5 volts+Vthn in the above example) is necessary, then in this embodiment in the system structure of FIG. 1, level shifters (level shift circuit) 124, 134 are placed in the prestage of the DA converter circuits 125, 135 and a configuration employed to obtain the amplitude of the selected data signal by means of the level shift of these level shifters 124, 134.

This configuration allows a reference voltage select DA converter circuit to be attained with a small surface area without setting a high power supply voltage for the sampling & first latch circuits 122, 132. However, when the amplitude of the original selected data signal satisfies the stated conditions then, as can be clearly seen, the dynamic range for the selected reference voltage can be maintained without providing level shifters 124, 134.

A detailed description of the circuit structure of the level shift circuit utilized as the level shifters 124, 134 is described next.

Figure 7:
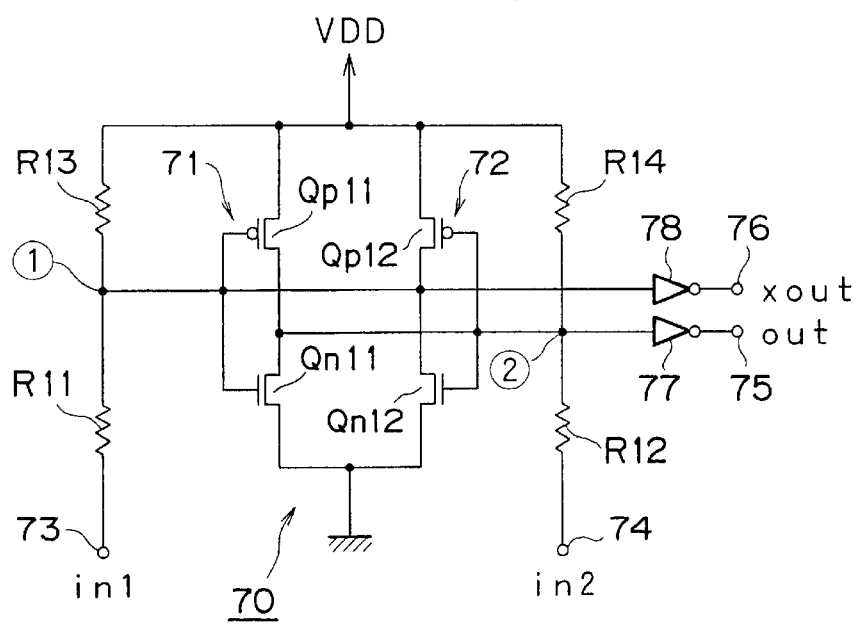
FIG. 7 is a circuit diagram showing the level shift circuit of the first embodiment of this invention.

A circuit diagram showing the level shift circuit of the first embodiment is shown in FIG. 7. In this level shift circuit of the first embodiment, a CMOS latch cell 70 has a basis structure comprised of a CMOS inverter 71 comprising a PMOS transistor Qp11 and an NMOS transistor Qn11 with a jointly connected source and drain, and, a CMOS inverter 72 comprising a PMOS transistor Qp12 and an NMOS transistor Qn12 with a jointly connected source and drain, and the CMOS inverters 71 and 72 are mutually connected in parallel between the power and ground.

In this CMOS latch cell 70, the input of the CMOS inverter 71 (namely, the common connection point of MOS transistors Qn11, Qp11) is connected with the output of the CMOS inverter 72 (namely, the common drain connection point of the MOS transistors Qn12, Qp12). Further, the input of the CMOS inverter 72 (namely, the common gate connection point of the MOS transistors Qn12, Qp12) is connected with the output of the CMOS inverter 71 (namely, MOS transistors Qn11, Qn12).

A resistor element R11 is connected between the input of the CMOS inverter 71 and the first circuit input terminal 73, and a resistor element R12 is connected between the input of the CMOS inverter 72 and the second circuit input terminal 74. Also, a resistor element R13 is connected between the power supply VDD and input of the CMOS inverter 71, and a resistor element R14 is connected between the power supply VDD and input of the CMOS inverter 72. Further, an inverter 77 is connected between the first circuit output terminal 75 and the node ②which is the common connection point for the resistor elements R12, R14. An inverter 78 is connected between the second circuit output terminal 76 and the node ① which is the common connection point for the resistor elements R11, R12.

In the level shift circuit of the first embodiment, a signal in1 with an amplitude Vp of approximately 3 volts is for instance input to the first circuit input terminal 73, and an input signal in2 which is an inversion of the input signal in1 is input to the second circuit input terminal 74.

Figure 8:
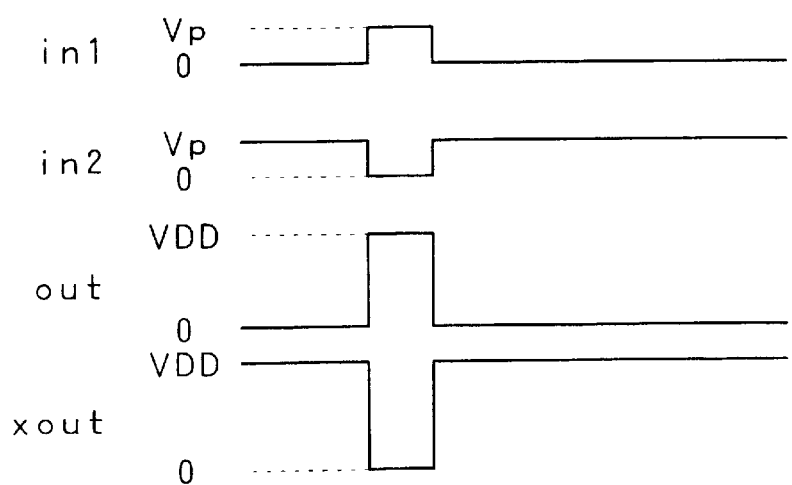
FIG. 8 is a timing chart for illustrating the circuit operation of the level shift circuit of the first embodiment of this invention.

Here for instance, the circuit operation is explained by referring to the timing in FIG. 8, when the logic of the input signal in2 is "0" (=2 volts), and the logic of the input signal in1 is "1" (=Vp), in order to turn the NMOS transistor Qn11 on in the CMOS latch cell 70, the current flows in a path from the power supply VDD, to the resistor element R14, to the node ②, to the NMOS transistor Qn11 to ground and in order to simultaneously turn the PMOS transistor Qp12 on, the current flows in a path from the power supply VDD to the PMOS transistor Qp12 to the node ①, to the resistor element R11, to the second circuit input terminal 73.

A voltage drop occurs at this time across the resistor elements R11, R14, and the voltage potential of the nodes ① and ② rises by an amount equal to this voltage drop. In other words, a DC shift is made in the voltage potential of the nodes ① and ②. Since the node ① has a larger shift than the node ②, a larger amplitude differential can be obtained from the nodes ① and ② than the amplitude differential of the input signals in1, in2.

A sharper operating point for the CMOS inverters 71, 72 can be determined by biasing the nodes ① and ② with the resistor elements R13, R14. The voltage potential of the node ② is inverted by the inverter 77 and output from the first circuit output terminal 75 as the VDD amplitude output signal out. The voltage potential of the node ① is inverted by the inverter 78 and output from the second circuit output terminal 76 as an inverted output signal of out, namely the inverted output signal xout.

In the above described circuit operation, the three volt input signals in1, in2 for the amplitude Vp for instance, are level shifted to the power supply VDD amplitude output signals out, xout. Also, when the input signal in1 logic is "0" and the input signal in2 logic is "0" then the level shift operation is performed in the complete reverse of the above described circuit operation.

In this way, the resistor elements R11, R12 connected between the two input sections of the CMOS cell latch 70 or in other words, between the signal sources of the CMOS inverters 71, 72 which are the two circuit input terminals 73, 74, are input by the input signals in1, in2, and these input signals in1, in2 cause a DC shift so that by means of the two input sections of the CMOS latch cell 70 being applied with an input, each of the transistors comprising the CMOS latch cell 70 can be turned on with a sufficiently large voltage and therefore stable level shift operation can be achieved at high speed, even if the circuit uses devices with a large threshold Vth such as TFT (thin film transistors).

Furthermore, a small surface area can be achieved just by adding resistor elements for the basic circuits of the CMOS latch cell 70 and low power consumption can be achieved since the level shift operation is reliably performed even if there is a drop in the power supply voltage VDD. Also, by connecting the resistor elements R13, R14 between the power supply VDD and the two input sections of the CMOS latch cell 70 and biasing the nodes ① and ②, the operation point of the CMOS inverters 71, 72 can be clearly determined so that stable level shift operation can be achieved.

Figure 9:
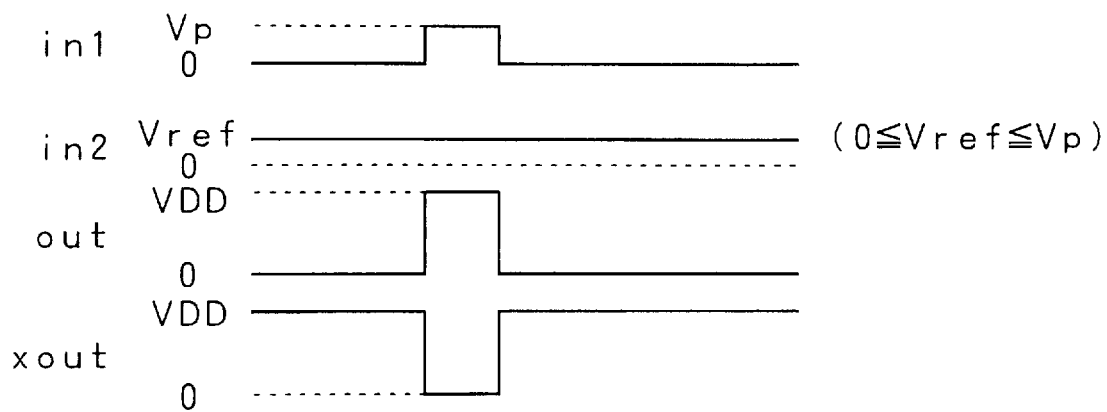
FIG. 9 is a timing chart when the DC voltage is the reference voltage.

In the level shift circuit of the first embodiment, an input signal in2 was input as an inversion of the input signal in1, however since determining the logic (level) of the input signal in1 is sufficient, an inverted signal need not always be used and for instance, an optional direct current voltage in a range from zero (0) volts to the power supply voltage VDD may be utilized as the reference voltage Vref for determining the logic of the input signal in1. FIG. 9 is a timing chart showing the case when a (DC) reference voltage Vref (0≦Vref≦VDD) is used as the input signal in2.

In the circuit of FIG. 7, described an example in which the two output signals out and xout were output as non-inverted and inverted output signals, however a configuration may be used where only one of either output signal is output. In such as case, one of the two inverters 77, 78 becomes unnecessary.

Figure 10:
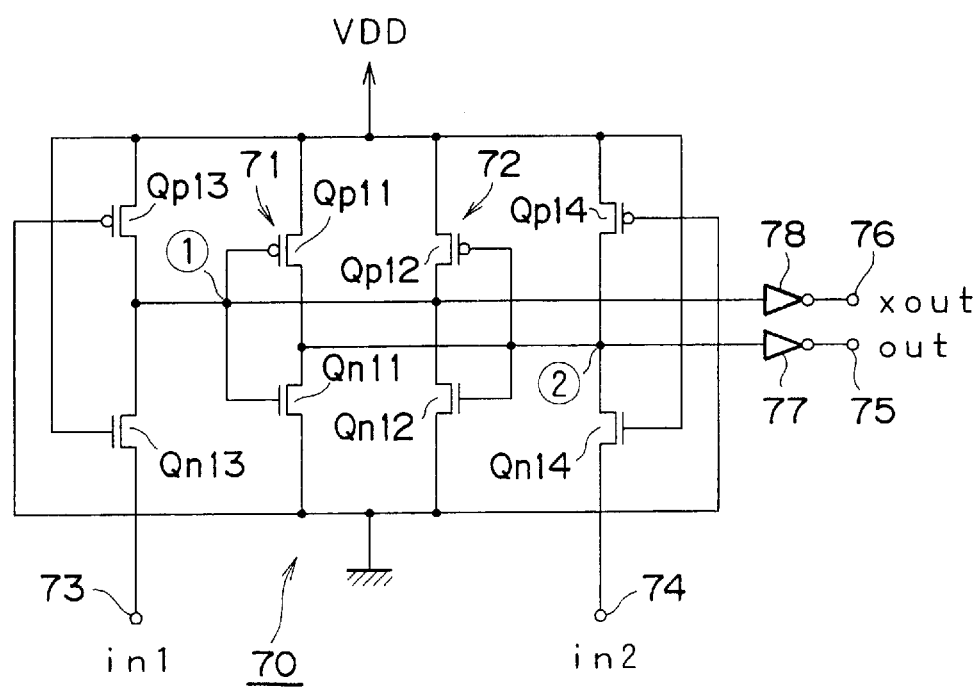
FIG. 10 is a circuit diagram showing an adaptation of the level shift circuit of the first embodiment.
Figure 10B:
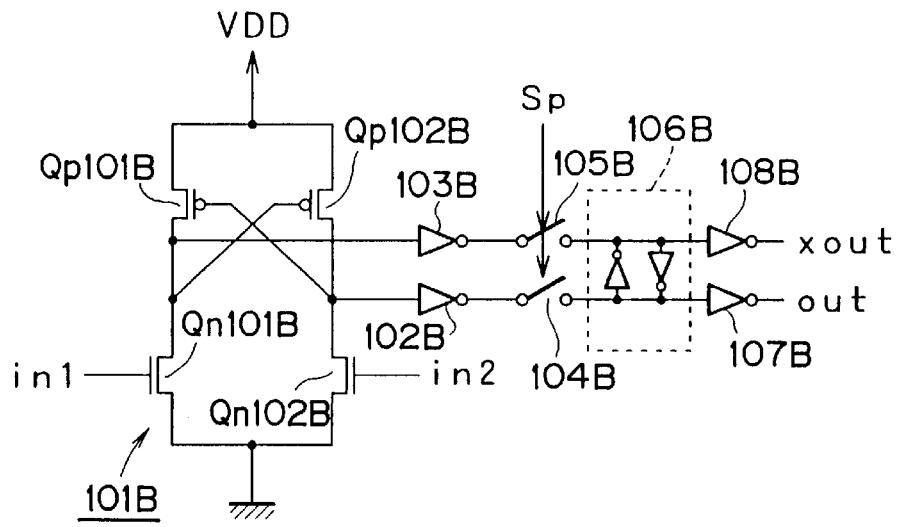
FIG. 10B is a circuit diagram showing the related art.
Figure 10C:
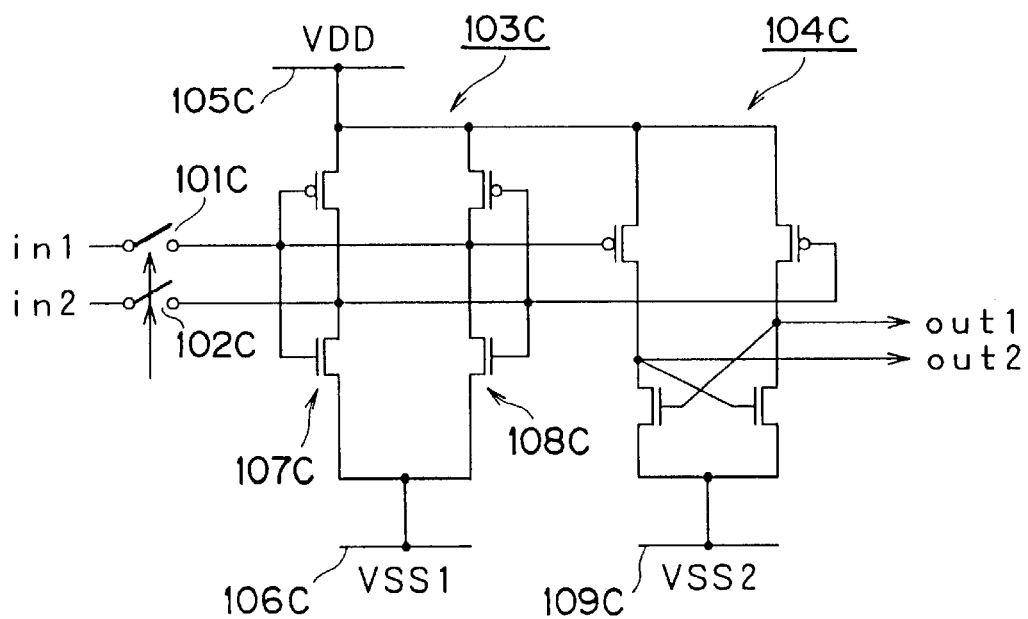
FIG. 10C is another circuit diagram showing the related art 1.

A circuit diagram showing an adaptation or variation of the level shift circuit of the first embodiment is shown in FIG. 10. In this figure, sections identical to equivalent sections in FIG. 7 have the same reference numerals. In this adaptation of the level shift circuit, the NMOS transistors Qn13, Qn14 with gates connecting to the power supply VDD are utilized as the resistor elements R11, R12, and the PMOS transistors Qp13, Qp14 with gates connecting to ground are utilized as the resistor elements R13, R14.

The circuit operation is therefore the same as the circuit of FIG. 7, even though the resistor elements R11 through R14 were achieved with transistors. The timing is the same as in FIG. 8 and FIG. 9. In this circuit adaptation, the resistor elements R11, R12 are NMOS while the resistor elements R13, R14 are PMOS, however either transistor polarity may be used as long as the transistor has a value equivalent to the respective resistor element.

Figure 11:
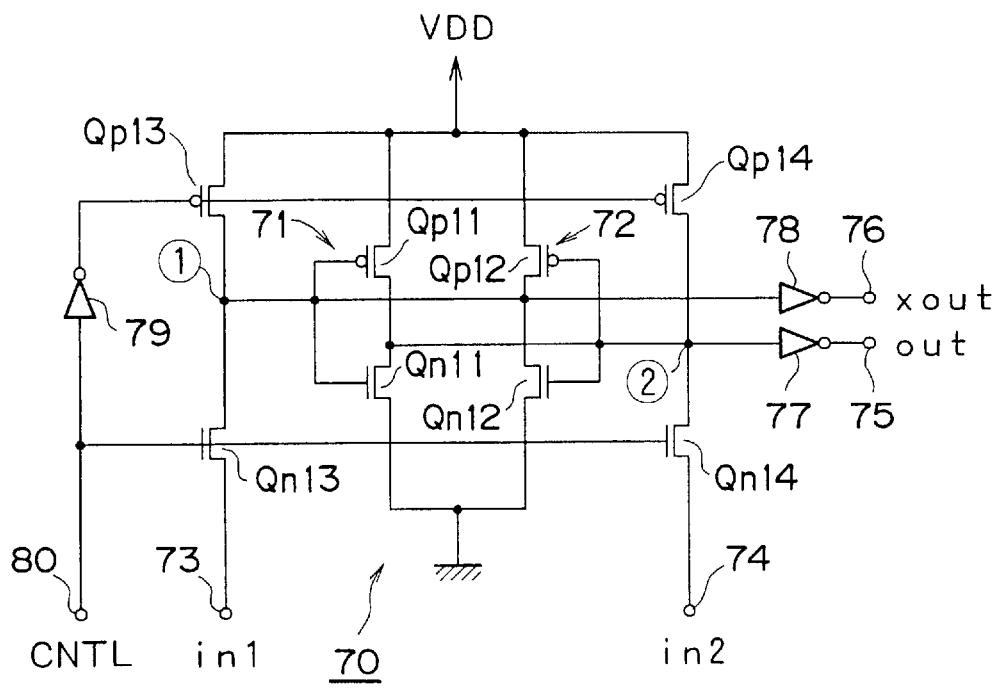
FIG. 11 is a circuit diagram showing another adaptation of the level shift circuit of the first embodiment.
Figure 11B:
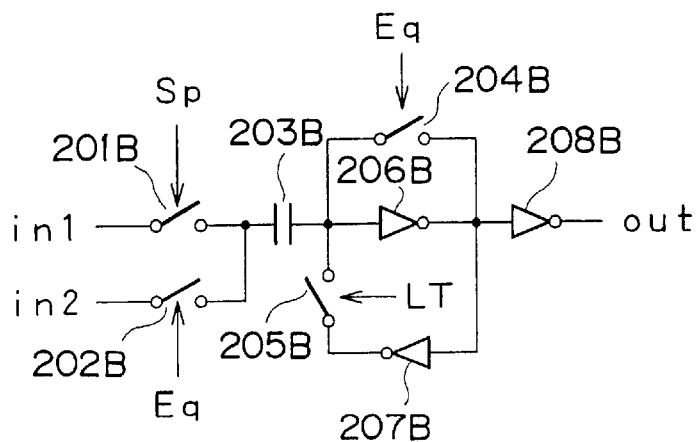
FIG. 11B is a circuit diagram showing another example of the related art.
Figure 11C:
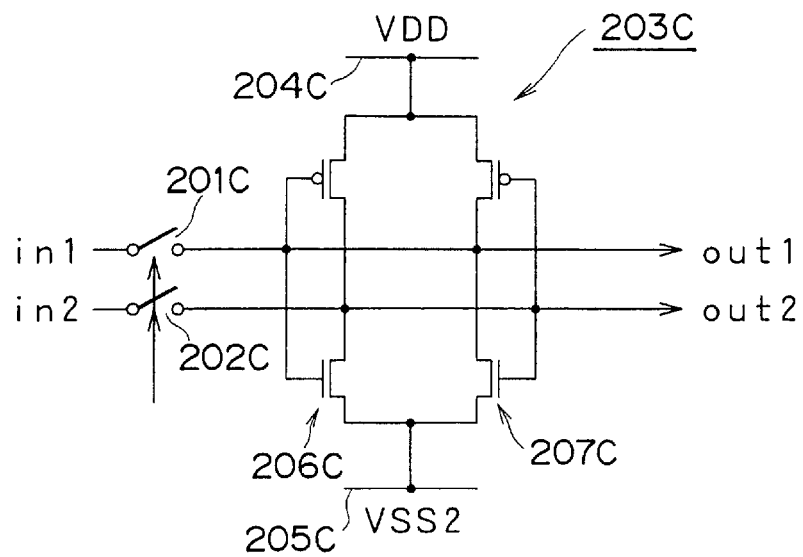
FIG. 11C is another circuit diagram showing the related art 2.

A circuit diagram showing another adaptation or variation of the level shift circuit of the first embodiment is shown in FIG. 11. In this figure, sections identical to equivalent sections in FIG. 10 have the same reference numerals. In the structure of this adaptation of the level shift circuit of FIG. 10, the NMOS transistors Q13, Q14 and the PMOS transistors Qp13, Qp14 are switched by means of a control signal CNTL. In other words, the active "H" control signal CNTL input to the control terminal 80 from a control circuit not shown in the drawing, is applied to the gates of the NMOS transistors Qn13, Qn14 and also applied to the gates of the PMOS transistors Qp13, Qp14 after inversion by the inverter 79.

In this way, a structure is obtained for switching the transistors Qn13, Qn14, Qp13, Qp14 in the CMOS latch cell 70 by means of the control signal CNTL and set to an active level only when a level shift is required in this level shift circuit, and the data held or in other words, the logic status of the input signals in1, in2 held when a level shift is not required, thereby achieving a combination latch and level shift circuit.

In this working example, when transistors are utilized as the resistor elements R11 through R14, these switches use a resistance value limited by the resistor elements R11 through R14 and this kind of switching control can achieve the same effect.

Figure 12:
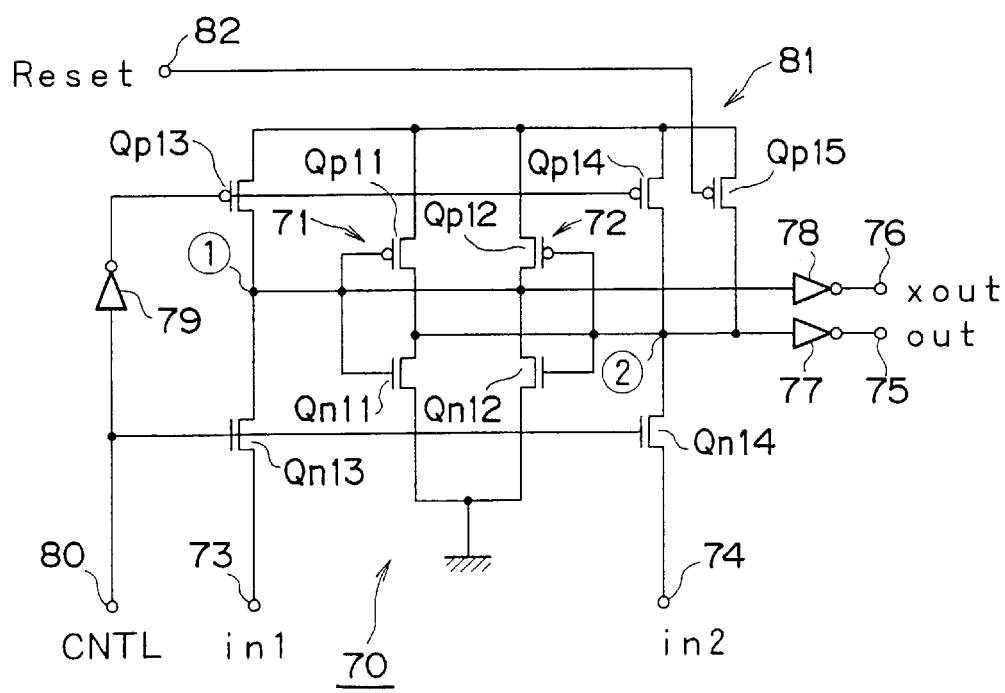
FIG. 12 is a circuit diagram showing yet another adaptation of the level shift circuit of the first embodiment.
Figure 12C:
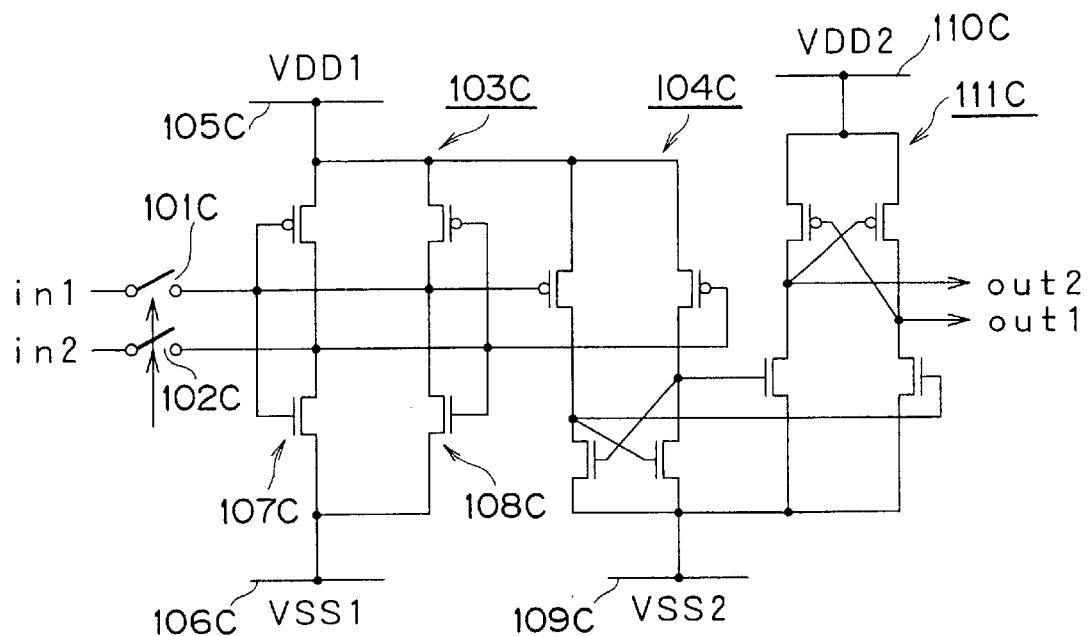
FIG. 12C is another circuit diagram showing the related art 3.

A circuit diagram showing yet another adaptation or variation of the level shift circuit of the first embodiment is shown in FIG. 12. In this figure, sections identical to equivalent sections in FIG. 11 have the same reference numerals. In the structure of this level shift circuit adaptation, a reset circuit 81 has been added for determining the initial value of the CMOS latch cell 70. This reset circuit 81 is comprised of a PMOS transistor Qp15 connected between the power supply voltage VDD and the node ② and the gate of this PMOS transistor Qp15 is connected to the reset terminal 82.

Figure 13:
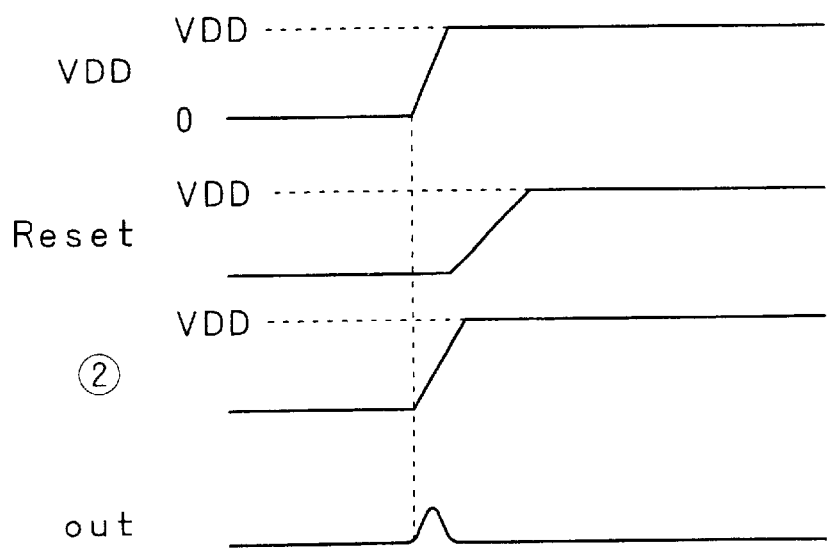
FIG. 13 is a timing chart for illustrating the circuit operation when a reset circuit has been added.
Figure 13A:
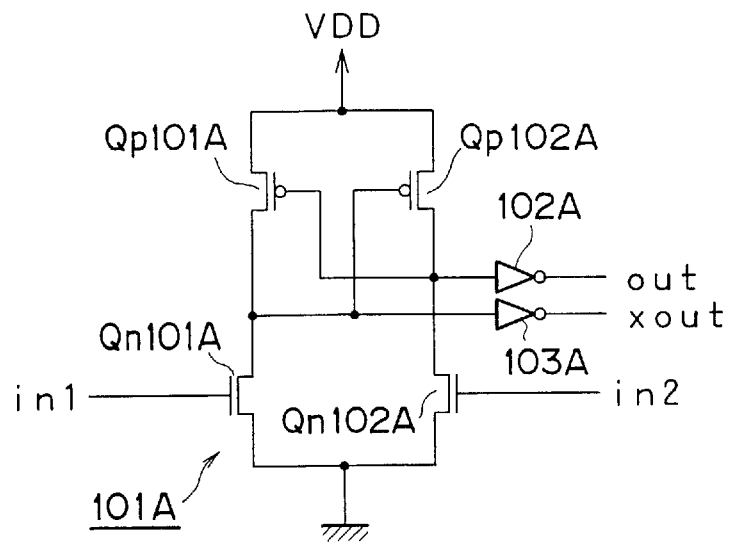
FIG. 13A is a circuit diagram of the related art 1.
Figure 13C:
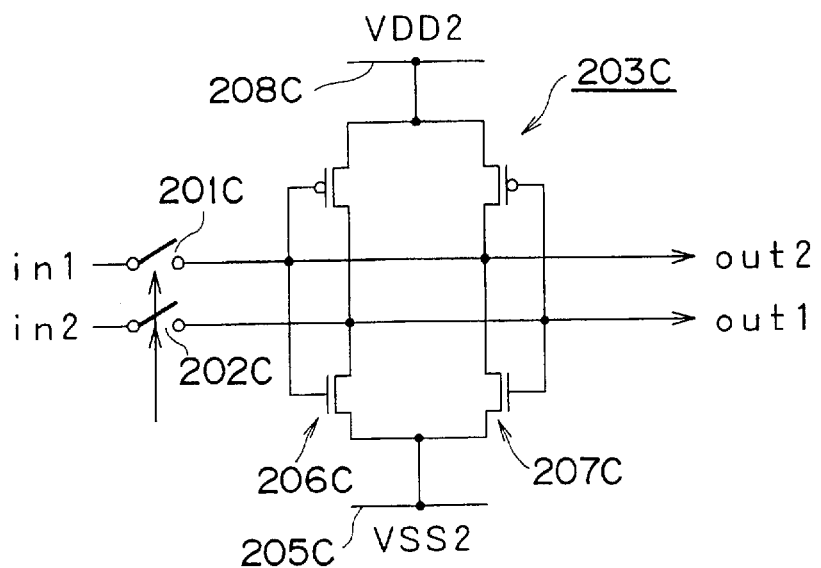
FIG. 13C is another circuit diagram showing the related art 4.
Figure 14:
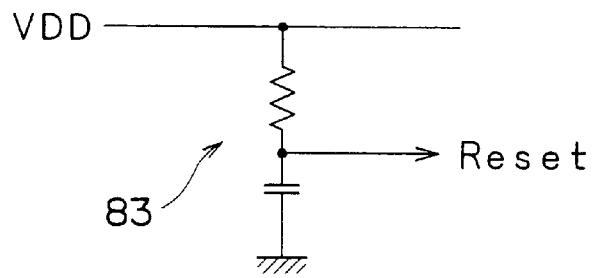
FIG. 14 is a circuit diagram for generating a reset signal.
Figure 14A:
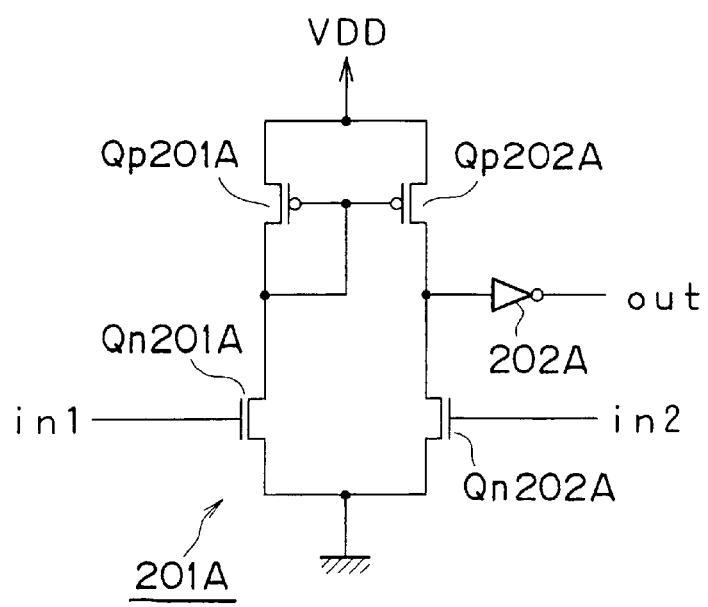
FIG. 14A is a circuit diagram of the related art 2.

This circuit is configured so that a reset signal Reset is applied to the reset terminal 82. Here, as shown by the timing chart in FIG. 13, a start up (leading edge) signal is utilized at a timing with a delay greater than the power supply voltage VDD. As shown for instance in FIG. 14, this reset signal Reset can be easily generated by integrating the power supply voltage VDD in the RC integration circuit.

By adding the reset circuit 81 of FIG. 12 in this way, a reset signal Reset can be applied for the reset circuit 81 at a start (pulse rise) timing with a greater delay than the power supply voltage VDD so that the initial values of the CMOS latch cell 70 can be determined during power supply start up. As clearly shown by the timing chart in FIG. 13 for this example, in this reset operation, the voltage potential of the node A sets to "H" level at initial status (reset) during power supply start up and the output signal "out" becomes "L" level.

Figure 15:
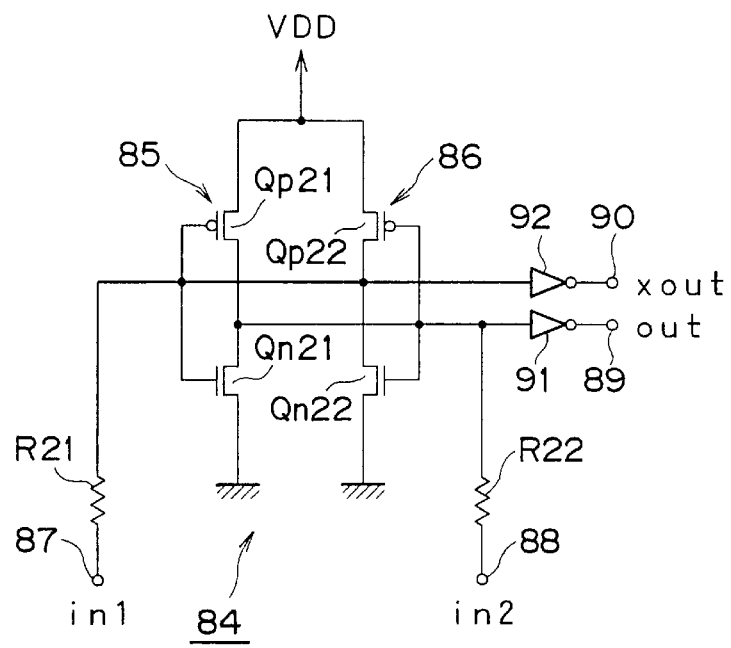
FIG. 15 is a circuit diagram showing the level shift circuit of the second embodiment of this invention.
Figure 15A:
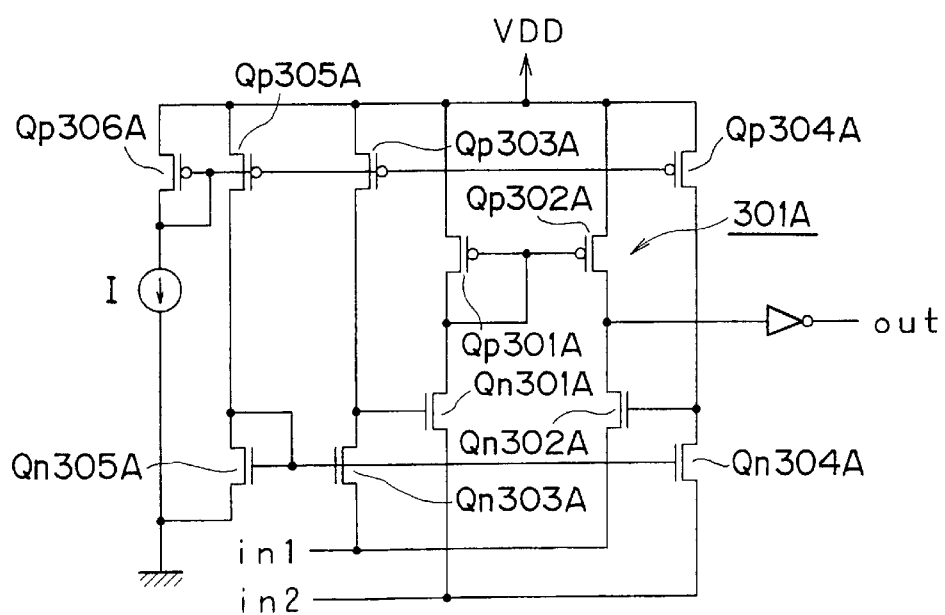
FIG. 15A is a circuit diagram of the related art 3.

A circuit diagram of the level shift circuit of the second embodiment is shown in FIG. 15. In the structure of this level shift circuit of the second embodiment, a CMOS latch cell 84 as the basic circuit contains a CMOS inverter 85 is comprised of an NMOS transistor Qn21 and a PMOS transistor Qp21 with gates and drains respectively connected in common and, a CMOS inverter 86 comprised of an NMOS transistor Qn22 and a PMOS transistor Qp22 with gates and drains respectively connected in common and the CMOS inverters 85 and 86 are connected in parallel between the power supply VDD and ground.

In this CMOS latch cell 84, the input (namely, the gate common contact point of the MOS transistors Qn21, Qp21) of the CMOS inverter 85 and the output (namely, the source common contact connection point of the MOS transistors Qn22, Qp22) of the CMOS inverter 86 are connected together. Further, the input of the CMOS inverter 86 (namely, the gate common contact connection point MOS transistors Qn22, Qp22) and the output of the CMOS inverter 85 (namely, the drain common contact point of the MOS transistors Qn21, Qp21) are connected together.

A resistor element R21 is connected between the first circuit input terminal 87 and the input of the CMOS inverter 85, and a resistor element R22 is connected between the second circuit input terminal 88 and the input of the CMOS inverter 86. An inverter 91 is connected between the first circuit output terminal 89 and the input of the CMOS inverter 86, and an inverter 92 is connected between the second circuit output terminal 90 and the input of the CMOS inverter 85.

In the above level shift circuit of the second embodiment, an input signal in1 with an amplitude Vp of approximately 3 volts is for instance input to a first circuit input terminal 87, and an input signal in2 which is an inversion of the input signal in1 is input to a second circuit input terminal 88.

Here for instance, when the logic of the input signal in2 is "0", and the logic of the input signal in1 is "1", in order to turn the NMOS transistor Qn21 on in the CMOS latch cell 84, the current flows in a path from the power supply VDD, to the PMOS transistor Qp21, NMOS transistor Qn21 and to ground.

And, in order to simultaneously turn the PMOS transistor Qp22 on, the current flows in a path from the power supply VDD to the PMOS transistor Qp22, to the resistor element R21, to the second circuit input terminal 87.

A voltage drop occurs at this time at the resistor element R21 and the voltage potential at the input of the CMOS inverter 85 rises by an amount equal to this voltage drop. In other words, the voltage potential at the input of the CMOS inverter 85 causes a large DC shift. The voltage potential at the input of the CMOS inverter 86 on the other hand, has virtually no DC shift since the current flow from the PMOS transistor Qp21 is small.

This implementation allows a larger amplitude differential to be obtained at the inputs of the CMOS inverters 85, 86 than the amplitude differential of the input signals in1, in2. The voltage potential of the input of the CMOS inverter 86 is inverted by the inverter 91 and output from the first output terminal 89 as the VDD amplitude output signal out. The voltage potential of the input of the CMOS inverter 85 is inverted by the inverter 92 and output from the second circuit output terminal 90 and the output signal out is output as the inverted signal xout.

In the above related circuit operation, an amplitude Vp with input signals in1, in2 of for instance 3 volts is level shifted to the power supply voltage VDD amplitude output signals out, xout and output, just the same as the circuit operation of the level shifter circuit of the first embodiment. Also, when the input signal in1 logic is "0" and the input signal in2 logic is "0", then the level shift operation is performed in the complete reverse of the above described circuit operation.

In the case of the level shift circuit of the second embodiment, an optional direct current reference voltage within a range from 0 volts to power supply voltage VDD may be used instead of the input signal in2, as the reference voltage Vref. Also, either output signal may be used from among the two non-inverted and inverted output signals out and xout.

Figure 16:
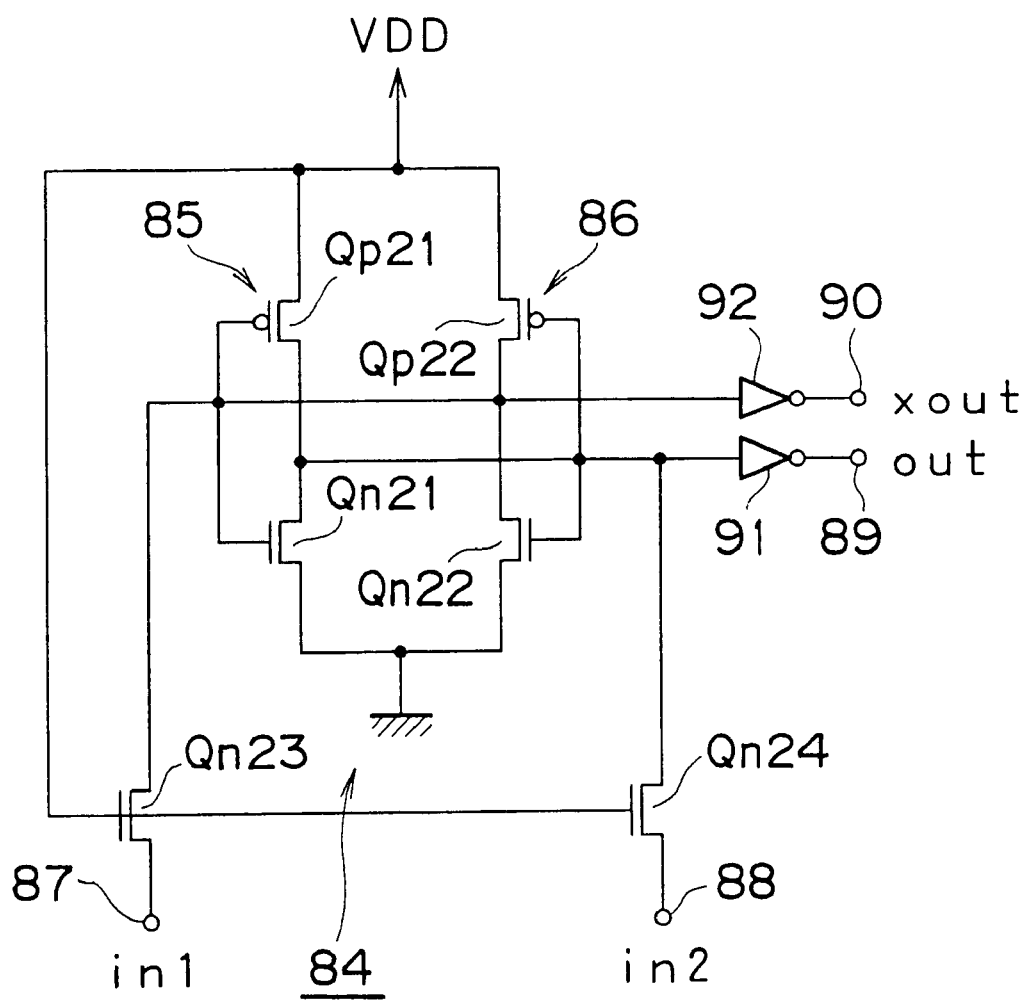
FIG. 16 is a circuit diagram showing an adaptation of the level shift circuit of the second embodiment of this invention.

A circuit diagram showing an adaptation or variation of the level shift circuit of the second embodiment is shown in FIG. 16. In this figure, sections identical to equivalent sections in FIG. 15 have the same reference numerals. In this adaptation of the level shift circuit, the NMOS transistors Qn23, Qn24 with gates connecting to the power supply VDD are utilized as the resistor elements R21, R22 of FIG. 15. In this way, the circuit operation is the same as in FIG. 15, even when transistors are utilized as the resistor elements R21, R22. Further, the same variations (or adaptations) as in FIG. 11 and FIG. 12 are also possible with the circuit of FIG. 16.

Figure 17:
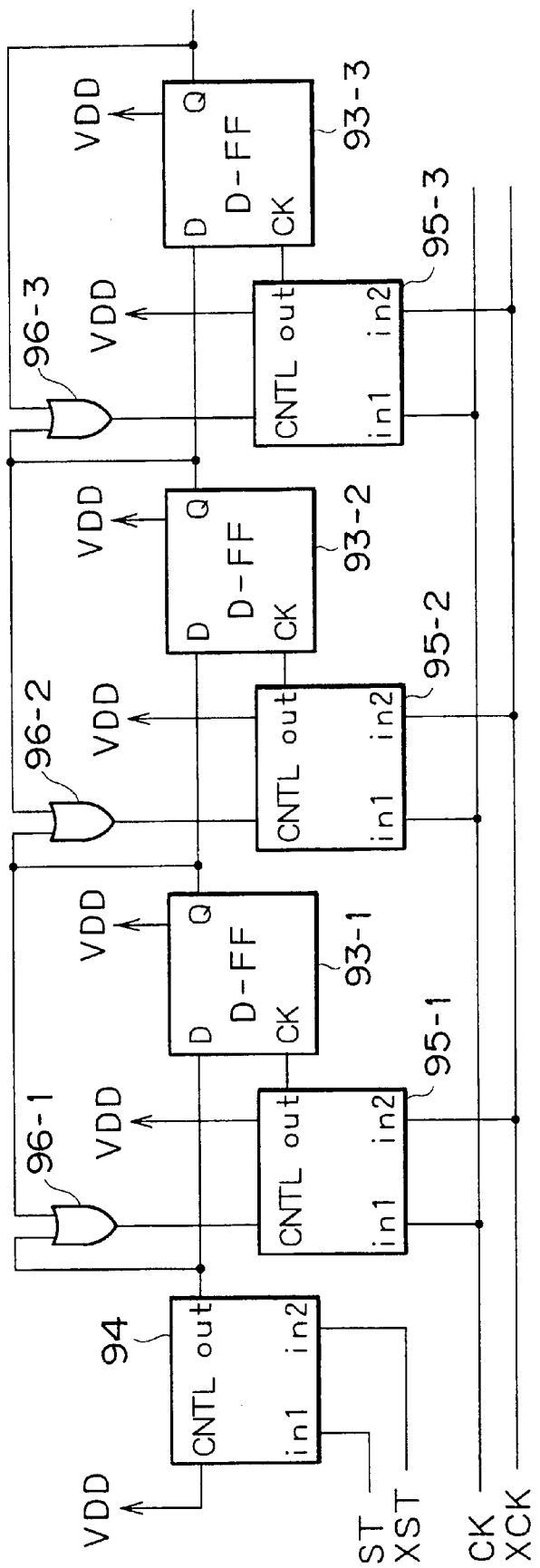
FIG. 17 is a block diagram showing a typical structure of the horizontal shift register.

The detailed structure of the horizontal shift registers 121, 122 are next explained. FIG. 17 is a block diagram showing the structure of the horizontal shift registers 121, 131.

Here, for the sake of simplicity, a three stage shift register is used as an example of the transfer stages. In other words, three D-Ff (flip-f lops) 93-1, 93-2, 93-3 are connected in slaved sequence. Also, a level shift circuit 94 is installed at the D (data) input side of the first stage D-FF93-1. The level shift circuits 95-1, 95-2, 95-3 are respectively installed on the input side of each clock CK for the flip-flop stages D-FF93-1, 93-2, 93-3.

The level shift circuit 94 level shifts the mutually reversed phase start signals ST, XST of amplitudes of for example three volts, to a power supply voltage VDD amplitude signal. The level shift circuits 95-1, 95-2, 95-3 function to level shift the mutually reversed clock start signals CK, XCK of amplitudes of, for example three volts, to a power supply voltage VDD amplitude signal and applies this level shift as a clock input to each stage of D-FF93-1, 93-2, 93-3.

The structure of the horizontal shift registers 121, 131 utilizes the level shift circuits 94, 95-1, 95-2, 95-3 as the level shift circuit comprised as shown for example in FIG. 11. In this level circuit 94, the start signals ST, XST are input as the input signals in1, in2, and the power supply voltage VDD are input as the control signal CNTL. In other words, by using the power supply voltage VDD as the control signal CNTL, only the level shifter will function since the applicable circuits is always set to active status.

In the level shift circuits 95-1, 95-2, 95-3 on the other hand, the clock signals CK, XCK are input as the input signals in1, in2, and each output of the logic OR gates 96-1, 96-2, 96-3 which input a shift pulse from their own stage (Q output) and a shift pulse of the previous stage (D input of own stage) is output as the control signal CNTL. In other words, the level shift circuits 95-1, 95-2, 95-3 only perform shift operation for their own stages of D-FF93-1, 93-2, 93-3. Restated, a level shift is performed only when transfer of low voltage amplitude clock signals CK, XCK is necessary and at all other times the clock signals CK, XCK are latched and function to prevent transfer.

Thus, in the horizontal shift registers 121, 131, by utilizing the level shift circuits 94, 95-1, 95-2, 95-3 as the level shift circuit with the structure shown in FIG. 11, the applicable level shift circuit can perform fast, reliable level shift operation of the low voltage amplitude start signals ST, XST and the clock signals CK, XCK. Therefore stable and high speed transfer operation can be achieved even when the D-FF93-1, 93-2, 93-3 in the structure are comprised by devices with a large threshold value Vth such as thin film transistors (TFT).

In this example, the level shift circuits 94, 95-1, 952, 95-3 were utilized as the level shift circuit with the structure shown in FIG. 11, however this invention is not limited to this configuration and may for instance also utilize the level shift circuits configured as shown in FIG. 7, FIG. 10, FIG. 12, and FIG. 15 or FIG. 16 while still obtaining the same effects as above.

Therefore, as described above, the drive circuit-integrated liquid crystal display device can implement the shift register of the above described configuration, with the horizontal shift registers 121, 131 or in other words, have a small surface area. Further, by utilizing low power consumption shift registers, a drive circuit such as a vertical drive system 14 or a horizontal drive system 12 containing horizontal shift registers 121, 131 can not only achieve a narrow periphery area (picture frame) for the effective pixel area 11 for placing the applicable drive circuit, but also achieve a drive circuit-integrated liquid crystal display device having low power consumption.

Also as clearly related before, the above shift register has the advantage that stable, high speed transfer operation can be achieved even when the circuit utilizes devices with a large threshold value Vth such as thin film transistors. The circuit of this shift register is also widely applicable to devices other than liquid crystal displays.

A description of the detailed structure of the sampling latch circuit using the sampling & latch circuit 122, 132 of the first and second horizontal drive system is next related.

A circuit diagram showing the sampling latch circuit of the first embodiment is shown in FIG. 18. In the structure of this sampling latch circuit of the first embodiment a CMOS latch cell 100 as the basic circuit with a comparator structure comprises a CMOS inverter 101 having an NMOS transistor Qn31 and a PMOS transistor Qp31 with gates and drains respectively connected in common and, a CMOS inverter 102 comprising an NMOS transistor Qn32 and a PMOS transistor Qp32 with gates and drains respectively connected in common and the CMOS inverters 85 and 86 are connected in parallel between the power supply VDD 107 and ground.

In this CMOS latch cell 100, the input (namely, the gate common contact point of the MOS transistors Qn31, Qp31) of the CMOS inverter 101 and the output (namely, the source common contact connection point of the MOS transistors Qn32, Qp32) of the CMOS inverter 102 are connected. Further, the input of the CMOS inverter 102 (namely, the gate common contact connection point MOS transistors Qn32, Qp32) and the output of the CMOS inverter 101 (namely, the drain common contact point of the MOS transistors Qn31, Qp31) are connected.

A switch 105 is connected between the first circuit input terminal 103 and the input of the CMOS inverter 101, and a switch 106 is connected between the second circuit input terminal 104 and the input of the CMOS inverter 102. A switch 108 is also connected on the power supply side of the CMOS latch cell 100 or in other words, between the power supply line VDD 107 and the node A.

The switches 105, 106 are directly controlled (switched) by the sampling pulse SP input from the sampling terminal 109, and the switch 108 is directly controlled (switched) by the inverted pulse of the sampling pulse SP that passed through an inverter 102. An inverter 113 is respectively connected between the first circuit output terminal 111 and the node ② which is the input for the CMOS inverter 102, and an inverter 114 is respectively connected between the second circuit output terminal 112 and the node ① which is the input for the CMOS inverter 101.

In the above described sampling switch circuit of the first embodiment, an input signal in1 with an amplitude Vp of approximately 3 volts is for instance, input to a first circuit input terminal 103, and an input signal in2 which is an optional direct current voltage (reference voltage Vref) within a voltage range of 0 volts or more or Vp or below, is input to a second circuit input terminal 104.

As shown in the circuit operation illustrated by the timing chart of FIG. 19, when an active "H" sampling pulse SP is input from the sampling terminal 109, the switches 105, 106 turn on (close) and the input signals in1, in2 are thus conveyed to nodes ① and ② of the CMOS latch cell 100. At the same time, an inverted pulse of the sampling pulse SP turns the switch 108 off (open) so that the power supply side (node A) is isolated from the power supply line 107.

Next, when the sampling pulse SP is no longer present, the nodes ① and ② of the CMOS latch cell 100 are sectioned into the second circuit input terminals 103, 104 and the power supply side of the CMOS latch cell 100 is simultaneously connected to the power supply line 107. Comparator processing of the voltages of nodes ① and ② is compared at this instant in the CMOS latch cell 100 and the latch operation also starts. Ultimately, node 1 is latched at a power supply voltage VDD or 0 (zero) volts according to the polarity of the input signal in1 in the instant that the sampling pulse SP is no longer present. The node ② is latched at a voltage of reverse polarity at this time.

In the above described circuit operation, data for an input signal in1 with an amplitude Vp of approximately 3 volts is synchronized with the sampling pulse SP and sampled, and data for the power supply voltage VDD amplitude is latched in node ①. Then the latched data of node ② is inverted in the inverter 113 and output from the first circuit output terminal 111 as the output signal out. The data latched in the node ① is inverted by the inverter 114 and output from the second circuit output terminal 112 as an inverted signal xout, of the output signal out.

As related above, in a CMOS latch cell 100 as the basic circuit with a comparator structure, along with the switches 105, 105 for respectively connecting between the two input sections (nodes ①, ②) of the CMOS latch cell 100, and the two input signal sources (first, section circuit input terminals 103, 104), a switch 108 connects between the power supply line 107 and the power supply side (node A) of the CMOS latch cell 100, and by complementary switching of the switches 105, 106 and the switch 108, current does not flow in the CMOS latch cell 100 in the sampling period for the input signals in1, in2 that were input by the switches 105, 106. Accordingly, the direct current flowing during operation is extremely small so that the power consumption in this sampling switch circuit can be reduced.

The sampling period ends, and data for an input signal in1 with an amplitude Vp of approximately 3 volts is latched as the data amplitude at the power supply voltage VDD, in the instant that the power supply voltage VDD is supplied to the CMOS latch cell 100 by way of the switch 108, so that stable sampling & latch operation can be achieved even when the circuit structure utilizes devices with a large threshold value Vth such as thin film transistors (TFT). Furthermore, a sampling latch circuit having a level shift function and a small surface area on account of an extremely small number of devices can be achieved by the addition of the switches 105, 106, 108 to the basic structure of the CMOS latch cell 100.

Figure 20:
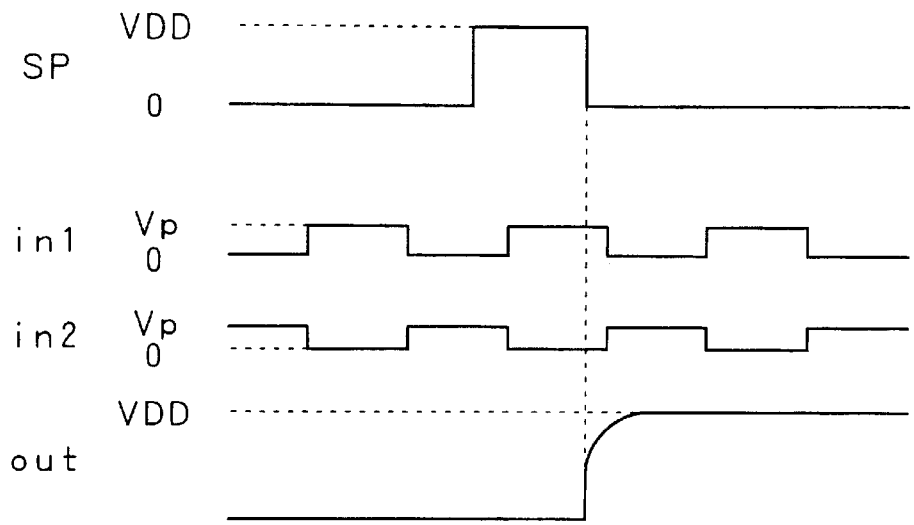
FIG. 20 is a timing chart when an inverted signal of the input signal in1 is set as the input signal in2.

In the sampling latch circuit of this embodiment, a (DC) reference voltage Vref ($0 \leq Vref \leq VDD$) is used as the input signal in2 however, since determining the logic (level) of the input signal in1 is sufficient, direct current voltage is not always necessary. As shown in the timing chart in FIG. 20, an inverted signal of the input signal in1 may also be utilized as the reference signal for determining that logic level. In such a case, determining the logic level of the input signal in1 has the advantage that a larger margin can be obtained than the case when a direct current reference voltage in the range of $0 \leq Vref \leq VDD$ is used as the reference voltage.

Two outputs comprising a non-inverted and an inverted output signals out, xout were supplied by the circuit in FIG. 18 however a configuration using either or just one of these output signals may be used. In such a case, one of the two inverters 113, 114 is unnecessary.

Figure 21:
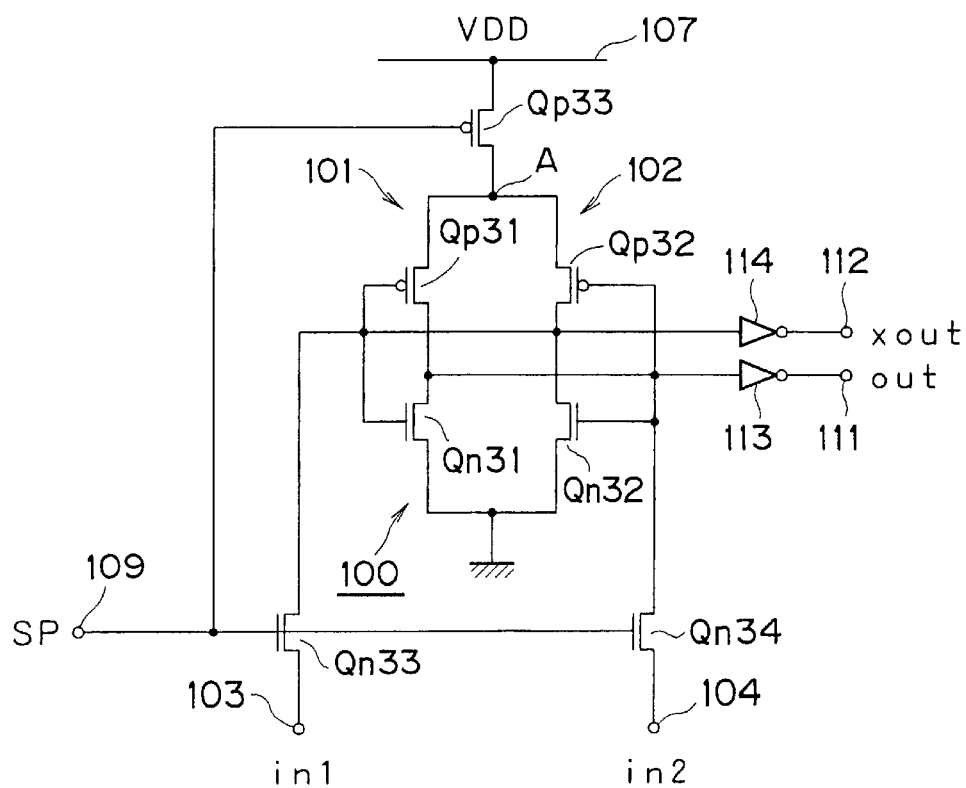
FIG. 21 is a circuit diagram showing an adaptation of the sampling hold circuit of the first embodiment of this invention.

A circuit diagram showing an adaptation or variation of the level shift circuit of the first embodiment is shown in FIG. 21. Sections of the drawing identical to FIG. 18 have the same reference numerals. In this variation of the level shift circuit, along with using the NMOS transistors Qn33, Qn34 as the switches 105, 106 on the signal input side in FIG. 18, the PMOS transistors Qp33 is utilized as the power supply side switch 108, and a sampling pulse SP is directly applied to the gates of these transistors.

The circuit operation is therefore the same as the circuit of FIG. 18 even when transistors are utilized as the switches 105, 106, 108. The timing is the same as in FIG. 19 and FIG. 20. This variation was achieved by using NMOS transistors as the switches 105, 106 and a PMOS transistor as the switch 108 however, this polarity can obviously be reversed when the active state of the sampling pulse SP is "L".

FIG. 22 is a circuit diagram showing the a sampling latch circuit of the second embodiment. The sampling latch circuit of the second embodiment has a CMOS latch cell as the basic structure with a comparator configuration and comprises a CMOS inverter 151 made from an NMOS transistor Qn41 and a PMOS transistor Qp41 with their respective gates and drains connected in common, and a CMOS inverter 152 made from an NMOS transistor Qn42 and a PMOS transistor Qp42 with their respective gates and drains connected in common, and commonly connected in parallel between the power supply line 157 and ground.

In this CMOS latch cell 150, the input (namely, the gate common contact point of the MOS transistors Qn41, Qp41) of the CMOS inverter 151 and the output (namely, the source common contact connection point of the MOS transistors Qn42, Qp42) of the CMOS inverter 152 are connected. Further, the input of the CMOS inverter 152 (namely, the gate common contact connection point MOS transistors Qn42, Qp42) and the output of the CMOS inverter 151 (namely, the drain common contact point of the MOS transistors Qn41, Qp41) are connected.

A switch 155 is connected between the first circuit input terminal 153 and the input of the CMOS inverter 151, and a switch 156 is connected between the second circuit input terminal 154 and the input of the CMOS inverter 152. A switch 158 is also connected on the power supply side of the CMOS latch cell 150 or in other words, between the power supply line VDD 107 and the node A. Also, the switches 155, 156 are directly controlled (switched) by the sampling pulse SP input from the sampling terminal 159, and the switch 158 is directly controlled (switched) by the inverted pulse of the sampling pulse SP that passed through an inverter 160.

An inverter 163 is respectively connected between the first circuit output terminal 161 and the node ② which is the input for the CMOS inverter 152, and an inverter 164 is respectively connected between the second circuit output terminal 162 and the node ① which is the input for the CMOS inverter 151. The inverter 163 has a CMOS inverter structure comprising a PMOS and an NMOS transistor Qp43, Qn43 with common gate and drain connections and also connected between node A and ground. The inverter 164 has a CMOS inverter structure just the same as the inverter 154, comprising a PMOS and an NMOS transistor Qp44, Qn44 with each of the gates and drains are respectively connected in common and this inverter also connected between the node A and ground.

In the above described sampling switch circuit of the second embodiment, an input signal in1 with an amplitude Vp of approximately 3 volts is for instance, input to a first circuit input terminal 153, and an input signal in2 which is an optional direct current voltage (reference voltage Vref) within a voltage range of 0 volts or more, or Vp or below, is input to a second circuit input terminal 154. The operation of the sampling latch circuit of the second embodiment is basically the same as the sampling latch circuit of the first embodiment.

In other words, when an active "H" sampling pulse SP is input from the sampling terminal 159, the switches 155, 156 turn on (close) and the input signals in1, in2 are thus conveyed to nodes ① and ② of the CMOS latch cell 150. At the same time, an inverted pulse of the sampling pulse SP turns the switch 158 off (open) so that the power supply side (node A) of the CMOS latch cell 150 is isolated from the power supply line 157.

Next, when the sampling pulse SP is no longer present, the nodes ① and ② of the CMOS latch cell 150 are sectioned into the second circuit input terminals 153, 154 and the power supply side of the CMOS latch cell 150 is simultaneously connected to the power supply line 157. Comparator processing of the voltages of nodes ① and ② is compared at this instant in the CMOS latch cell 150 and the latch operation also starts. Ultimately, node 1 is latched at a power supply voltage VDD or 0 (zero) volts according to the polarity of the input signal in1 in the instant that the sampling pulse SP is no longer present. The node ② is latched at a voltage of reverse polarity at this time.

In the above described circuit operation, data for an input signal in1 with an amplitude Vp of approximately 3 volts is synchronized with the sampling pulse SP and sampled, and data for the power supply voltage VDD amplitude is latched in node ①. Then, the latched data of node ② is inverted in the inverter 163 and output from the first circuit output terminal 161 as the output signal out. The data latched in the node ① is inverted by the inverter 164 and output from the second circuit output terminal 162 as an inverted signal xout, of the output signal out.

In the sampling latch circuit of this second embodiment, in addition to the effect obtained from the previously related sampling latch circuit of the first embodiment, just as with the CMOS latch cell 150, by controlling the switching of power supplied to the CMOS inverters 163, 164, the flow of unnecessary current is eliminated in the CMOS inverters 163, 164 so that a further reduction in the power consumption of this sampling switch circuit can be achieved.

In the case of the sampling latch circuit of this second embodiment, just as with the variation of the first embodiment shown in FIG. 21, the switches 155, 156, 158 can be achieved by transistors. Further, by using an inverted signal of the input signal in1, as the input signal in2, one of the two non-inverted or inverted output signals out, xout can be utilized.

Therefore, as described above, the drive circuit-integrated liquid crystal display device can implement the sampling latch circuit of the above first and second embodiments, with the sampling & first latch circuits 122, 132 of the first and second horizontal drive system 12, 13. In other words, a small surface area can be achieved and further, by utilizing low power consumption sampling latch circuits, a drive circuit such as a vertical drive system 14 or a first or second horizontal drive system 12, 13, the applicable sampling latch circuits cannot only achieve a narrow periphery area (picture frame) for the effective pixel area 11 for placing the applicable drive circuit when fabricating onto the same substrate with the effective pixel area 1, but also achieve a drive circuit-integrated liquid crystal display device having low power consumption.

Also as clearly related previously, the sampling & latch circuits with the above configuration have the advantage that stable, high speed sampling & latch operation can be achieved even when the circuit utilizes devices with a large threshold value Vth such as thin film transistors.

Figure 23:
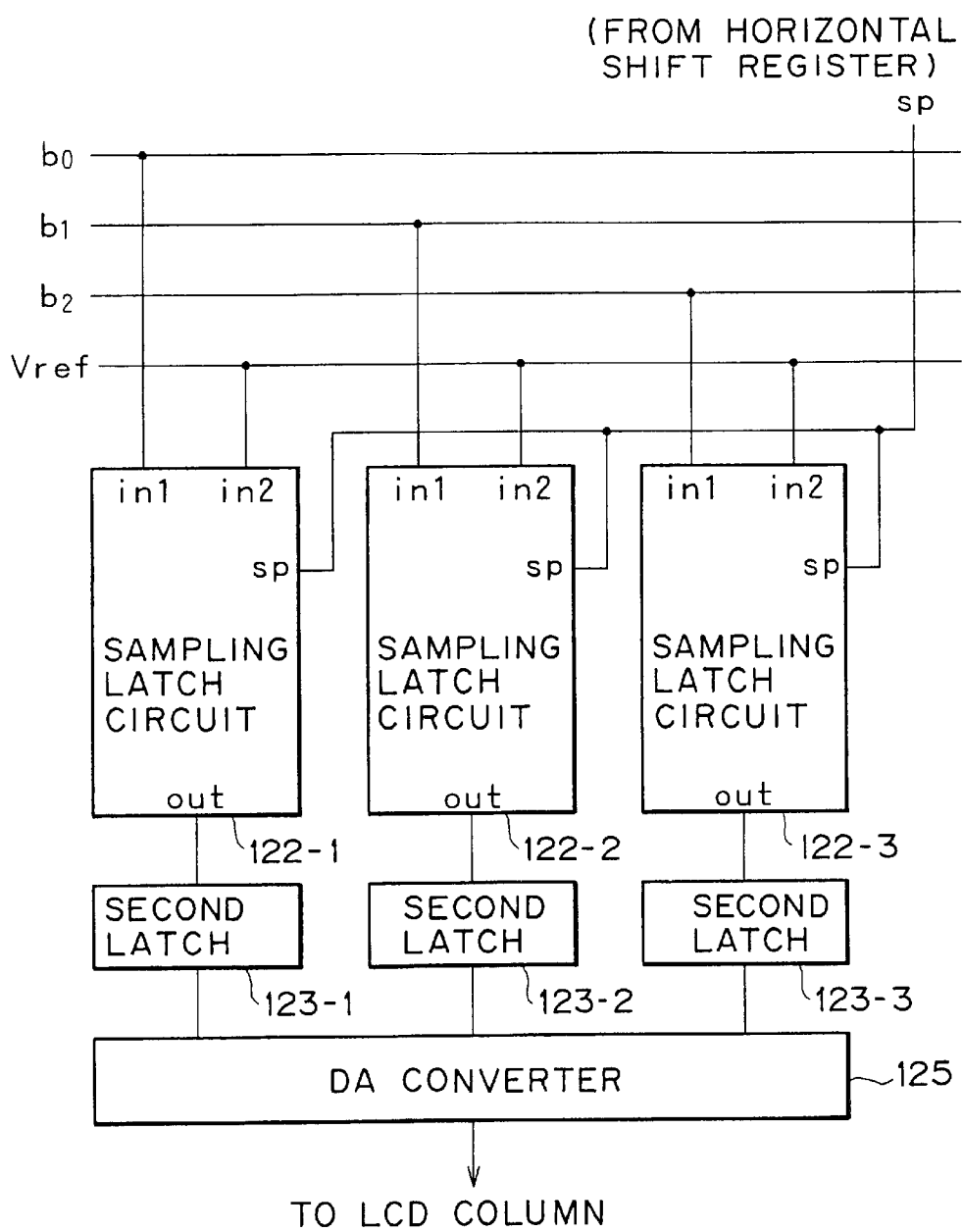
FIG. 23 is a block diagram showing the detailed structure when sampling hold circuit is utilized as the sampling & first latch circuit in the embodiments.

FIG. 23 is a block diagram showing the detailed structure of the sampling & first latch circuit comprising the above sampling and latch circuits. This figure shows the case when, for example, 3 bit digital data b0, b1, b2 is input. This example shows a sampling & first latch circuit 122 on the first horizontal drive system 12 side and the structure is exactly the same for the sampling & first latch circuit 132.

As clearly shown in FIG. 23, the sampling latch circuits 122-1, 122-2, 122-3 are installed for each digital data b0, b1, b2. The digital bit data b0, b1, b2 is input as the input signal in1 in these sampling switches 122-1, 122-2, 122-3, and a reference voltage (direct current voltage) Vref is input in common to each circuit as the input signal in2. Sampling of the low voltage amplitude data signals b0, b1, b2 is then performed according to the sampling pulse SP output from the horizontal register.

The sampled signals of these sampling latch circuits 122-1, 122-2, 122-3 are level-shifted to the high voltage amplitude required in TFT circuits and latched. This high voltage amplitude latched signal is then processed according to the line number sequence by the next stage, second latch circuits 123-1, 123-2, 123-3 installed for each digital data bit, just the same as with the sampling latch circuits 122-1, 122-2, 122-3, and after passing through level shift circuit 124 not shown in the drawing (see FIG. 1), are passed through the DA converter 125 and are output to the column (line) corresponding to the effective pixel area 11.

These sampling latch circuits 122-1, 122-2, 122-3 must be stored within an extremely small space. The length in a horizontal direction allotted to one sampling latch unit is a dot pitch/bit ratio and is an extremely small space in the drive circuit-integrated liquid crystal display device shown in FIG. 1. Therefore, the sampling latch circuits 122-1, 122-2, 1223 which can satisfy this condition are extremely effective as a sampling latch circuit of this embodiment that can be achieved within a small surface area.

In the circuit example of FIG. 23, a reference voltage (direct current voltage) Vref was input to each circuit as the input signal in2, however as was also explained for the sampling latch circuit of the first embodiment, an inverted signals xbo, xb1, xb2 for the data signals b0, b1, b2 can also be input for the sampling latch circuits 122-1, 122-2, 122-3 as shown in FIG. 24.

Figure 25:
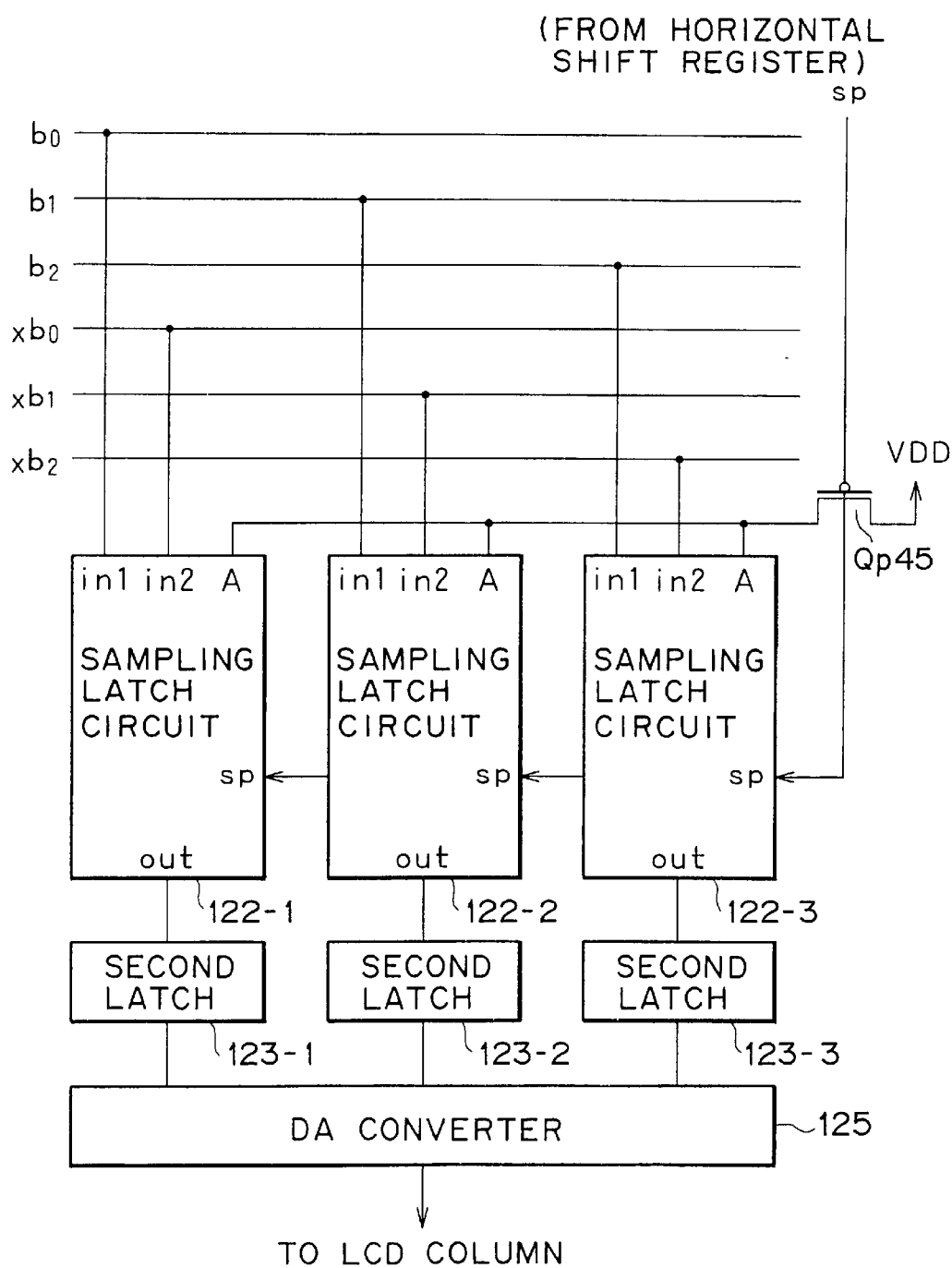
FIG. 25 is a block diagram showing an adaptation of FIG. 24.

FIG. 25 is a block diagram showing an adaptation of FIG. 24. In this figure, parts equivalent to FIG. 24 have the same reference numerals. In this adaptation, the switch (Equivalent to switch 108 of FIG. 18, switch 158 of FIG. 22) on the power supply side of each sampling latch circuit 122-1, 122-2, 122-3 are used in common by the circuits 122-1, 122-2, 122-3 and this switches is achieved for instance by a PMOS Qp45.

In this circuit configuration, in the case of digital data of for instance 3 bits, two switches on the power supply side can be eliminated so that an even smaller circuit surface area can be achieved. Also, just the same as the circuit in FIG. 23, a reference voltage (direct current voltage) Vref can be input in common to each of the sampling latch circuits 122-1, 122-2, 122-3 as the input signal in2, instead of using the inverted signals xbo, xb1, xb2. As mentioned previously, the sampling latch circuit can be applied to devices other than liquid crystal displays.

Next, a detailed description is given of the structure of the latch circuits utilized as the second latch circuits 123, 133 of the first and second horizontal drive system 12, 13.

Figure 26:
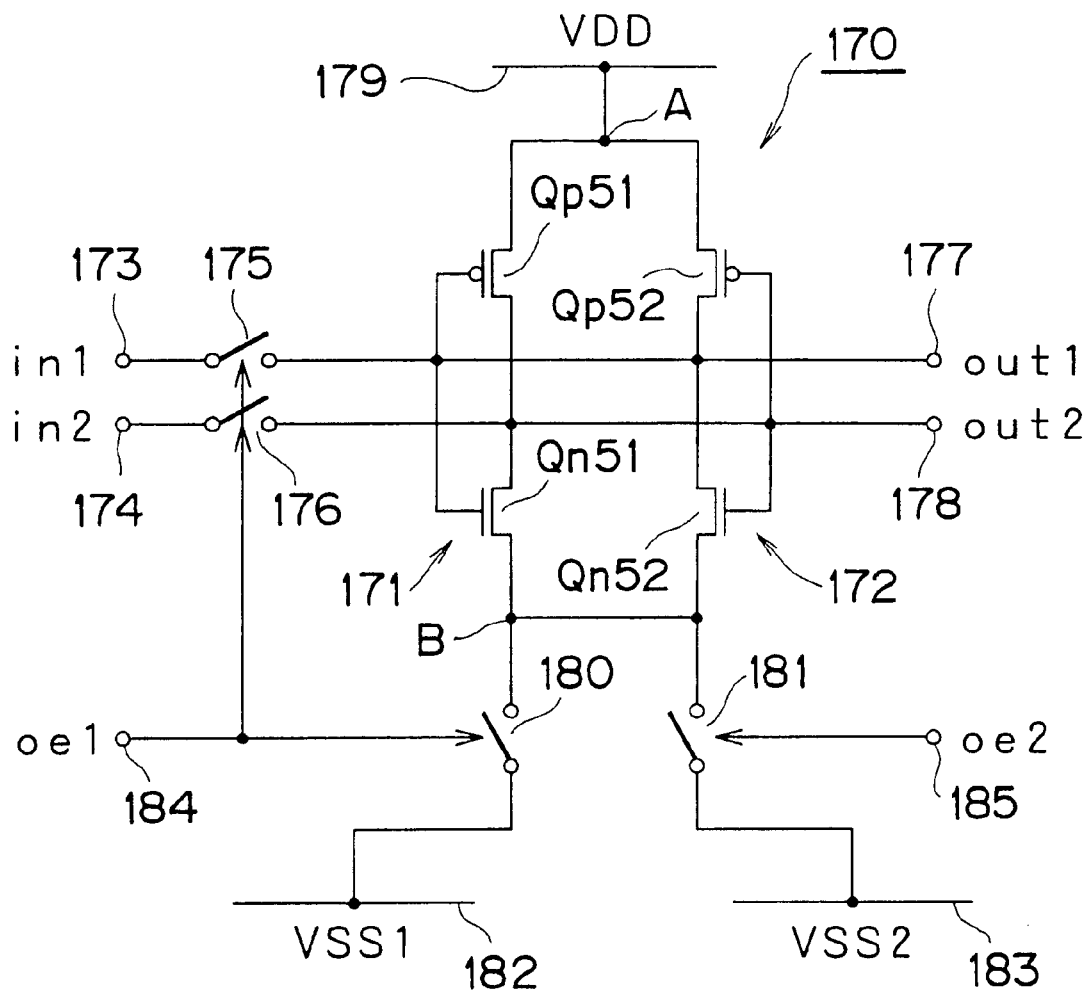
FIG. 26 is a circuit diagram showing the first embodiment of the latch circuit.

A latch circuit of the first embodiment is shown in FIG. 26. The latch circuit of this first embodiment has a CMOS latch cell 170 as the basic structure. This CMOS latch cell 170 comprises a CMOS inverter 171 comprising an N channel MOS transistor Qn51 and a P channel MOS transistor Qp51 each having commonly connected gates and drains, and a CMOS inverter 172 comprising an N channel MOS transistor Qn52 and a P channel MOS transistor Qp52 each having commonly connected gates and drains, and mutually connected in parallel.

In this CMOS latch cell 170, the input (namely, the gate common contact point of the MOS transistors Qn51, Qp51) of the CMOS inverter 171 and the output (namely, the source common contact connection point of the MOS transistors Qn52, Qp52) of the CMOS inverter 172 are connected. Further, the input of the CMOS inverter 171 (namely, the gate common contact connection point MOS transistors Qn51, Qp51) and the output of the CMOS inverter 172 (namely, the drain common contact point of the MOS transistors Qn52, Qp52) are connected. Further, the input of the CMOS inverter 172 (namely, the gate common contact point of the MOS transistors Qn52, Qp52) and the output of the CMOS inverter 171 (namely, the gate common drain connection point MOS transistors Qn51, Qp51) are connected.

A switch 175 is connected between the first circuit input terminal 173 and the input of the CMOS inverter 171, and a switch 176 is connected between the second circuit input terminal 174 and the input of the CMOS inverter 172. Further, the output terminal of the CMOS inverter 172 is connected to the first circuit output terminal 177, and the output of the CMOS inverter 171 is connected to the second circuit output terminal 178. Also, two output signals of mutually reverse polarity are output as the output signals out1, out2 byway of these circuit output terminals 177, 178.

The positive power supply side of this CMOS latch cell 170 or in other words the node A is directly connected to the power supply line 179 of the positive power supply voltage VDD. On the negative power supply side, or in other words node B, a switch 180 is used to connect the power supply line 182 of the negative power supply side voltage (for example ground level) VSS1, and a switch 181 is used to connect the power supply line 183 of a power supply voltage (negative power supply voltage) lower than the power supply voltage VSS1.

Along with switches 175, 176, the switching of the switch 180 is controlled by an output enable pulse oe1, input from a control circuit not shown in the drawing to an input terminal 184. The switching of the switch 181 on the other hand, is controlled by an output enable pulse oe2, input from the control circuit to an input terminal 185.

Figure 27:
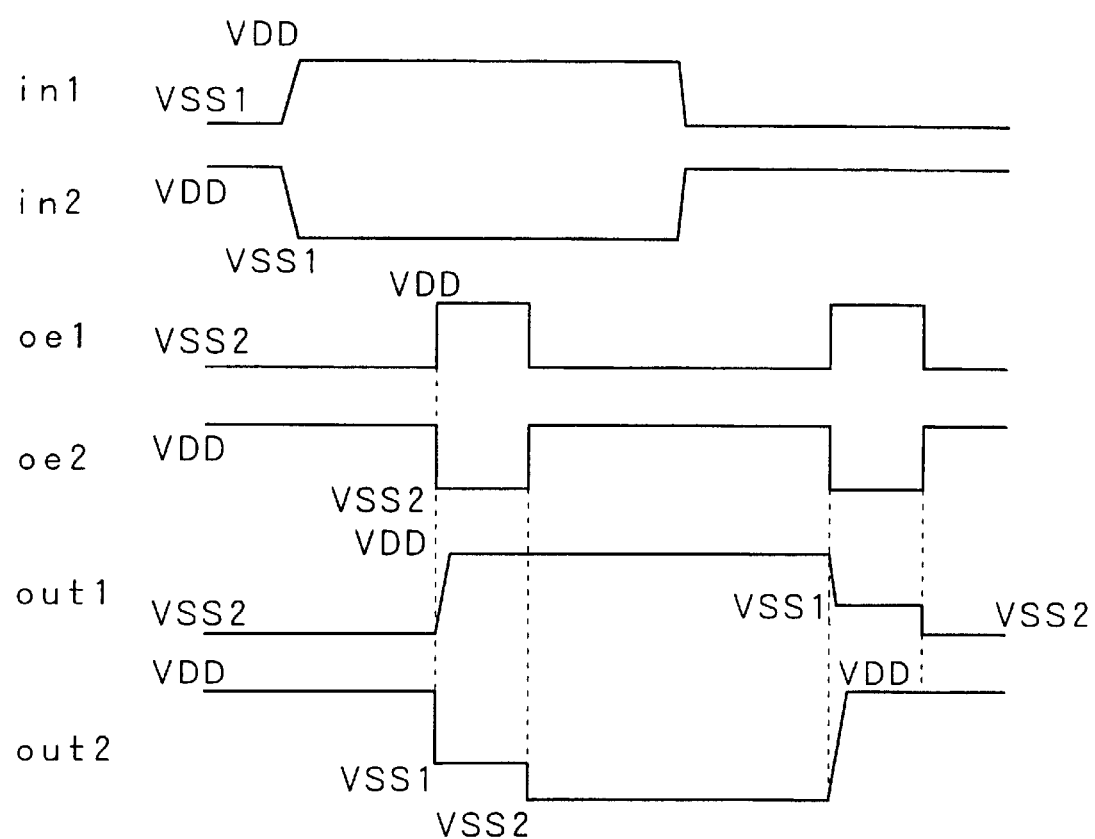
FIG. 27 is a timing chart illustrating the timing for circuit operation of the latch circuit of the first embodiment of this invention.

In the latch circuit of the first embodiment described above, an input signal in1 having an amplitude of VDD to VSS1 is input to the first control input terminal 173, an inverted signal in2 which is an inversion of the input signal in1 is input to the second circuit input terminal 174. Here, the circuit operation of the latch circuit of the first embodiment is described using the timing chart of FIG. 27.

First of all, when an output enable pulse oe1 at an active "H" level is input to the input terminal 174, the switches 175, 176 turn on (close) in response, the input signals in1, in2 are sampled and conveyed to the CMOS latch cell 170. By this operation, the input signals in1, in2 are temporarily latched in the CMOS latch cell 170 at an amplitude of VDD to VSS1.

In this latch period, the switch 180 turns on in response to the output enable pulse oe1, but the output enable pulse oe2 on the other hand, is at a reverse polarity of ("L" level) of the output enable pulse oe1 so that the negative power supply line of the CMOS latch cell 170 is connected to the power supply voltage VSS1 of the power supply line 172 since the switch 181 is in off status (open).

Next, along with the output enable pulse oe1 shifting to "L" level, the output enable pulse oe2 shifts to "H" level which causes a shift to output operation. In this period, since the switch 180 is in off status and the switch 181 is in on status, the negative power supply side of the CMOS latch cell 170 is connected to the power supply line 183 of the power supply voltage VSS2.

By this operation, the signal latched at an amplitude of VDD through VSS1 up until now in the CMOS latch cell 170, is held at an amplitude of VDD through VSS2. This signal at an amplitude of VDD through VSS2 is then output as the signals out1, out2. As a result, the in1, in2 signals held at an amplitude of VDD through VSS1 are sampled and can be level shifted to an output signals out1, out2 having an amplitude of VDD through VSS2.

In the above latch circuit of the first embodiment having the CMOS latch cell 170 as the basic structure and a level shift function, two switches 180, 181 are installed to select the VSS1 power supply on the negative power supply side and the VSS2 power supply. By controlling the switching of these switches 180, 181 according to the latch and output operation periods of the CMOS latch cell 170, the CMOS latch cell 170 operates at the VSS1 power supply in the latching period and operates at the VSS2 power supply in the output period.

The current flow in the VSS1/VSS2 power supply can thus be limited and in particular since the most of the charging current for charging the output load flows to the VSS1 power supply from the VDD power supply, the current flowing in the VSS2 power supply is extremely small. Furthermore, besides achieving latch operation and level shift operation with a small number of circuit devices, there is no need to rewrite the latch of high voltage amplitude signal with a low voltage amplitude signal so that the size of the signal buffer of the previous stage can be kept small, and a latch circuit having a level shift function and a small surface area can be achieved.

Another timing chart is shown in FIG. 28. Here, the pulse fall (last transition), of the output enable pulse 0e2 is slightly faster than the pulse rise (first transition) of the output enable pulse 0e1, and the pulse rise (first transition) of the output enable pulse 0e2 is slightly slower than the pulse fall (last transition), of the output enable pulse 0e1. By shifting the timing relation in this way, the current flow into the power supply VSS2 can be significantly reduced.

Figure 29:
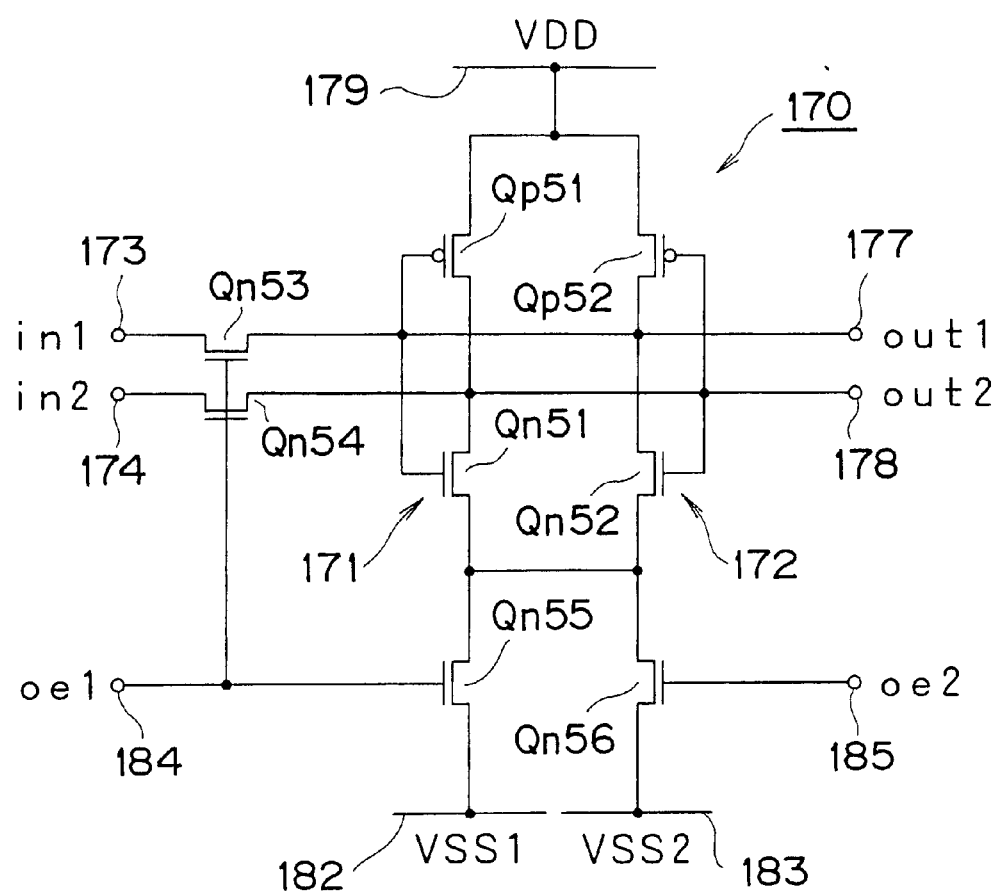
FIG. 29 is a circuit diagram showing a detailed example of the latch circuit of the first embodiment of this invention.

A circuit diagram showing a specific example of a latch circuit of the first embodiment is shown in FIG. 29. In this figure, those sections identical to FIG. 26 have the same reference numerals. In this latch circuit, the NMOS transistors Qn53, Qn54, Qn55, Qn56 are utilized as the switches 175, 176, 180, 181. An output enable pulse oe1 is applied to each respective gate of the transistors Qn53, Qn54, Qn55, and an output enable pulse oe2 is applied to the gate of the transistor Qn56.

When the switches 175, 176, 180, 181 have been achieved with transistors in this way, the circuit operation is the same as for the circuit in FIG. 26. Further, the timing is also the same as in FIG. 27 and FIG. 28. In the example used here, the switches 175, 176, 180, 181 were achieved with NMOS transistors however, if the output enable pulses oe1 and oe2 are at active "L" then the polarity of the transistors would of course be reversed.

Figure 30:
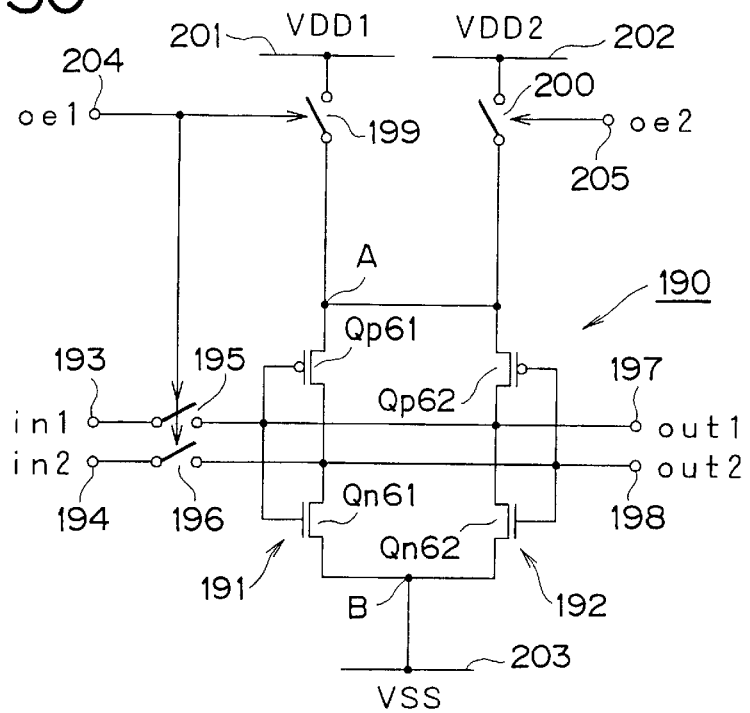
FIG. 30 is a circuit diagram showing the latch circuit of the second embodiment of this invention.

FIG. 30 is a circuit diagram showing a latch circuit of the second embodiment. This latch circuit of the second embodiment has a CMOS latch cell 190 cell as the basic structure and comprises a CMOS inverter 191 comprising an NMOS transistor Qn61 and a PMOS transistor Qp61 with gates and drains respectively connected in common, and a CMOS inverter 192 comprising an NMOS transistor Qn62 and a PMOS transistor Qp62 with gates and drains respectively connected in common and these CMOS inverters are mutually connected in parallel.

In this CMOS latch cell 190, the input (namely, the gate common contact point of the MOS transistors Qn61, Qp61) of the CMOS inverter 191 and the output (namely, the drain common contact connection point of the MOS transistors Qn62, Qp62) of the CMOS inverter 192 are connected. Further, the input of the CMOS inverter 192 (namely, the gate common contact connection point MOS transistors Qn62, Qp62) and the output of the CMOS inverter 191 (namely, the drain common contact point of the MOS transistors Qn61, Qp61) are connected.

A switch 195 is connected between the first circuit input terminal 193 and the input of the CMOS inverter 191, and a switch 196 is connected between the second circuit input terminal 194 and the input of the CMOS inverter 192. Further, the output terminal of the CMOS inverter 192 is connected to the first circuit output terminal 197, and the output of the CMOS inverter 191 is connected to the second circuit output terminal 198. Also, two output signals of mutually reverse polarity are output as the output signals out1, out2 byway of these circuit output terminals 197, 198.

The positive power supply side of this CMOS latch cell 190, or in other words the node A is directly connected to the power supply line 201 of the positive power supply voltage VDD1 by way of the switch 199, and node A is also connected by way of the switch 200 to the power supply line 202 of power supply voltage VDD2 which is higher than power supply voltage VDD1. Further, the negative power supply side, or in other words node B is directly connected to the line VSS of the negative power supply voltage (for example ground level).

Along with switches 195, 196, the switching of the switch 199 is controlled by an output enable pulse oe1, input from a control circuit not shown in the drawing to an input terminal 204. The switching of the switch 200 on the other hand, is controlled by an output enable pulse oe2, input from the control circuit to an input terminal 205.

In the latch circuit of the second embodiment described above, an input signal in1 having an amplitude of VDD1 to VSS is input to the first circuit input terminal 193, an inverted signal in2 which is an inversion of the input signal in1 is input to the second circuit input terminal 194. Further, the output enable pulses oe1, oe2 are input as pulses at the timing relationship of FIG. 27 or FIG. 28, the same as the latch circuit of the first embodiment.

The operation of the latch circuit of the second embodiment is basically the same as for the latch circuit of the first embodiment. Namely, operation is from the VDD1 power supply during the latch operation period with the output enable pulse oe1 at active level, and the input signals in1, in2 having an amplitude of VDD1 to VSS are conveyed to the CMOS latch cell 190 by way of the switches 195, 196 and temporarily latched at the same amplitude.

Next, in the output operation period with an active output enable pulse oe2, the signal having an amplitude VDD1 to VSS is level shifted to a signal of an amplitude of VDD2 to VSS, in order to switch the positive side power supply of the MOS latch cell 190 from VDD1 to the VDD2 power supply, and this level shifted signal is then output as the output signals out1, out2.

In this latch circuit of the second embodiment having the CMOS latch cell 190 as the basic structure, two switches 199, 200 are installed for selecting the power supply on the positive power side. By controlling the switching of these switches 199, 200 according to the latch and output operation periods of the CMOS latch cell 190, the VDD1 power supply operates in the latching period and the VDD2 power supply operates in the output period of the CMOS latch cell 190 so that the flow of current of the power supply for VDD1/VDD2 can be limited the same as in the first embodiment and further, besides having a structure with only a small number of circuit devices, there is no need to rewrite the latch of high voltage amplitude signal with a low voltage amplitude signal so that the size of the signal buffer of the previous stage can be kept small, and a small surface area can be achieved.

Figure 31:
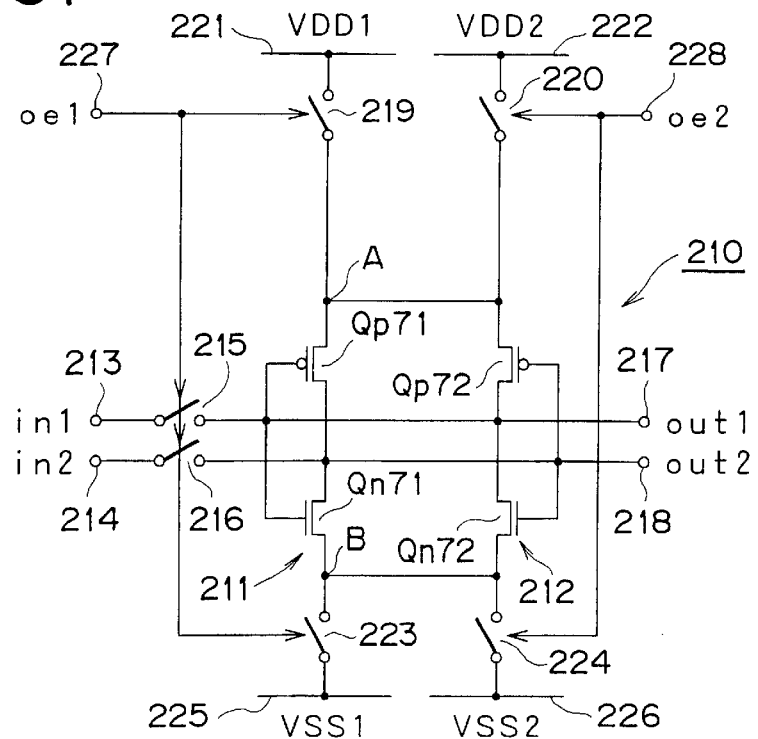
FIG. 31 is a circuit diagram showing the latch circuit of the third embodiment of this invention.

FIG. 31 is a circuit diagram showing a latch circuit of the third embodiment. This latch circuit of the third embodiment has a CMOS latch cell 210 as the basic structure and comprises a CMOS inverter 211 comprising an NMOS transistor Qn71 and a PMOS transistor Qp71 with gates and drains respectively connected in common, and a CMOS inverter 212 comprising an NMOS transistor Qn72 and a PMOS transistor Qp72 with gates and drains respectively connected in common and these CMOS inverters are mutually connected in parallel.

In this CMOS latch cell 210, the input (namely, the gate common contact point of the MOS transistors Qn72, Qp72) of the CMOS inverter 211 and the output (namely, the drain common contact connection point of the MOS transistors Qn62, Qp62) of the CMOS inverter 212 are connected. Further, the input of the CMOS inverter 212 (namely, the gate common contact connection point MOS transistors Qn72, Qp72) and the output of the CMOS inverter 211 (namely, the drain common contact point of the MOS transistors Qn71, Qp71) are connected.

A switch 216 is connected between the first circuit input terminal 213 and the input of the CMOS inverter 211, and a switch 216 is connected between the second circuit input terminal 214 and the input of the CMOS inverter 212. Further, the output terminal of the CMOS inverter 212 is connected to the first circuit output terminal 217, and the output of the CMOS inverter 211 is connected to the second circuit output terminal 218. Also, two output signals of mutually reverse polarity are output as the output signals out1, out2 by way of these circuit output terminals 217, 218.

The positive power supply side of this CMOS latch cell 210 or in other words the node A is directly connected to the power supply line 221 of the positive power supply voltage VDD1 by way of the switch 219, and this node A is also connected by way of the switch 220 to the power supply line 222 of power supply voltage VDD2 which is higher than power supply voltage VDD1. Further, the negative power supply side, or in other words node B is connected to the line 225 of VSS1 of the negative supply voltage (for example ground level) by way of the switch 223, and connected by way of the switch 224 to line 226 of the power supply voltage (negative voltage) VSS2 which is lower than voltage VSS1.

Along with switches 215, 216, the switching of the switches 215, 216 is controlled by an output enable pulse oe1, input from a control circuit not shown in the drawing to an input terminal 227. The switching of the switches 220, 224 on the other hand, is controlled by an output enable pulse oe2, input from the above control circuit to an input terminal 228.

In the latch circuit of the third embodiment described above, an input signal in1 having an amplitude of VDD1 to VSS is input to the first circuit input terminal 213, an inverted signal in2 which is an inversion of the input signal in1 is input to the second circuit input terminal 214. Further, the output enable pulses oe1, oe2 are input as pulses at the timing relationship of FIG. 27 or FIG. 28, the same as the latch circuit of the first and second embodiments.

The operation of the latch circuit of the third embodiment is basically the same as for the latch circuit of the first and second embodiments. Namely, operation is from the VDD1 and VSS1 power supplies during the latch operation period with the output enable pulse oe1 at active level, and the input signals in1, in2 having an amplitude of VDD1 to VSS1 are conveyed to the CMOS latch cell 210 by way of the switches 215, 216 and temporarily latched at the same amplitude.

Next, in the output operation period with the output enable pulse oe2 active, along with switching from the positive side power supply of the memory latch cell 210 to the VDD2 power supply, a signal having an amplitude of VDD1 to VSS1, is level shifted to a signal with an amplitude of VDD2 to VSS2 in order to switch from the negative power supply VSS1 to the VSS2 power supply and this is then output as the output signals out1, out2.

In this latch circuit of the third embodiment, two switches 219, 220 and two switches 223, 224 are respectively installed for selecting the power supply on the positive power side and the negative side. By controlling the switching of these switches 219, 220 and 223, 224 according to the latch and output operation periods of the CMOS latch cell 210, the VDD1 power supply and VSS1 power supply operate in the latching period and the VDD2, VSS2 power supplies operate in the output period, so that the flow of current into each power supply can be limited, the same as in the first and second embodiments. Further, besides having a structure with only a small number of circuit devices, there is no need to rewrite the latch of a high voltage amplitude signal with a low voltage amplitude signal so that the size of the signal buffer of the previous stage can be kept small, and a small surface area can be achieved.

The latch circuits of the second and third embodiments, just the same as in the detailed example of the first embodiment (see FIG. 29) can utilize transistors as the switches 195, 196, 199, 200 in FIG. 30, and as the switches 215, 216, 219, 220, 223, 224 in FIG. 31. However, PMOS transistors are preferably used for the switches 199, 200 in FIG. 30, and for the switches 219, 220 in FIG. 31, and in such a case, the respective inverted signals of the output enable pulses oe1, oe2 are utilized as the switching signals.

In the latch circuits of the second and third embodiments, two outputs comprising a mutually different, non-inverted and an inverted output signals out, xout were supplied, however a configuration using either or just one of these output signals may be used.

Therefore, as described above, the drive circuit-integrated liquid crystal display device can implement a latch circuit with level shift functions, with the second latch circuits 123, 133 of the first and second horizontal drive system 12, 13. In other words, a small surface area can be achieved and further, by utilizing low power consumption latch circuits, drive circuits such as a vertical drive system 14 or a first or second horizontal drive system 12, 13 containing the applicable latch circuits, can achieve not only a narrow periphery area (picture frame) for the effective pixel area 11 when fabricated onto the same substrate as the effective pixel area 11, but can also achieve a drive circuit-integrated liquid crystal display device having low power consumption.

Figure 32:
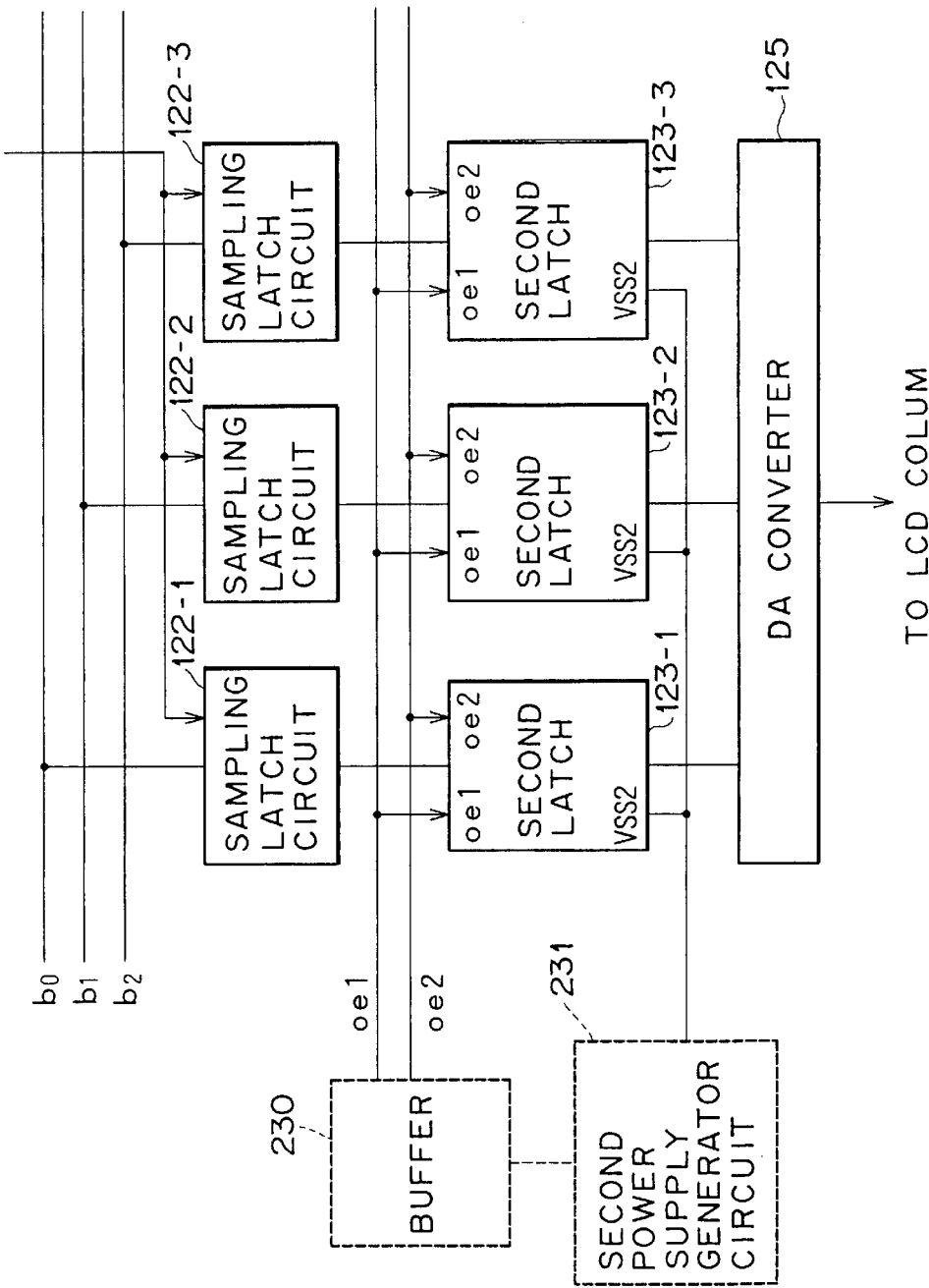
FIG. 32 is a block diagram showing a detailed structure when the second latch circuit is utilized as the latch circuit in the embodiments.

FIG. 32 is a block diagram showing the detailed structure when the second latch circuits 123, 133 are utilized as the latch circuit (see FIG. 26) of the first embodiment. This figure, for instance, shows an example of the input of three bit digital data b0, b1, b2. Here, the example in the figure showed a second latch circuit for the first horizontal drive system 12, however the structure is exactly the same for the second latch circuit 133 on the second horizontal drive circuit 13 side.

As FIG. 32 clearly shows, sampling latch circuits 122-1, 122-2, 122-3 are installed for each bit of digital data b0, b1, b2, and the latch circuits 123-1, 123-2, 123-3 are installed in a latter stage. The sampling latch circuits 122-1, 122-2, 122-3 input each bit of the digital data b0, b1, b2 and sampling of the input data is performed according to the sampling pulse output from the horizontal shift register 121 (see FIG. 1).

The latch circuits 123-1, 123-2, 123-3 on the other hand, along with being supplied sampling data from the sampling latch circuits 122-1, 122-2, 122-3, are input with the output enable pulses oe1, oe2 as latch pulses output from a buffer 230 based on external inputs, and further the VSS2 power supply from a second generator circuit 231 is supplied as the negative side second power supply.

Thus, after the latch circuits 123-1, 123-2, 123-3, latch the sampling data from the sampling latch circuits 122-1, 122-2, 122-3 of the previous stage according to the output enable pulse oe1, the data is made coincident (line sequential) and level conversion to a signal amplitude required for the next stage DA conversion then performed at the timing of the output enable pulse oe2, and after level shifting by the level shifter 124 not shown in the drawing (See FIG. 1), an output is sent by way of the DA converter 125 to a column line matching the effective pixel area 11.

By utilizing the second latch circuit 123, 133 as the latch circuits of the above embodiment for the drive circuit-integrated liquid crystal display device, the respective power supplies are utilized according to the latch operation period or output operation period of the applicable latch circuit so that current flow into the second power supply generator circuit 231 can be limited. This configuration not only allows easy incorporation (or integration) into the liquid crystal display panel of the power supply generator 231 but also allows achieving a second latch circuit 123, 133 with at small surface area and a liquid crystal display panel with a narrow picture frame.

Figure 33:
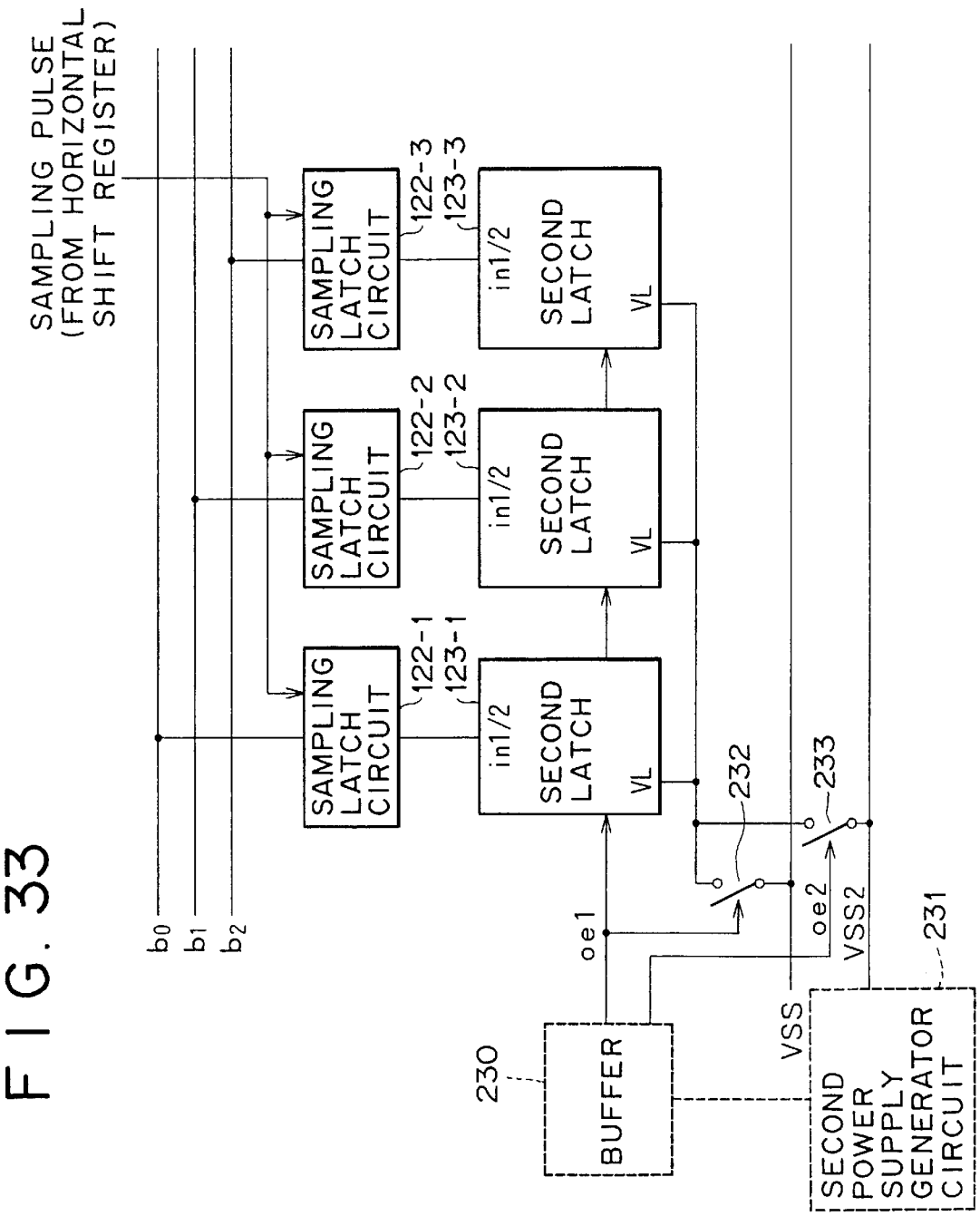
FIG. 33 is a block diagram showing an adaptation of FIG. 32.
Figure 34:
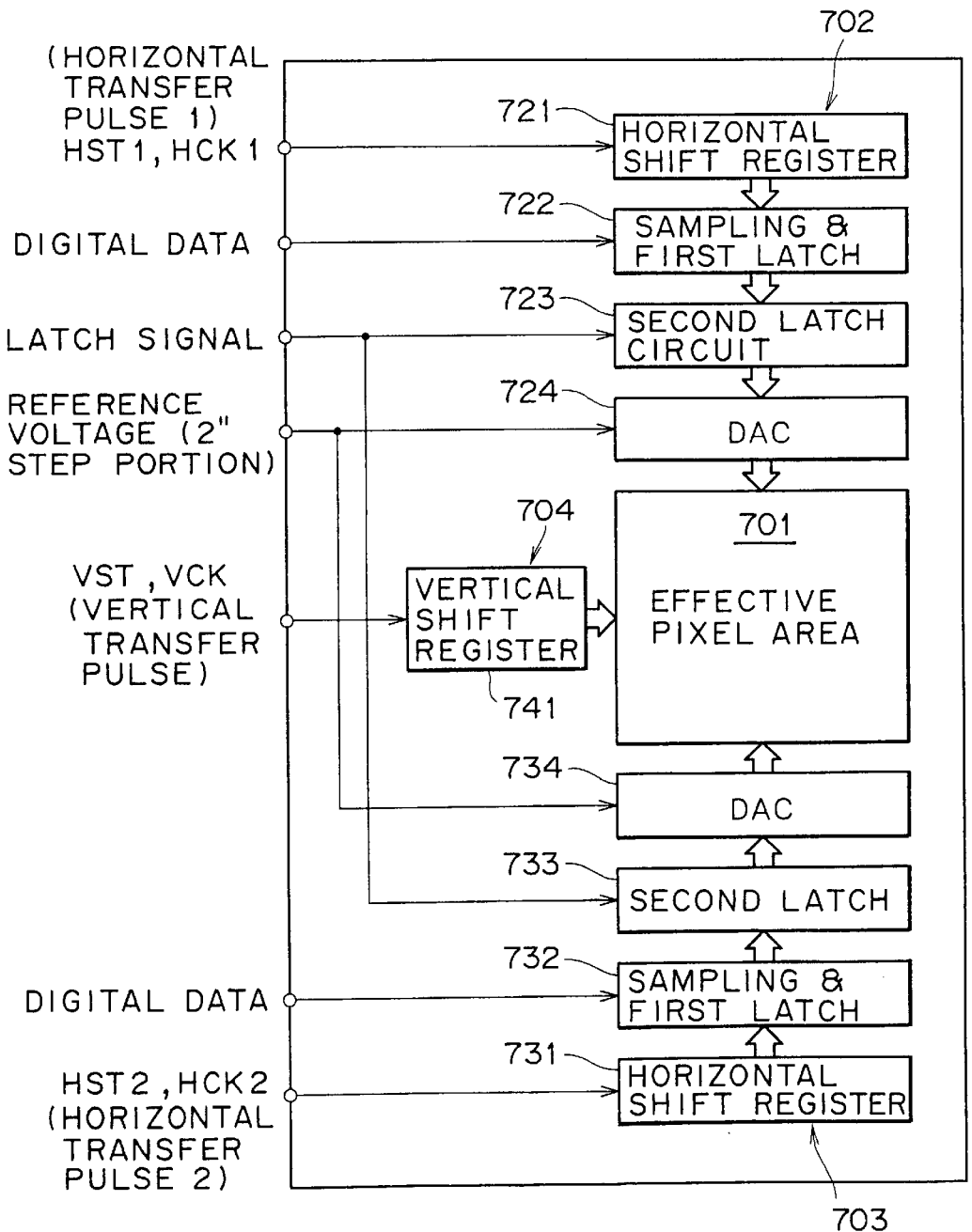
FIG. 34 is a block diagram showing the system structure of the related art.

FIG. 33 is a block diagram showing an adaptation (or variation) of FIG. 32. In this figure, those sections identical to FIG. 32 have the same reference numerals. In this adaptation, the switches 232, 233 are provided as the switches (equivalent to switches 180, 181 of FIG. 26) for the negative power supply side for the latch circuits 123-1, 123-2, 123-3. These switches 232, 233 are utilized in common with the latch circuits 123-1, 123-2, 123-3.

If the circuit of FIG. 26 was used unchanged with, for example, a three bit string of digital data, then two switches would have to be provided on the negative power supply side for each latch circuit matching the three bits, thus requiring a total of six switches. However in the above structure, only two switches are sufficient for the three latch circuits so the number of switches needed to switch the power supplies is thus reduced by four, making a smaller surface area possible, and allowing an even narrower picture frame for the liquid crystal panel.

In this example, the second latch circuits 123, 133 were utilized as the latch circuits of the first embodiment however, the second latch circuits 123, 133 can also be utilized as the latch circuits of the second and third embodiments and the same effect can be achieved. The latch circuit as related above, is also widely applicable to devices other than liquid crystal displays.

A detailed description of the horizontal registers 121, 131, the sampling & latch circuits 122, 132, the second latch circuits 123, 133, the level shifters 124, 134 as well as the DA converter circuits 125, 135 was related above. However, the circuit configuration for these embodiments need not all be utilized simultaneously in the respective circuits for the liquid crystal display device and a any of these circuits is capable of being utilized in the circuit structure of any of the above embodiments.

The circuits of this invention are also widely applicable not only to thin film transistors but also to silicon-based devices as well.

In this invention as described above, in a reference voltage select DA converter circuit and a drive circuit-integrated liquid crystal display device mounted with this DA converter, by having 2n step select units with n number of serially connected analog switches with a polarity matching the logic of each data signal n bit (n is an integer of 2 or more), and respectively connected across between each of the 2n reference voltage lines and the column lines for the pixel section, a decode circuit to decode the data signals and, switches for selecting a corresponding reference voltage based on those decoded output can be formed from identical transistors, so that the number of circuit devices in the circuit can be kept small, power consumption is not increased, and an LCD panel with a picture frame of extremely narrow width can be obtained.

Further in this invention, by inserting resistor elements respectively between two input signal sources and two input sections of a CMOS latch cell, and by applying a DC shift to the two input section of the CMOS latch cell by input signals by way of these resistor elements, a sufficient voltage can be obtained to set the transistors comprising the CMOS latch cell to an on state, so that stable, level shift operation with low power consumption within a small circuit surface area can be achieved even when the devices have a large threshold value Vth.

Still further in this invention, in a CMOS latch cell as the basic structure and configured as a comparator, along with a first switch for respectively connecting between the two input sections of this CMOS latch cell, and the two input signal sources, a second switch connects between the power supply line and the power supply side of the CMOS latch cell, and by complementary switching of the first switch and the second switch, not only can a structure with an extremely small number of devices be obtained but no current flows into the CMOS latch cell in the sampling period due to the first switch, so that so that stable, sample & latch operation with low power consumption and within a small circuit surface area can be achieved even when the devices have a large threshold value Vth.

Yet still further in this invention, by providing two switches installed on at least one of the positive power supply or negative power supply side of the CMOS latch to select the power supply, and by controlling the switching of these switches according to the latch operation and output operation periods, the current flowing to the power supplies can be limited and furthermore a structure with an extremely small number of devices be obtained so that a circuit having a small surface area is achieved.

What is claimed is:

1. A liquid crystal display device having a first board formed by an effective pixel area comprising a plurality of pixels and a drive circuit containing a digital/analog converter circuit for converting an n-bit (n is an integer of 2 or more) digital data signal, a second board placed at a specified gap facing said first board, and a liquid crystal layer held between said first and said second boards, wherein said digital/analog converter circuit comprises $2^n$ step select units connected across $2^n$ reference voltage lines and pixel section column lines, each step select unit including n serially connected analog switches polarized to match a logic state of each bit of the n-bit digital data signal, a shift register including at least a first level shift circuit to supply a start signal to an initial stage of transfer stages, said first level shift converting a low voltage amplitude signal to a high voltage amplitude signal, said first level shift circuit comprising a CMOS latch cell having two input sections, a first resister between each of the two input sections and two signal sources, wherein said shift register comprises a plurality of transfer stages, and having said first level shift circuit to supply a start signal as a level shift to a first stage of the transfer stages, and further including a second level shift circuit to supply a clock signal as a level shift to each of the transfer stages, wherein said first and second level shift circuits include a CMOS latch cell having two input sections and a first resistor element inserted between each of the two input sections and two input signal sources.

2. A liquid crystal display device as claimed in claim 1, wherein each pixel of the effective pixel area comprises a liquid crystal cell driven by a common inversion method to invert, at each one horizontal period, a common voltage jointly applied to electrodes of the liquid crystal cell.

3. A liquid crystal display device as claimed in claim 1, wherein each of said n analog switches comprises a conductive-type MOS transistor.

4. A liquid crystal display device as claimed in claim 3, wherein the n-bit digital data signal has a low amplitude equal to a reference voltage minimum less a P channel MOS transistor threshold value and a high amplitude equal to or greater than a reference voltage maximum plus an N channel MOS transistor threshold value.

5. A liquid crystal display device having a first board formed by an effective pixel area comprising a plurality of pixels and a drive circuit containing a digital/analog converter circuit for converting an n-bit (n is an integer of 2 or more) digital data signal, a second board placed at a specified gap facing said first board, and a liquid crystal layer held between said first and said second boards, wherein said digital/analog converter circuit comprises $2^n$ step select units connected across $2^n$ reference voltage lines and pixel section column lines, each step select unit including n serially connected analog switches polarized to match a logic state of each bit of the n-bit digital data signal, a shift register including a plurality of transfer stages to output sampling pulses in sequence from each transfer stage by performing a shift operation in response to a start signal;

a first latch circuit to synchronize with the sampling pulses output from each transfer stage and sequentially sample and latch the digital data signals; and a second latch circuit to latch the signal sequentially sampled in said first latch circuit with a matching column line at each one horizontal period and supply the latched signal to said digital/analog conversion circuit, wherein said shift register includes a first level shift circuit to supply the start signal to an initial stage of the transfer stages and a second level shift circuit to supply clock signals to each of the transfer stages as a level shift, the first and second level shift circuits including a CMOS latch cell having two input sections and a resistor element inserted between each of the two input sections and two signal sources and wherein said first latch circuit includes a CMOS latch cell having two input sections and a first switch connected between the two input sections and two input signal sources of the said CMOS latch cell, a second switch connected between a power supply line and a power supply side of said CMOS latch cell and, a control means to control complementary switching of said first and said second switches and, wherein said second latch circuit includes a CMOS latch cell having two input sections and a first switch and a second switch installed on at least one of a positive power supply or negative power supply side of the CMOS latch to respectively select a first and a second power supply having different power supply voltages and, a control means to control switching of said first and second switches according to each period of latch operation and output operation of the CMOS latch cell.

6. A liquid crystal display device as claimed in claim 5, wherein said drive circuit includes a level shift circuit, between said second latch circuit and said digital/analog conversion circuit, to level shift the latched signal in said second latch circuit for output to said digital/analog converter circuit and, said level shift circuit includes a CMOS latch cell including two input sections and a resistor element inserted between each of the two input sections and two input signal sources.

7. A liquid crystal display device integrated with a pixel section and drive circuit containing scanning system onto a single substrate, said liquid crystal display device having a scan system comprising:

a plurality of transfer stages;

a first level shift circuit to supply a start signal as a level shift to a first stage of the transfer stages; and a second level shift circuit to supply a clock signal as a level shift to each of the transfer stages, wherein said first and second level shift circuits include a CMOS latch cell having two input sections and a first resistor element inserted between each of the two input sections and two input signal sources.

8. A liquid crystal display device as claimed in claim 7, wherein said first resistor element is a transistor.

9. A liquid crystal display device as claimed in claim 7, wherein second resistor elements are inserted between a power supply and each of the two input sections of the CMOS latch cell.

10. A liquid crystal display device as claimed in claim 9, wherein said first and said second resistor elements are transistors.

11. A liquid crystal display device as claimed in claimed 9, wherein level shift operation is performed only when a switch is in an on status by utilizing switches having a finite resistance value as said first and said second resistor elements, and at all other times latch operation is performed.

12. A liquid crystal display device as claimed in claim 11, wherein said liquid crystal display device has a control circuit to set said switch to the on status only when necessary.

13. A liquid crystal display device as claimed in claim 11, wherein said liquid crystal display device has a reset circuit to determine initial status of said CMOS latch cell.

14. A liquid crystal display device comprising a level shift circuit including a CMOS latch cell having two input sections and a first resistor element inserted between each of the two input sections and two input signal sources, wherein level shift operation is performed only when a switch is in an on status by utilizing switches having a finite resistance value as said first resistor element and a second resistor elements, and at all other times latch operation is performed.

15. A liquid crystal display device as claimed in claim 14, wherein said first resistor element is a transistor.

16. A liquid crystal display device as claimed in claim 14, wherein second resistor elements are inserted between a power supply and each of the two input sections of the CMOS latch cell.

17. A liquid crystal display device as claimed in claim 16, wherein said first and said second resistor elements are transistors.

18. A liquid crystal display device as claimed in claim 14, wherein said liquid crystal display device has a control circuit to set said switch to the on status only when necessary.

19. A liquid crystal display device as claimed in claim 14, wherein said liquid crystal display device has a reset circuit to determine initial status of said CMOS latch cell.

20. A liquid crystal display device integrated with a pixel section and drive circuit containing scanning system onto a single substrate, wherein a scan system comprising a sampling latch circuit including a comparator configuration CMOS latch cell having two input sections and comprises, a first switch connected between each of the two input sections and two input signal sources and, a second switch connected between a power supply line and a power supply side and, a control means to control complementary switching of said first switch and said second switch.

21. A liquid crystal display device as claimed in claim 20, wherein said first switch and said second switch are transistors.

22. A liquid crystal display device as claimed in claim 20, wherein a plurality of said sampling latch circuits are installed and, said second switch is jointly shared by said plurality of sampling latch circuits.

23. A liquid crystal display device as claimed in claim 20, further comprising a third switch, synchronized and controlled by said second switch, between the power supply line and a power supply side of an output circuit for output of said CMOS latch circuit output signal.

24. A liquid crystal display device as claimed in claim 23, wherein said second switch is combined with said third switch.

25. A liquid crystal display device as claimed in claim 24, wherein a plurality of said sampling latch circuits are installed corresponding to a number of digital data bits and, said second switch is jointly shared by said plurality of sampling latch circuits.

26. A liquid crystal display device comprising:
a pixel section and drive circuit containing scanning system;
said scanning system including a latch cell, said latch cell having a plurality of inverters, said plurality of inverters including a first inverter and a second inverter,
a first input signal being supplied to an input of said first inverter while a second input signal is supplied to an input of said second inverter,
a voltage potential being supplied to said first and second inverters while said first and second input signals are isolated from said first and second inverters,
said voltage potential being isolated from said first and second inverters while said first and second input signals are supplied to said first and second inverters.

27. A liquid crystal display device as claimed in claim 26, wherein said first input signal is supplied through a first input switch to said input of said first inverter and to an output of said second inverter, and
said second input signal is supplied through a second input switch to said input of said second inverter and to an output of said first inverter.

28. A liquid crystal display device as claimed in claim 26, further comprising a positive power supply voltage line providing a positive power supply voltage,
wherein said voltage potential is said positive power supply voltage, said positive power supply voltage being supplied through a positive power supply voltage switch to said first and second inverters,
wherein said first input signal is supplied through a first input switch, and said second input signal being supplied through a second input switch,
wherein a sampling pulse controls said positive power supply voltage switch to supply said positive power supply voltage to said first and second inverters, and to isolate said first and second input signals from said first and second inverters,
said sampling pulse controlling said positive power supply voltage switch to isolate said positive power supply voltage from said first and second inverters, and to supply said first and second input signals to said first and second inverters.

29. A liquid crystal display device as claimed in claim 26, further comprising:
a first negative power supply voltage line providing a first negative power supply voltage; and
a second negative power supply voltage line providing a second negative power supply voltage,
wherein said first negative power supply voltage is supplied through a first negative power supply voltage switch to said first and second inverters,
wherein said voltage potential is said second negative power supply voltage, said second negative power supply voltage being supplied through a second negative power supply voltage switch to said first and second inverters,
wherein said first input signal is supplied through a first input switch, and said second input signal being supplied through a second input switch,
wherein a first output enable pulse controls said first negative power supply voltage switch to isolate said first negative power supply voltage from said first and second inverters while a second output enable pulse concurrently controls said second negative power supply voltage switch to supply said second negative power supply voltage to said first and second inverters,
wherein said first output enable pulse controls said first negative power supply voltage switch to supply said first negative power supply voltage to said first and second inverters while a second output enable pulse concurrently controls said second negative power supply voltage switch to isolate said second negative power supply voltage from said first and second inverters.

30. A liquid crystal display device as claimed in claim 29, wherein said first output enable pulse controls said first and second input switches to supply said first and second input signals to said first and second inverters while supplying said first negative power supply voltage to said first and second inverters.

31. A liquid crystal display device as claimed in claim 29, wherein a positive power supply voltage is supplied to said first and second inverters, said positive power supply voltage being more positive than said first and second negative power supply voltages.

32. A liquid crystal display device as claimed in claim 29, wherein said second negative power supply voltage is more negative than said first negative power supply voltage.

33. A liquid crystal display device as claimed in claim 32, wherein said first negative power supply voltage is at ground potential.

34. A liquid crystal display device as claimed in claim 29, further comprising:
a first positive power supply voltage line providing a first positive power supply voltage; and
a second positive power supply voltage line providing a second positive power supply voltage,
wherein said first positive power supply voltage is supplied through a first positive power supply voltage switch to said first and second inverters,
wherein said voltage potential is said second positive power supply voltage, said second positive power supply voltage being supplied through a second positive power supply voltage switch to said first and second inverters,
wherein said first input signal is supplied through a first input switch, and said second input signal being supplied through a second input switch,
wherein a first output enable pulse controls said first positive power supply voltage switch to isolate said first positive power supply voltage from said first and second inverters while a second output enable pulse concurrently controls said second positive power supply voltage switch to supply said second positive power supply voltage to said first and second inverters,
wherein said first output enable pulse controls said first positive power supply voltage switch to supply said first positive power supply voltage to said first and second inverters while a second output enable pulse concurrently controls said second positive power supply voltage switch to isolate said second positive power supply voltage from said first and second inverters.

35. A liquid crystal display device as claimed in claim 34, wherein said first output enable pulse controls said first and second input switches to supply said first and second input signals to said first and second inverters while supplying said first positive power supply voltage to said first and second inverters.

36. A liquid crystal display device as claimed in claim 34, wherein a negative power supply voltage is supplied to said first and second inverters, said negative power supply voltage being more negative than said first and second positive power supply voltages.

37. A liquid crystal display device as claimed in claim 36, wherein said negative power supply voltage is at ground potential.

38. A liquid crystal display device as claimed in claim 34, wherein said second positive power supply voltage is more positive than said first positive power supply voltage.

39. A liquid crystal display device as claimed in claim 35, further comprising:
a first positive power supply voltage line providing a first positive power supply voltage;
a second positive power supply voltage line providing a second positive power supply voltage;
a first negative power supply voltage line providing a first negative power supply voltage; and
a second negative power supply voltage line providing a second negative power supply voltage,
wherein said first positive power supply voltage is supplied through a first positive power supply voltage switch to said first and second inverters, and said first negative power supply voltage is supplied through a first negative power supply voltage switch to said first and second inverters,
wherein said voltage potential is said second positive power supply voltage and said second negative power supply voltage, said second positive power supply voltage being supplied through a second positive power supply voltage switch to said first and second inverters, and said second negative power supply voltage being supplied through a second negative power supply voltage switch to said first and second inverters,
wherein said first input signal is supplied through a first input switch, and said second input signal being supplied through a second input switch,
wherein a first output enable pulse controls said first positive power supply voltage switch and said first negative power supply voltage switch to isolate said first positive power supply voltage and said first negative power supply voltage from said first and second inverters while a second output enable pulse concurrently controls said second positive power supply voltage switch and said second negative power supply voltage switch to supply said second positive power supply voltage and said second negative power supply voltage to said first and second inverters,
wherein said first output enable pulse controls said first positive power supply voltage switch and said first negative power supply voltage switch to supply said first positive power supply voltage and said first negative power supply voltage to said first and second inverters while a second output enable pulse concurrently controls said second negative power supply voltage switch to isolate said second negative power supply voltage from said first and second inverters.

40. A liquid crystal display device as claimed in claim 39, wherein said first output enable pulse controls said first and second input switches to supply said first and second input signals to said first and second inverters while supplying said first positive power supply voltage and said first negative power supply voltage to said first and second inverters.

41. A liquid crystal display device as claimed in claim 39, wherein said second positive power supply voltage is more positive than said first positive power supply voltage.

42. A liquid crystal display device as claimed in claim 39, wherein said second negative power supply voltage is more negative than said first negative power supply voltage.

43. A liquid crystal display device as claimed in claim 42, wherein said first negative power supply voltage is at ground potential.

44. A liquid crystal display device as claimed in claim 39, wherein said first output enable pulse controls said first and second input switches to supply said first and second input signals to said first and second inverters while supplying said first positive power supply voltage to said first and second inverters.

45. A liquid crystal display device as claimed in claim 26, wherein a plurality of said latch circuits are installed corresponding to a number of digital data bits and, said first switch and said second switch are jointly shared by said plurality of sampling latch circuits.

46. A liquid crystal display device as claimed in claim 26, wherein said latch circuit is used in a level shift circuit.

47. A liquid crystal display device as claimed in claim 26, wherein said first input switch, said second input switch and said voltage potential switch are transistors.

48. A liquid crystal display device as claimed in claim 26, wherein said latch cell is a CMOS latch cell, said first and second inverters each having a P-type transistor and an N-type transistor.

49. A liquid crystal display device as claimed in claim 26, wherein said pixel section includes pixels arrayed in a matrix.

50. A liquid crystal display device as claimed in claim 26, wherein said scanning system is on a single substrate.

* * * * *